(12) United States Patent
Ota et al.

(10) Patent No.: US 10,777,130 B2
(45) Date of Patent: Sep. 15, 2020

(54) ORGANIC ELECTROLUMINESCENT DEVICE AND ELECTRONIC APPARATUS

(71) Applicant: SEIKO EPSON CORPORATION, Tokyo (JP)

(72) Inventors: Hitoshi Ota, Shiojiri (JP); Ryoichi Nozawa, Shiojiri (JP)

(73) Assignee: SEIKO EPSON CORPORATION, Tokyo (JP)

(*) Notice: Subject to any disclaimer, the term of this patent is extended or adjusted under 35 U.S.C. 154(b) by 570 days.

(21) Appl. No.: 14/831,491

(22) Filed: Aug. 20, 2015

(65) Prior Publication Data
US 2016/0063916 A1 Mar. 3, 2016

(30) Foreign Application Priority Data
Sep. 3, 2014 (JP) ................... 2014-179304

(51) Int. Cl.
*G09G 3/3233* (2016.01)
*H01L 27/32* (2006.01)

(52) U.S. Cl.
CPC ....... *G09G 3/3233* (2013.01); *H01L 27/3258* (2013.01); *H01L 27/3265* (2013.01); *G09G 2300/0842* (2013.01); *G09G 2310/0262* (2013.01)

(58) Field of Classification Search
CPC ............ H01L 27/3258; H01L 27/3265; G09G 3/3233; G09G 2300/0842; G09G 2310/0262
See application file for complete search history.

(56) References Cited

U.S. PATENT DOCUMENTS

| | | |
|---|---|---|
| 2003/0201448 A1 | 10/2003 | Yamazaki et al. |
| 2004/0036071 A1 | 2/2004 | Yamazaki et al. |
| 2008/0017860 A1 | 1/2008 | Kubota et al. |
| 2009/0273578 A1 | 11/2009 | Kanda et al. |
| 2010/0007681 A1 | 1/2010 | Kubota |
| 2011/0025585 A1* | 2/2011 | Kim ................. G09G 3/3233 |
| | | 345/76 |
| 2013/0093737 A1 | 4/2013 | Ota et al. |
| 2013/0306996 A1 | 11/2013 | Kitazawa et al. |
| 2014/0132175 A1 | 5/2014 | Hokazono et al. |
| 2014/0217432 A1 | 8/2014 | Ota et al. |

(Continued)

FOREIGN PATENT DOCUMENTS

| | | |
|---|---|---|
| JP | 2546445 B2 | 10/1996 |
| JP | 2000-315734 A | 11/2000 |
| JP | 2001-195016 A | 7/2001 |

(Continued)

*Primary Examiner* — Premal R Patel
(74) *Attorney, Agent, or Firm* — Oliff PLC

(57) ABSTRACT

An organic electroluminescent device includes a first transistor, an organic electroluminescent element that emits light with luminance corresponding to magnitude of a current supplied via the first transistor, and a capacitive element. The capacitive element includes a first electrode connected to a gate of the first transistor, a second electrode, and a dielectric film provided between the first electrode and the second electrode. The first electrode is formed on the same layer as the second electrode, and is arranged in a position away from the second electrode with the dielectric film interposed therebetween.

21 Claims, 39 Drawing Sheets

(56) References Cited

U.S. PATENT DOCUMENTS

2017/0221980 A1  8/2017  Ota et al.

FOREIGN PATENT DOCUMENTS

| | | |
|---|---|---|
| JP | 2007-226184 A | 9/2007 |
| JP | 2009-295137 A | 12/2009 |
| JP | 2010-019951 A | 1/2010 |
| JP | 2013-088611 A | 5/2013 |
| JP | 2013-113868 A | 6/2013 |
| JP | 2013-238724 A | 11/2013 |
| JP | 2014098779 A | 5/2014 |
| JP | 2014-153492 A | 8/2014 |

* cited by examiner

ORGANIC ELECTROLUMINESCENT DEVICE AND ELECTRONIC APPARATUS

BACKGROUND

1. Technical Field

The present invention relates to an organic electroluminescent (hereinafter, also referred to as an organic EL) device using a luminescent material of an organic electroluminescent material.

2. Related Art

For example, a light emitting device in which light emitting elements using an organic EL material are arranged in a plane shape on a substrate has been conventionally proposed as a display device for various electronic apparatuses. JP-A-2007-226184 discloses a technology for forming a capacitive electrode constituting a capacitive element on a layer on which a scanning line, a gate electrode or the like is formed.

However, when a capacitive electrode is formed on a layer on which a scanning line, a gate electrode, or the like is formed as in JP-A-2007-226184, it is necessary to form the capacitive electrode while avoiding a control line such as the scanning line, or the gate electrode, and it is difficult to secure capacitance of the capacitive element.

SUMMARY

An advantage of some aspects of the invention is provided to an organic electroluminescent device and an electronic apparatus capable of securing capacitance of a capacitive element even in high-density pixels.

According to a first aspect of the invention, an organic electroluminescent device includes: a first transistor; an organic electroluminescent element that emits light with a luminance corresponding to the magnitude of a current supplied via the first transistor; and a capacitive element including a first electrode connected to a gate of the first transistor, a second electrode, and a dielectric film provided between the first electrode and the second electrode, in which the first electrode is formed on the same layer as the second electrode, and is arranged in a position away from the second electrode with the dielectric film interposed therebetween. In the above configuration, the first electrode and the second electrode are formed on the same layer and arranged in positions away from each other with the dielectric interposed therebetween in a planar direction, and thus, the capacitive element is formed in the planar direction. Therefore, since the capacitive element can be formed without achieving a multilayer to secure capacitance, an organic electroluminescent device having no luminance variation is provided.

In the aspect of the invention, it is preferable that the organic electroluminescent device further includes a power supply line layer connected to one current terminal of the first transistor, in which the first electrode is connected to the gate of the first transistor, the second electrode is connected to the power supply line layer connected to the first transistor, and the first electrode is arranged to be surrounded by the second electrode in a plan view. In this configuration, since the first electrode is connected to the gate of the first transistor, and the second electrode is connected to the power supply line layer connected to the first transistor, the capacitive element including the first electrode and the second electrode functions as a holding capacitor that holds potentials of one current terminal and the gate of the first transistor. Further, since the first electrode of this capacitive element is arranged to be surrounded by the second electrode, a capacitor is secured not only in one direction on the plane, but also in all directions. Further, since the first electrode that is a gate potential portion of the first transistor is surrounded by the second electrode connected to the power supply line layer, stabilization of the gate potential of the first transistor is achieved, and coupling between the gate potential portion of the first transistor and the other member is suppressed.

In the aspect of the invention, it is preferable that the capacitive element includes a third electrode, and the third electrode is connected to the power supply line layer, and is arranged to be surrounded by the first electrode in a plan view. In this configuration, since the capacitive element is formed of the first electrode and the third electrode, it is possible to further secure capacitance without achieving a multilayer.

In the aspect of the invention, it is preferable that the power supply line layer is provided on a layer over the second electrode and the third electrode, the second electrode is connected to the power supply line layer via a first conduction portion, and the third electrode is connected to the power supply line layer via a second conduction portion. In this configuration, it is possible to achieve conduction between the power supply line layer, and the second electrode and the third electrode with less resistance as compared to a case in which the power supply line layer directly extends to a lower layer to achieve conduction between the second electrode and the third electrode.

In the aspect of the invention, it is preferable that the organic electroluminescent device further includes an electrode connected to the gate of the first transistor, in which the electrode is arranged on a layer under the third electrode, and is arranged in a position overlapping at least a portion of the third electrode in a plan view. In this configuration, since the capacitive element is formed between the third electrode and the electrode connected to the gate of the first transistor, it is possible to ensure capacitance by effectively utilizing the layer over the gate.

In the aspect of the invention, it is preferable that the organic electroluminescent device further includes an electrode connected to the gate of the first transistor, in which the electrode is arranged on a layer under the second electrode, and is arranged in a position overlapping at least a portion of the second electrode in a plan view. In this configuration, since the capacitive element is formed between the second electrode and the electrode connected to the gate of the first transistor, it is possible to secure the capacitive element by effectively utilizing the layer over the gate.

In the aspect of the invention, it is preferable that an active layer is formed on a layer under the electrode connected to the gate of the first transistor, and impurities are implanted into the active layer. With this configuration, since the capacitive element based on a MOS capacitor is formed between the electrode connected to the gate of the first transistor and the active layer, a high density of pixels can be achieved and the capacitance can be secured.

In the aspect of the invention, it is preferable that the power supply line layer is formed on a layer over the first electrode, and is arranged in a position overlapping the first electrode in a plan view. In this configuration, since the first electrode is shielded by the power supply line layer, coupling between, for example, the signal line formed in a layer over the power supply line layer and the first electrode is suppressed.

In the aspect of the invention, it is preferable that the capacitive element and the first transistor are arranged to overlap each other in a plan view. Accordingly, capacitance of the capacitive element is secured in a first direction, and it is possible to achieve a high density of pixels.

According to a second aspect of the invention, an organic electroluminescent device includes a scanning line; a signal line; and a pixel circuit connected to the scanning line and the signal line, in which the pixel circuit includes a first transistor having one current terminal connected to a power supply line layer; an organic electroluminescent element that has a pixel electrode, and that emits light with a luminance corresponding to the magnitude of a current supplied via the first transistor; and a capacitive element including a first electrode connected to a gate of the first transistor, a second electrode, and a dielectric film provided between the first electrode and the second electrode, and the first electrode is formed on the same layer as the second electrode, and is arranged in a position away from the second electrode with the dielectric film interposed therebetween. Therefore, since the capacitive element can be formed without achieving a multilayer to secure capacitance, an organic electroluminescent device having no luminance variation is provided.

In the aspect of the invention, it is preferable that the power supply line layer is arranged between the first electrode and the signal line. Therefore, coupling between the signal line and the capacitive electrode is suppressed due to a shielding effect of the power supply line layer.

In the aspect of the invention, it is preferable that the power supply line layer is arranged between the first electrode, and the scanning line and the signal line. Therefore, coupling between the scanning line and the signal line, and the capacitive electrode is suppressed due to a shielding effect of the power supply line layer.

In the aspect of the invention, it is preferable that the power supply line layer is arranged between the first electrode and the pixel electrode. Therefore, coupling between the pixel electrode and the capacitive electrode is suppressed due to a shielding effect of the power supply line layer.

In the aspect of the invention, it is preferable that the organic electroluminescent device further includes a plurality of conduction holes penetrating respective layers from a layer in which the current terminal of the first transistor is formed to a layer in which the pixel electrode has been formed; and a plurality of relay electrodes respectively connected to the plurality of conduction holes, in which the other current terminal of the first transistor and the pixel electrode are connected by the plurality of conduction holes and the plurality of relay electrodes. Therefore, it is possible to achieve conduction between the first transistor and the pixel electrode with less resistance as compared to a case in which the pixel electrode extends to the layer in which the other current terminal of the first transistor has been formed to achieve the conduction.

In the aspect of the invention, it is preferable that the capacitive element and the first transistor are arranged to overlap each other in a plan view in the first direction. Accordingly, the capacitance of the capacitive element is secured in the first direction, and it is possible to achieve a high density of pixels.

In the aspect of the invention, it is preferable that the organic electroluminescent device further includes a second transistor having one current terminal connected to a gate of the first transistor, and the other current terminal connected to the signal line, in which the signal line and the second transistor are arranged to overlap each other in a plan view in the first direction. Accordingly, a high density of pixels can be achieved, and a conduction distance between the signal line and the second transistor can be reduced to achieve the conduction with less resistance. As a result, a capability of writing to the second transistor using the signal line is improved.

In the aspect of the invention, it is preferable that the organic electroluminescent device further includes a second transistor having one current terminal connected to the gate of the first transistor, and the other current terminal connected to the signal line; and a third transistor having one current terminal connected to the other current terminal of the first transistor, and the other current terminal connected to the other current terminal of the second transistor, in which the signal line and the third transistor are arranged to overlap each other in a plan view in the first direction. Accordingly, a high density of pixels can be achieved, and a conduction distance between the signal line and the third transistor can be reduced to achieve the conduction with less resistance. As a result, a capability to writing of the third transistor using the signal line is improved.

In the aspect of the invention, it is preferable that the organic electroluminescent device further includes a fourth transistor having one current terminal connected to the other current terminal of the first transistor and the other current terminal connected to the pixel electrode, in which the signal line and the fourth transistor are arranged to overlap each other in a plan view in the first direction. Therefore, it is possible to achieve a high density of pixels.

The organic electroluminescent device according to each aspect described above is used, for example, as a display device for various electronic apparatuses. Specifically, a head mounted display device, an electronic viewfinder of an imaging device, or the like can be illustrated as a preferred example of the electronic apparatus of the invention, but the scope of the invention is not limited to the above example.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
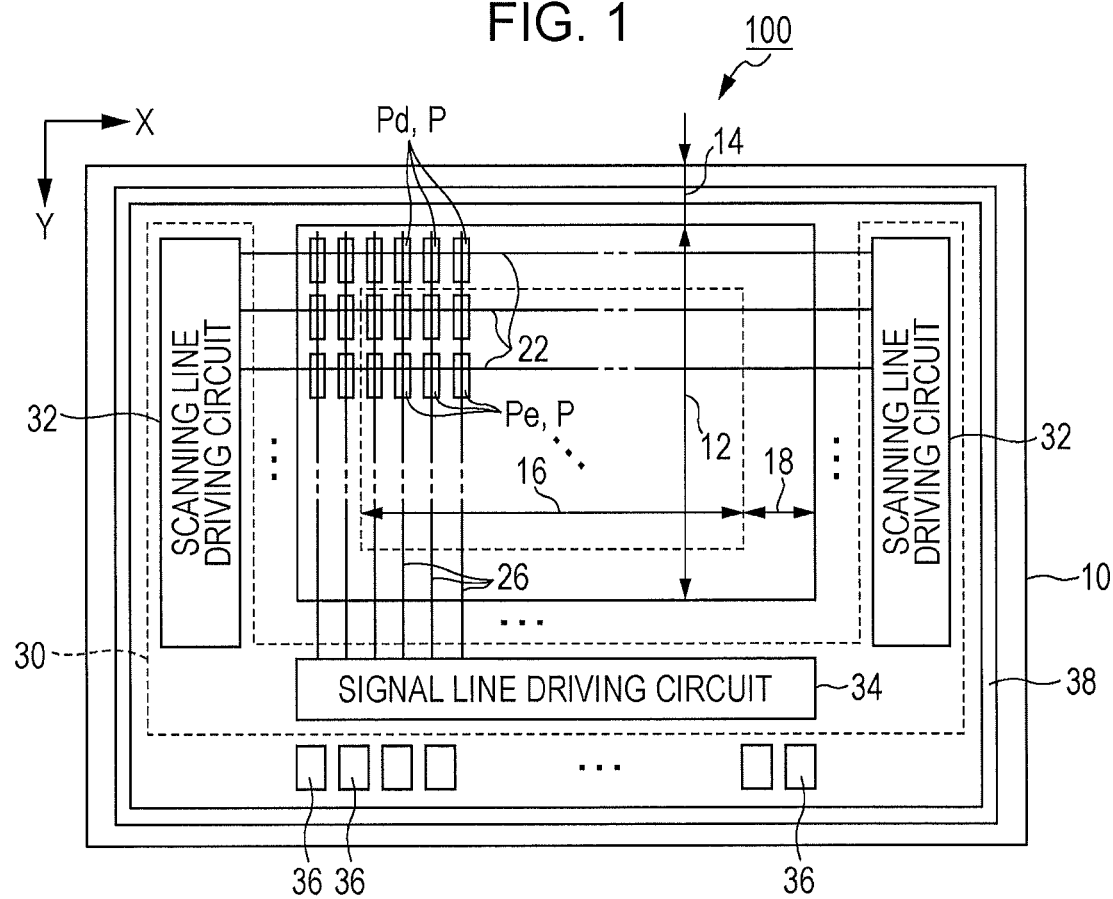
FIG. 1 is a plan view of a light emitting device of a first embodiment of the invention.

FIG. 1 is a plan view of an organic electroluminescent device 100 according to a first embodiment of the invention. The organic electroluminescent device 100 of the first embodiment is an organic EL device in which a light emitting device using an organic EL material has been formed on a surface of a substrate 10. The substrate 10 is a plate-shaped member (semiconductor substrate) formed of a semiconductor material such as silicon, and is used as a substrate (base) on which a plurality of light emitting elements are formed. As illustrated in FIG. 1, the surface of the substrate 10 is divided into a first area 12 and a second area 14. The first area 12 is a rectangular area, and the second area 14 is a rectangular frame-shaped area that surrounds the first area 12.

In the first area 12, a plurality of scanning lines 22 extending in an X direction, and a plurality of the signal lines 26 extending in a Y direction crossing the X direction are formed. A pixel P (Pd or Pe) is formed corresponding to each of intersections of the plurality of scanning lines 22 and the plurality of the signal lines 26. Therefore, a plurality of pixels P are arranged in a matrix shape in the X and Y directions.

A driving circuit 30, a plurality of mounting terminals 36, and a guard ring 38 are disposed in the second area 14. The driving circuit 30 is a circuit that drives each pixel P, and includes two scanning line driving circuits 32 disposed in respective positions with the first area 12 interposed therebetween in the X direction, and a signal line driving circuit 34 disposed in an area extending in the X direction in the second area 14. The plurality of mounting terminals 36 are formed in an area on the side opposite to the first area 12 with the signal line driving circuit 34 interposed therebetween, and is electrically connected to an external circuit (for example, an electronic circuit mounted on a wiring board) such as a control circuit or a power supply circuit via a flexible wiring board (not illustrated) that is bonded to the substrate 10.

For the organic electroluminescent device 100 of the first embodiment, a plurality of organic electroluminescent devices are collectively formed through cutting (scribing) of an original substrate having a size corresponding to a plurality of substrates 10. The guard ring 38 in FIG. 1 prevents the driving circuit 30 or the pixel P from being affected by impact or static electricity at the time of cutting of the original substrate or moisture from intruding from an end surface of each substrate 10 (a cut surface of the original substrate). As illustrated in FIG. 1, the guard ring 38 is formed in an annular shape (rectangular frame) that surrounds the driving circuit 30, the plurality of mounting terminals 36, and the first area 12.

The first area 12 in FIG. 1 is divided into a display area 16 and a peripheral area 18. The display area 16 is an area in which an image is actually displayed by the driving of each pixel P. The peripheral area 18 is a rectangular frame-shaped area that surrounds the display area 16. In the peripheral area 18, a pixel P (hereinafter referred to as a "dummy pixel Pd") that has a structure similar to each pixel P in the display area 16, but does not actually contribute to displaying of the image is arranged. From the viewpoint of clarifying of distinction in representation from the dummy pixel Pd in the peripheral area 18, in the following description, the pixel P in the display area 16 may be conveniently indicated by a "display pixel Pe." The display pixel Pe is an element that is a minimum unit of emission.

Figure 2:
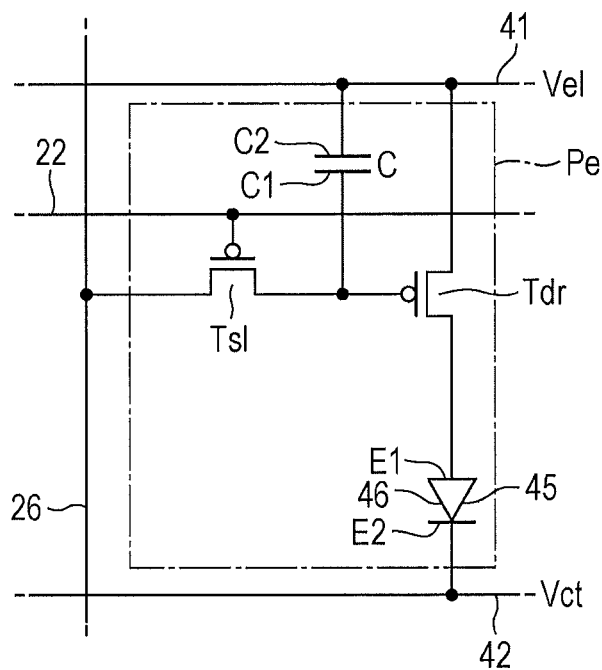
FIG. 2 is a circuit diagram of a pixel.

FIG. 2 is a circuit diagram of each display pixel Pe located in the display area 16. As illustrated in FIG. 2, the display pixel Pe includes a light emitting element 45, a driving transistor Tdr, a selection transistor Tsl, and a capacitive element C. In the first embodiment, while each transistor T (Tdr or Tsl) of the display pixel Pe is a P-channel type, an N-channel type transistor can be used.

The light emitting element 45 is an electro-optical element in which a light emitting function layer 46 including a light emitting layer of an organic EL material is interposed between a first electrode (positive electrode) E1 and a second electrode (negative electrode) E2. The first electrode E1 is formed separately in each display pixel Pe, and the second electrode E2 is continuous over a plurality of pixels P. As is understood from FIG. 2, the light emitting element 45 is arranged on a path connecting a first power supply conductor 41 to a second power supply conductor 42. The first power supply conductor 41 is a power supply wiring to which a power supply potential Vel on a high potential side is supplied, and the second power supply conductor 42 is a power supply wiring to which a power supply potential (for example, ground potential) Vct on a low potential side is supplied.

The driving transistor Tdr is arranged in series with the light emitting element 45 on the path connecting the first power supply conductor 41 to the second power supply conductor 42. Specifically, one (source or drain) of a pair of current terminals of the driving transistor Tdr is connected to the first power supply conductor 41. The driving transistor Tdr generates a driving current corresponding to an amount of current according to a voltage between the drain and the source of the driving transistor Tdr or between a gate and the drain of driving transistor Tdr.

The selection transistor Tsl in FIG. 2 functions as a switch that controls a conduction state (conduction/non-conduction) between a signal line 26 and a gate of the driving transistor Tdr. A gate of the selection transistor Tsl is connected to a scanning line 22. Further, the capacitive element C is a capacitor in which a dielectric material is interposed between a first electrode C1 and a second electrode C2. The first electrode C1 is connected to the gate of the driving transistor Tdr, and the second electrode C2 is connected to the first power supply conductor 41 (the source of the driving transistor Tdr). Therefore, the capacitive element C holds a voltage between the gate and the source of the driving transistor Tdr or between the gate and the drain of the driving transistor Tdr.

The signal line driving circuit 34 supplies a gradation potential (data signal) corresponding to a gradation designated for each display pixel Pe by an image signal supplied from an external circuit to the plurality of the signal lines 26 in parallel in each writing period (horizontal scanning period). On the other hand, each scanning line driving circuit 32 sequentially selects the plurality of scanning lines 22 in each writing period by supplying a scanning signal to each scanning line 22. The selection transistor Tsl of each display pixel Pe corresponding to the scanning line 22 selected by the scanning line driving circuit 32 transitions to an ON state. Therefore, the gradation voltage is supplied to the gate of the driving transistor Tdr of each display pixel Pe via the signal line 26 and the selection transistor Tsl, and a voltage corresponding to the gradation voltage is held in the capacitive element C. Therefore, a driving current corresponding to the gradation voltage is supplied from the driving transistor Tdr to the light emitting element 45. Each light emitting element 45 emits light with a luminance corresponding to the gradation voltage as described above, and thus, any image designated by the image signal is displayed in the display area 16. Further, even after the writing period has ended, the driving current corresponding to the voltage held in the capacitive element C is supplied from the driving transistor Tdr to the light emitting element 45, and thus, each light emitting element 45 maintains emission with a luminance according to the gradation potential.

Figure 3:
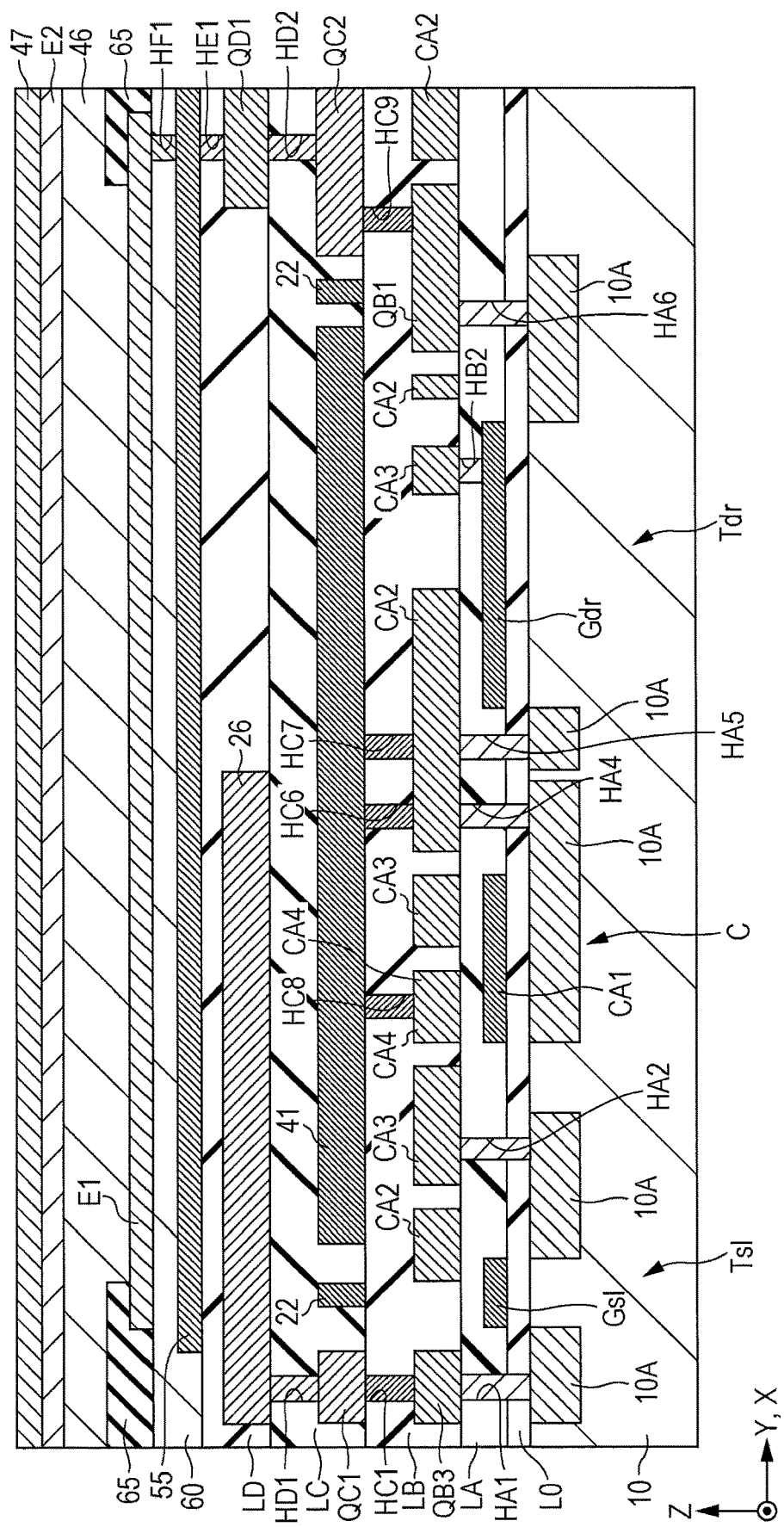
FIG. 3 is a sectional view of a light emitting device.
Figure 12:
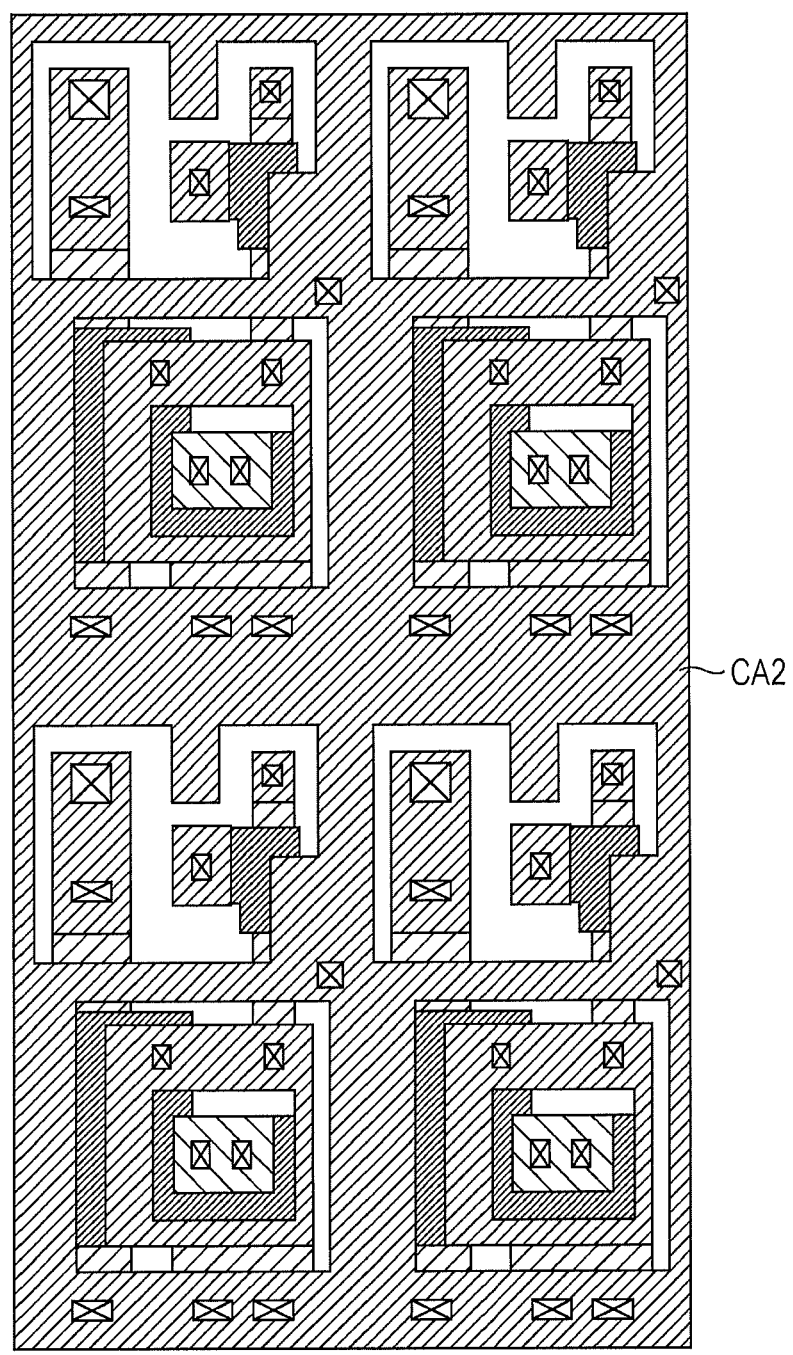
FIG. 12 is an illustrative diagram of each element that is formed on the substrate.
Figure 13:
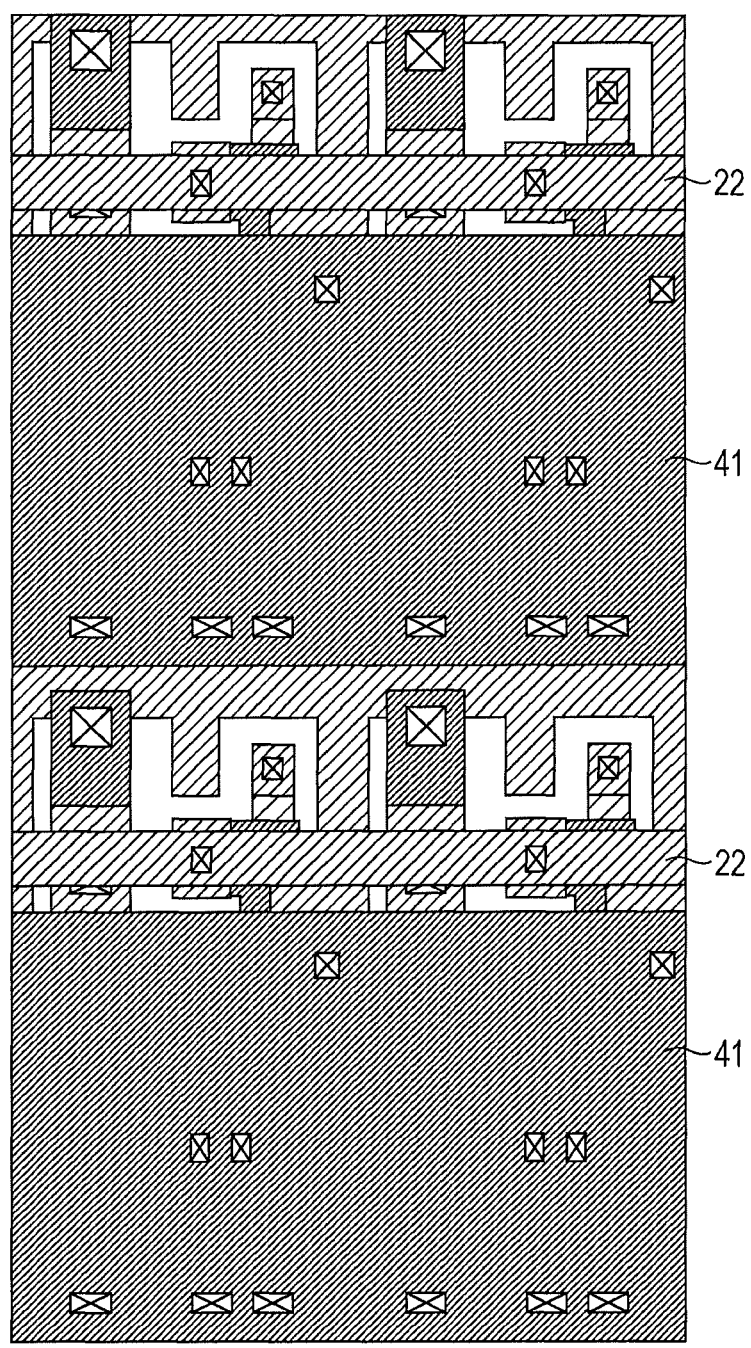
FIG. 13 is an illustrative diagram of each element that is formed on the substrate.
Figure 14:
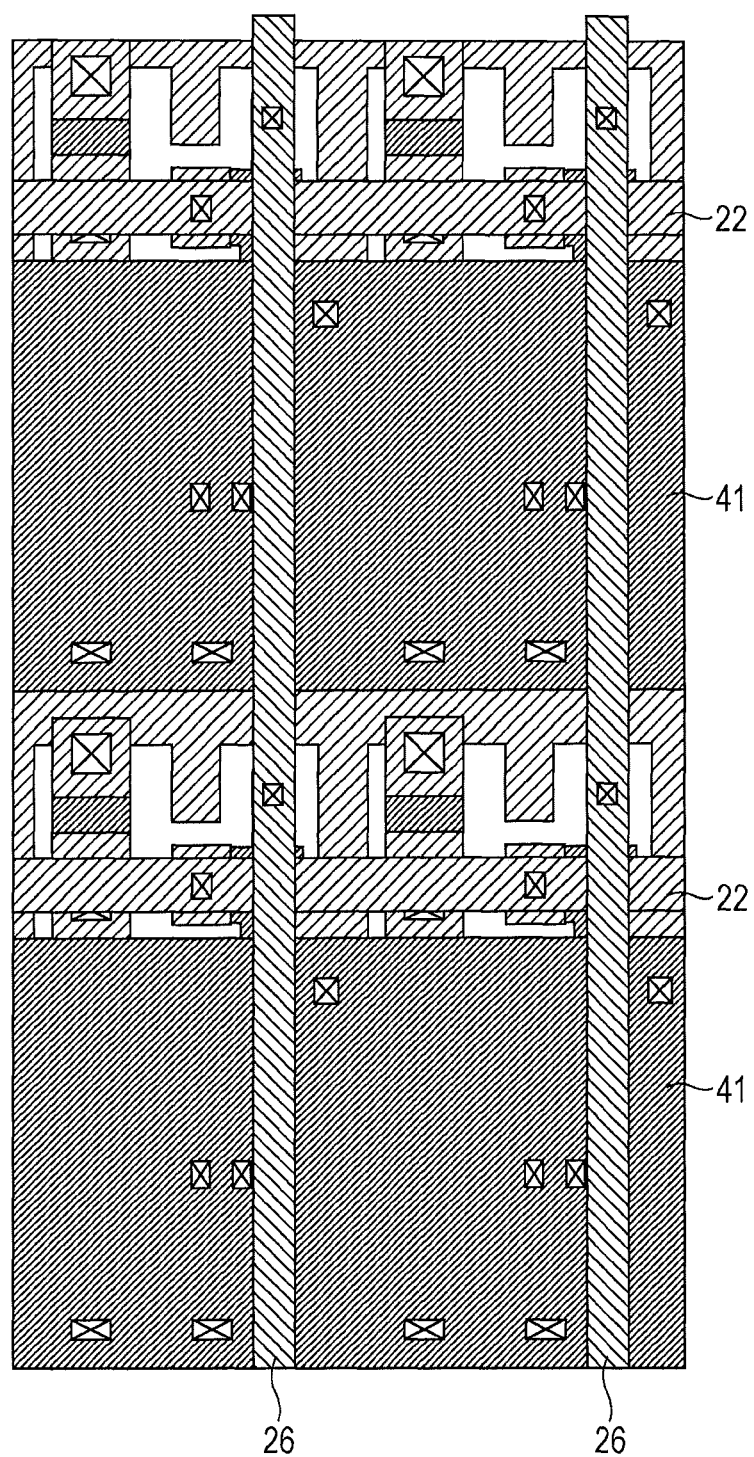
FIG. 14 is an illustrative diagram of each element that is formed on the substrate.

Hereinafter, a specific structure of the organic electroluminescent device 100 of the first embodiment will be described in detail. Further, in each drawing referred to in the following description, a dimension or a scale of each element is different from that in an actual organic electroluminescent device 100 for convenience of description. FIG. 3 is a sectional view of the organic electroluminescent device 100, and FIGS. 4 to 11 are plan views illustrating a state of the surface of the substrate 10 in respective steps of forming respective elements of the organic electroluminescent device 100 for one display pixel Pe. FIGS. 12 to 14 are plan views illustrating a state of the surface of the substrate 10 for four display pixels Pe. A sectional view corresponding to a section including line in FIGS. 4 to 11 corresponds to FIG. 3. Further, while FIGS. 4 to 14 are plan views, each element that is the same as that in FIG. 3 is conveniently hatched in the same aspect as that in FIG. 3 from the viewpoint of facilitation of visual recognition of each element.

Figure 4:
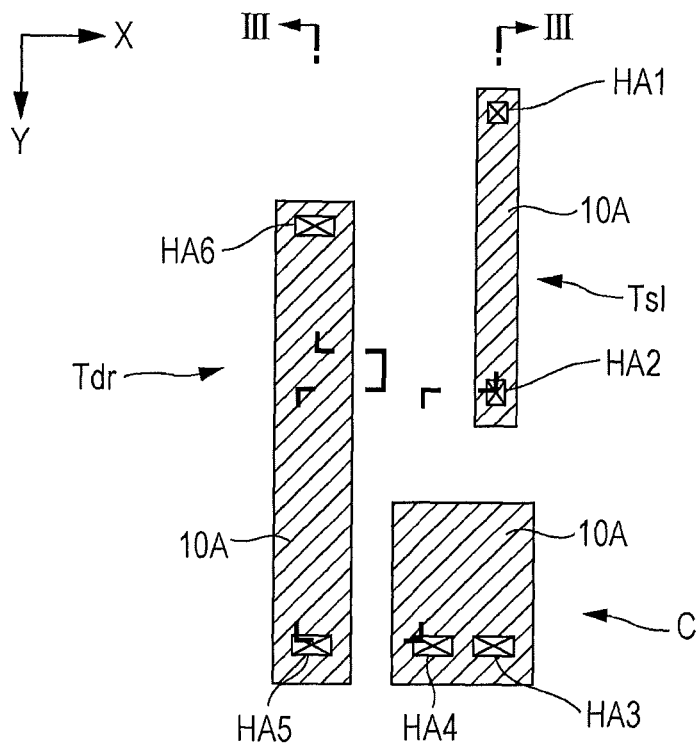
FIG. 4 is an illustrative diagram of each element formed on a substrate.
Figure 5:
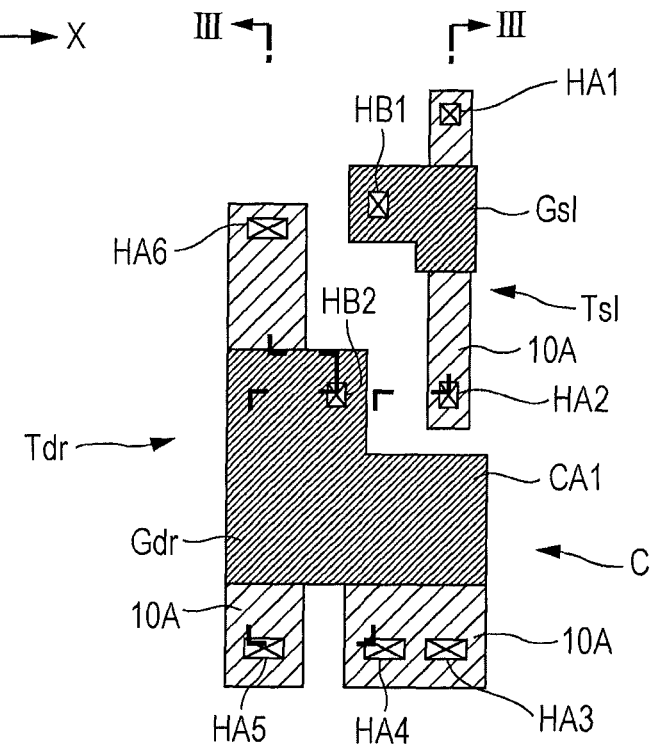
FIG. 5 is an illustrative diagram of each element that is formed on the substrate.

As is understood from FIGS. 3 and 4, an active area 10A (a source/drain area) of each transistor T (Tdr or Tsl) of the display pixel Pe is formed in a surface of the substrate 10 formed of a semiconductor material such as silicon. Ions are implanted into the active area 10A. An active layer of each transistor T (Tdr or Tsl) of the display pixel Pe exists between the source area and the drain area and is implanted with different types of ions, but is integrally described as the active area 10A, for convenience. Further, in this embodiment, the active area 10A is also formed in an area constituting the capacitive element C, implanted with impurities, and connected to a power supply. Also, a so-called MOS capacitor in which the active area 10A is one electrode and a capacitive electrode formed through an insulating layer is the other electrode is constituted. Further, the active area 10A in the area constituting the capacitive element C also functions as a power supply potential portion. Details of the MOS capacitor and the power supply potential portion will be described. As is understood from FIGS. 3 and 5, the surface of the substrate 10 in which the active area 10A has been formed is covered with an insulating film L0 (gate insulating film), and a gate layer G (Gdr or Gsl) of each transistor T is formed on the surface of the insulating film L0. The gate layer G of each transistor T faces the active layer with the insulating film L0 interposed therebetween. Further, as illustrated in FIG. 5, the gate layer Gdr of the driving transistor Tdr is formed to extend to the active area 10A formed in the area constituting the capacitive element C, and constitutes a lower capacitive electrode layer CA1.

As is understood from FIG. 3, a multilayer wiring layer in which a plurality of insulating layers L (LA to LD) and a plurality of conductive layers (wiring layers) are alternately stacked is formed on the surface of the insulating film L0 on which the gate layer G of each transistor T and the lower capacitive electrode layer CA1 have been formed. Each insulating layer L is formed of an insulating inorganic material such as a silicon compound (typically, silicon nitride or silicon oxide). In the following description, a relationship in which a plurality of elements are collectively formed in the same process through selective removal of the conductive layer (single layer or multiple layers) is indicated as "formed from the same layer."

The insulating layer LA is formed on the surface of the insulating film L0 on which the gate G of each transistor T has been formed. As is understood from FIGS. 3 and 6, upper capacitive electrode layers CA2, CA3, and CA4 and the plurality of relay electrodes QB (QB1, QB2, and QB3) are formed from the same layer on the surface of the insulating layer LA. As is understood from FIGS. 3 and 6, the upper capacitive electrode layer CA2 is electrically connected to the active area 10A forming a source area or a drain area of the driving transistor Tdr via a conduction hole HA5 penetrating the insulating layer LA and the insulating film L0. An opening 50 is formed in the upper capacitive electrode layer CA2 to surround an area in which a portion of the gate layer Gdr of the driving transistor Tdr and the lower capacitive electrode layer CA1 have been formed in a plan view. Further, an opening 51 is formed in the upper capacitive electrode layer CA2 to surround the drain area or the source area of the driving transistor Tdr constituting a pixel conduction portion, and a portion of the gate layer Gsl and a portion of the drain area or the source area of the selection transistor Tsl in a plan view.

In the opening 50, an upper capacitive electrode layer CA3 and an upper capacitive electrode layer CA4 are formed on the same layer as the upper capacitive electrode layer CA2. An opening 52 is formed in the upper capacitive electrode layer CA3, and the upper capacitive electrode layer CA4 is formed in the opening 52. That is, the upper capacitive electrode layer CA2, the upper capacitive electrode layer CA3, and the upper capacitive electrode layer CA4 are formed apart and electrically insulated from one another. That is, the upper capacitive electrode layer CA3 is surrounded by the upper capacitive electrode layer CA2. Also, the upper capacitive electrode layer CA4 is surrounded by the upper capacitive electrode layer CA3. The upper capacitive electrode layer CA3 also functions as a wiring layer that connects the gate layer Gdr of the driving transistor Tdr to the active area 10A forming the drain area or the source area of the selection transistor Tsl. That is, as is understood from FIGS. 3, 5 and 6, the upper capacitive electrode layer CA3 is electrically connected to the active area 10A of the selection transistor Tsl via a conduction hole HA2 penetrating the insulating layer LA and the insulating film L0, and is electrically connected to the gate Gdr of the driving transistor Tdr via the conduction hole HB2 of the insulating layer LA.

In the opening 51, the relay electrode QB1, the relay electrode QB2, and the relay electrode QB3 are formed on the same layer as the upper capacitive electrode layer CA2. That is, the relay electrode QB1, the relay electrode QB2, and the relay electrode QB3 are surrounded by the upper capacitive electrode layer CA2. As is understood from FIGS. 3, 5 and 6, the relay electrode QB1 is electrically connected to the active area 10A forming the drain area of the driving transistor Tdr via a conduction hole HA6 penetrating the insulating layer LA and the insulating film L0. The relay electrode QB2 is electrically connected to the gate layer Gsl of the selection transistor Tsl via a conduction hole HB1 penetrating the insulating layer LA. The relay electrode QB3 is electrically connected to the active area 10A forming the source area of the driving transistor Tdr via the conduction hole HA1 penetrating the insulating layer LA and the insulating film L0. As is understood from FIG. 6, each of the selection transistor Tsl and the driving transistor Tdr is formed so that its channel length is in the Y direction. Further, the area constituting the capacitive element C is arranged in a position shifted in the X direction (positive side in the X direction in FIG. 6) with respect to the driving transistor Tdr. A conduction place between the gate layer Gsl of the selection transistor Tsl and the relay electrode QB2 is arranged in a position shifted in the X direction (negative side in the X direction in FIG. 6) with respect to the selection transistor Tsl.

The insulating layer LB is formed on the surface of the insulating layer LA on which the upper capacitive electrode layer CA2, the upper capacitive electrode layer CA3, the upper capacitive electrode layer CA4, and the plurality of relay electrodes QB (QB1, QB2, and QB3) have been formed. As is understood from FIGS. 3 and 7, a power supply line layer 41 serving as the first power supply conductor, a scanning line 22, and a plurality of relay electrodes QC (QC1 and QC2) are formed from the same layer on the surface of the insulating layer LB. The power supply line layer 41 is electrically connected to the mounting terminal 36 to which the power supply potential Vel on the high level side is supplied, via a wiring within the multilayer wiring layer (not illustrated). The power supply line layer 41 is formed in the display area 16 of the first area 12 illustrated in FIG. 1. Further, although not shown, another supply line layer is also formed in the peripheral area 18 of the first area 12. This power supply line layer is electrically connected to the mounting terminal 36 to which the power supply potential Vct on a low level side is supplied, via a wiring (not illustrated) within the multilayer wiring layer. The power supply line layer 41 and the power supply line layer to which the supply potential Vct on the low level side is supplied are formed of, for example, a conductive material containing silver or aluminum to a thickness of about 100 nm.

The power supply line layer 41 is a power supply wiring to which the power supply potential Vel on the high level side is supplied as described above, and is a striped pattern that covers the opening 50 of the upper capacitive electrode layer CA2 and the upper capacitive electrode layer CA2 around the opening in each pixel, and is uniformly continuous without a gap between adjacent pixels in the X direction, as is understood from FIG. 13.

Figure 6:
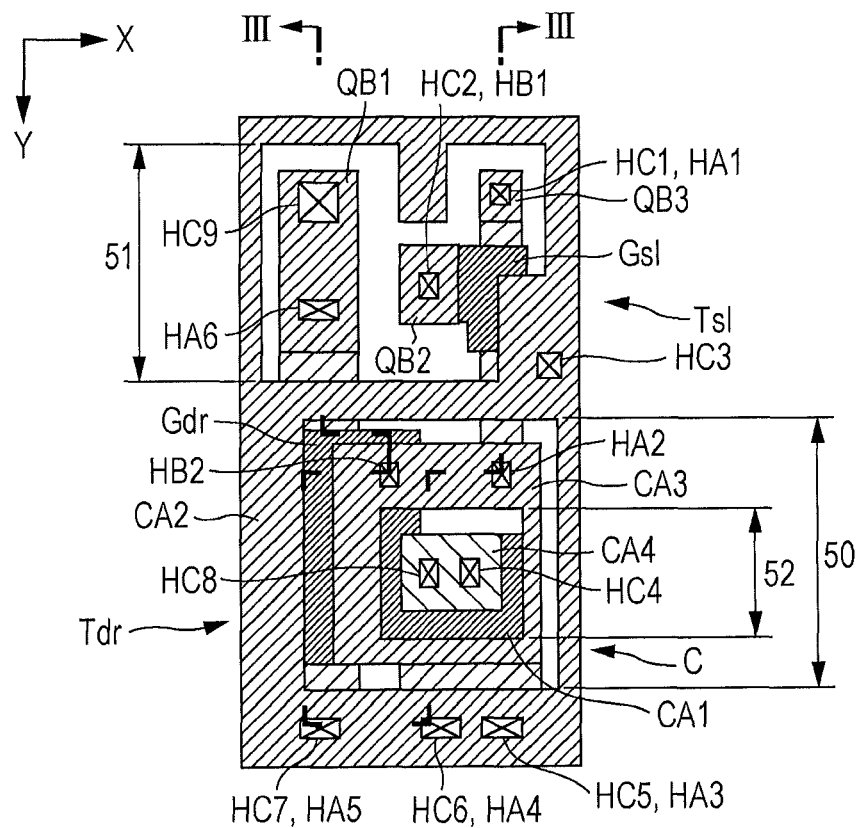
FIG. 6 is an illustrative diagram of each element that is formed on the substrate.
Figure 7:
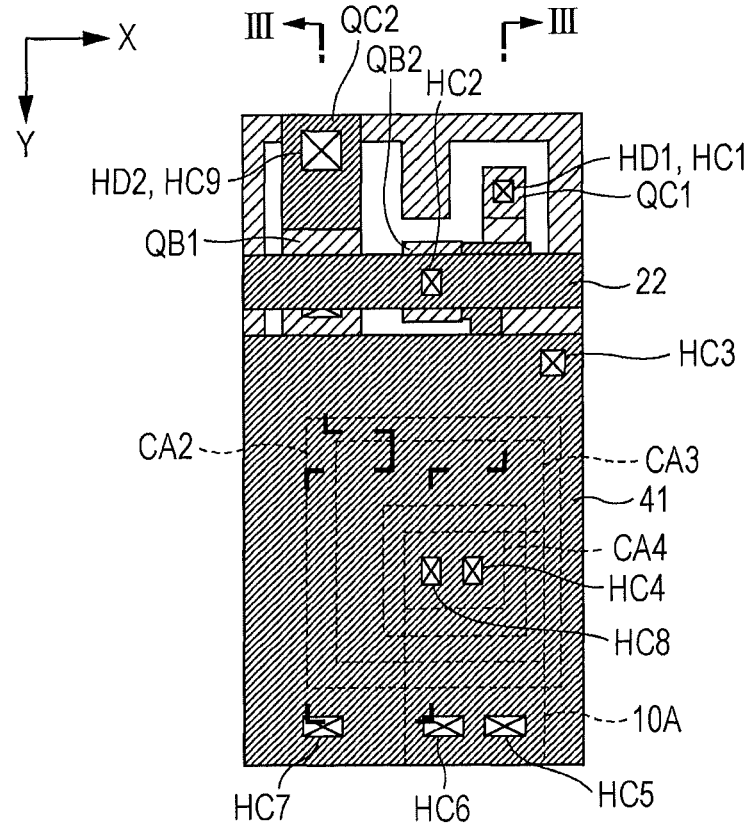
FIG. 7 is an illustrative diagram of each element that is formed on the substrate.

As is understood from FIGS. 3 and 7, the power supply line layer 41 formed in the display area 16 is electrically connected to the upper capacitive electrode layer CA2 via a conduction hole HC3 formed in the insulating layer LB in each display pixel Pe. The power supply line layer 41 is also electrically connected to the upper capacitive electrode layer CA2 through conduction holes HC5, HC6, and HC7 formed in the insulating layer LB in each display pixel Pe. Accordingly, as is understood from FIGS. 3, and 5 to 7, the power supply line layer 41 is electrically connected to the active area 10A formed in an area constituting the capacitive element C via the conduction holes HC5 and HC6 penetrating the insulating layer LB, the upper capacitive electrode layer CA2, and the conduction holes HA3 and HA4 penetrating the insulating film L0 and the insulating layer LA. Further, as is understood from FIGS. 3 and 7, the power supply line layer 41 is electrically connected to the upper capacitive electrode layer CA2 via the conduction hole HC7 formed in the insulating layer LB in each display pixel Pe. Thus, as is understood from FIGS. 3 and 5 to 7, the power supply line layer 41 is electrically connected to the active area 10A forming a source area or a drain area of the driving transistor Tdr via the conduction hole HC7 penetrating the insulating layer LB, the upper capacitive electrode layer CA2, and the conduction hole HA5 penetrating the insulating film L0 and the insulating layer LA. That is, the upper capacitive electrode layer CA2 also functions as a wiring layer that connects the source area or the drain area of the driving transistor Tdr to the power supply line layer 41. As is understood from FIG. 12, the upper capacitive electrode layer CA2 also functioning as a wiring layer for the source area or the drain area of the driving transistor Tdr is a pattern that covers the opening 51 and the periphery of the opening 50 within one pixel and is continuous without a gap between adjacent pixels in the X direction and the Y direction. The power supply line layer 41 is electrically insulated from the upper capacitive electrode layer CA3 by the insulating layer LB. Further, as is understood from FIGS. 3 and 7, the power supply line layer 41 is electrically connected to the upper capacitive electrode layer CA4 through the conduction holes HC4 and HC8 formed in the insulating layer LB in each display pixel Pe.

As is understood from FIG. 7, the scanning line 22 is electrically connected to the relay electrode QB2 via the conduction hole HC2 formed in the insulating layer LB in each display pixel Pe. Thus, as is understood from FIGS. 5 to 7, the scanning line 22 is connected to the gate layer Gsl of the selection transistor Tsl via the conduction hole HC2 penetrating the insulating layer LB, the relay electrode QB2, and the conduction hole HB1 penetrating the insulating layer LA. As is understood from FIG. 13, the scanning line 22 extends in a straight line shape in the X direction over a plurality of the display pixels Pe, and is electrically insulated from the upper capacitive electrode layer CA2 and the relay electrode QB1 by the insulating layer LB.

As is understood from FIG. 7, a relay electrode QC1 is electrically connected to the relay electrode QB3 via a conduction hole HC1 formed in the insulating layer LB in each display pixel Pe. Accordingly, as is understood from FIGS. 5 to 7, the relay electrode QC1 is electrically connected to the active area 10A of the selection transistor Tsl via the conduction hole HC1 penetrating the insulating layer LB, the relay electrode QB3, and the conduction hole HA1 penetrating the insulating film L0 and the insulating layer LA.

As is understood from FIG. 7, the relay electrode QC2 is electrically connected to the relay electrode QB1 via a conduction hole HC9 formed in the insulating layer LB in each display pixel Pe. Accordingly, as is understood from FIGS. 5 to 7, the relay electrode QC2 is connected to the active area 10A forming the drain area or the source area of the driving transistor Tdr via the conduction hole HC9 penetrating the insulating layer LB, the relay electrode QB1, and the conduction hole HA6 penetrating the insulating film L0 and the insulating layer LA.

An insulating layer LC is formed on a surface of the insulating layer LB on which the power supply line layer 41, the scanning line 22, and the relay electrode QC1 and QC2 have been formed. As is understood from FIGS. 3 and 8, on the surface of the insulating layer LC, a signal line 26 and a relay electrode QD1 are formed from the same layer. The signal line 26 extends in a straight line shape in the Y direction over the plurality of pixels P, and is electrically insulated from the scanning line 22 and the power supply line layer 41 by the insulating layer LC. Specifically, as is understood from FIGS. 7 and 8, the signal line 26 is electrically connected to the relay electrode QC1 via the conduction hole HD1 formed in the insulating layer LC in each display pixel Pe. Accordingly, as is understood from FIGS. 5 to 8, the signal line 26 is electrically connected to the active area 10A of the selection transistor Tsl via the conduction hole HD1 penetrating the insulating layer LC, the relay electrode QC1, the relay electrode QB3, and the conduction hole HA1 penetrating the insulating film L0 and the insulating layer LA. Further, the signal line 26 is formed to pass through the positions in a layer over the relay electrode QC1, the scanning line 22, and the power supply line layer 41, and extends in a direction (Y-direction) of the channel length of the selection transistor Tsl. The signal line 26 overlaps the selection transistor Tsl through the scanning line 22 and the power supply line layer 41 in a plan view. Further, as is understood from FIG. 14, the signal line 26 extends in a straight line shape in the Y direction over the plurality of the display pixels Pe, and is electrically insulated from the scanning line 22 and the power supply line layer 41 by the insulating layer LC.

As is understood from FIG. 7, the relay electrode QC2 is electrically connected to the relay electrode QB1 via the conduction hole HC9 formed in the insulating layer LB in each display pixel Pe. Accordingly, as is understood from FIGS. 5 to 7, the relay electrode QC2 is connected to the active area 10A forming the drain area or the source area of the driving transistor Tdr via the conduction hole HC9 penetrating the insulating layer LB, the relay electrode QB1, and the conduction hole HA6 penetrating the insulating film L0 and the insulating layer LA.

As illustrated in FIG. 3, the insulating layer LD is formed on the surface of the insulating layer LC on which the signal line 26 and the relay electrode QD1 have been formed. While the above description has been focused on the display pixel Pe, the configurations of the respective elements from the surface of the substrate 10 to the insulating layer LD are also common to the dummy pixel Pd in the peripheral area 18.

Figure 9:
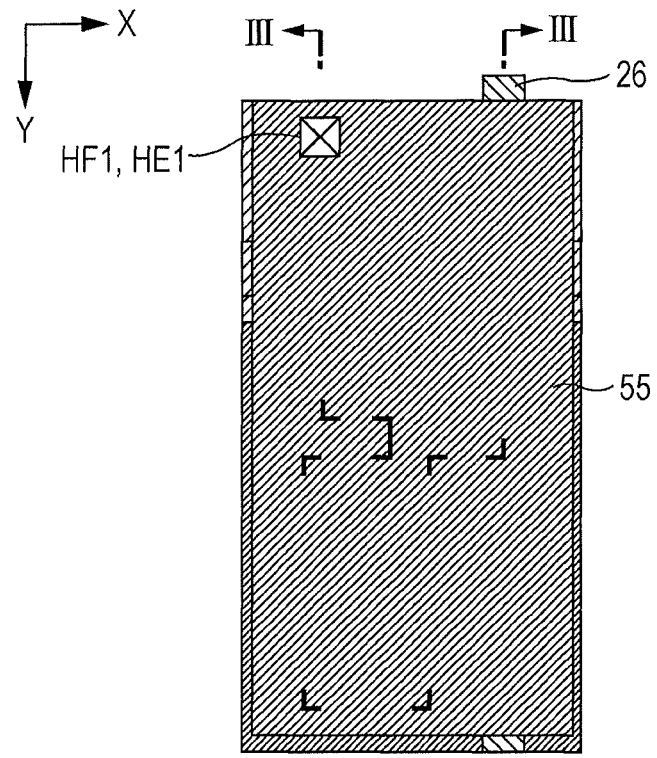
FIG. 9 is an illustrative diagram of each element that is formed on the substrate.

A planarization process is executed for the surface of the insulating layer LD. In the planarization process, a known surface processing technology such as chemical mechanical polishing (CMP) is optionally adopted. A reflective layer 55 is formed of an optically reflecting conductive material containing, for example, silver or aluminum and to a film thickness of, for example, about 100 nm on a surface of the insulating layer LD highly planarized in the planarization process, as illustrated in FIGS. 3 and 9. The reflective layer 55 may be formed of an optically reflecting conductive material, and is arranged to cover each transistor T, each wiring, and each relay electrode, as illustrated in FIG. 9. Therefore, there is an advantage in that the intrusion of external light can be prevented by the reflective layer 55, and the leakage of a current of each transistor T caused by light irradiation can be prevented.

As is understood from FIGS. 3 and 9, the reflective layer 55 is electrically connected to the relay electrode QD1 via a conduction hole HE1 formed in the insulating layer LD for each display pixel Pe. Accordingly, as is understood from FIGS. 5 to 9, the reflective layer 55 is electrically connected to the active area 10A forming the drain area or the source area of the driving transistor Tdr via the conduction hole HE1 penetrating the insulating layer LD, the relay electrode QD1, the conduction hole HD2 penetrating the insulating layer LC, the relay electrode QC2, the conduction hole HC9 penetrating the insulating layer LB, the relay electrode QB1, and the conduction hole HA6 penetrating the insulating film L0 and the insulating layer LA.

As illustrated in FIG. 3, an optical path adjustment layer 60 is formed on the surface of the insulating layer LD on which the reflective layer 55 has been formed. The optical path adjustment layer 60 is a light transmissive film body that defines a resonance wavelength (that is, display color) of a resonant structure of each display pixel Pe. In pixels having the same display colors, the resonance wavelengths of the resonant structures are substantially the same as each other, and in pixels having different display color, the resonance wavelengths of the resonant structures are set to be different from each other.

Figure 10:
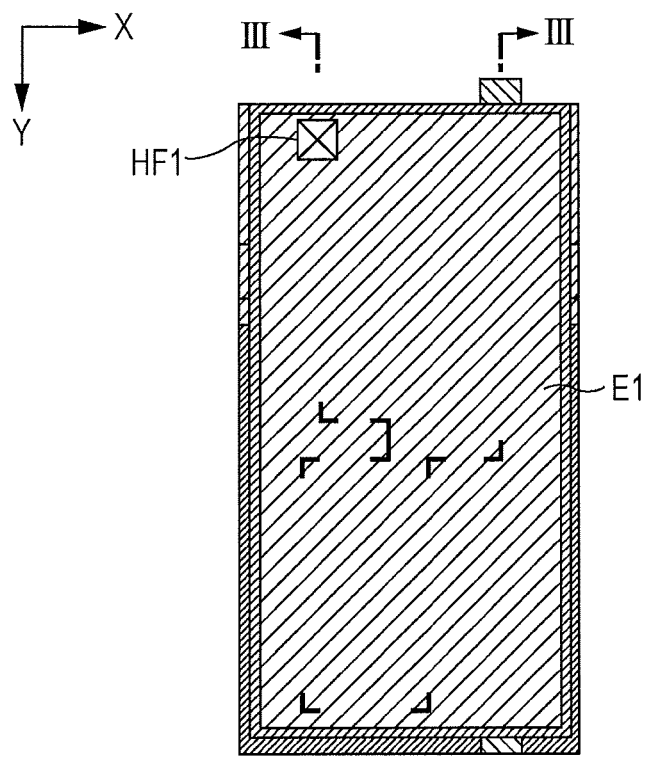
FIG. 10 is an illustrative diagram of each element that is formed on the substrate.

As illustrated in FIGS. 3 and 10, a first electrode E1 of each display pixel Pe in the display area 16 is formed on a surface of the optical path adjustment layer 60. The first electrode E1 is formed of a light transmissive conductive material such as ITO (Indium Tin Oxide). The first electrode E1 is a substantially rectangular electrode (pixel electrode) functioning as a positive electrode of the light emitting element 45, as described above with reference to FIG. 2. The first electrode E1 is electrically connected to the reflective layer 55 via a conduction hole HF1 formed in the optical path adjustment layer 60 in each display pixel Pe. Accordingly, as is understood from FIGS. 5 to 10, the first electrode E1 is electrically connected to the active area 10A forming the drain area or the source area of the driving transistor Tdr via the conduction hole HF1 penetrating the optical path adjustment layer 60, the reflective layer 55, the conduction hole HE1 penetrating the insulating layer LD, the relay electrode QD1, the conduction hole HD2 penetrating the insulating layer LC, the relay electrode QC2, the conduction hole HC9 penetrating the insulating layer LB, the relay electrode QB1, and the conduction hole HA6 penetrating the insulating film L0 and the insulating layer LA.

Figure 11:
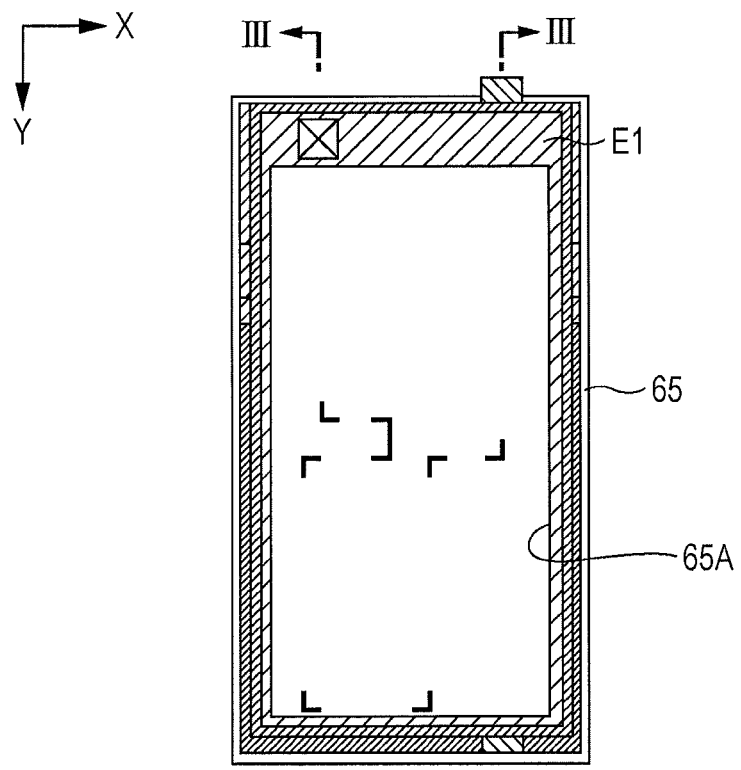
FIG. 11 is an illustrative diagram of each element that is formed on the substrate.

A pixel definition layer 65 is formed over the entire area of the substrate 10 on a surface of the optical path adjustment layer 60 on which the first electrode E1 has been formed, as illustrated in FIGS. 3 and 11. The pixel definition layer 65 is formed of an insulating inorganic material such as a silicon compound (typically, silicon nitride or silicon oxide). As is understood from FIG. 11, an opening 65A corresponding to each of the first electrodes E1 in the display area 16 is formed in the pixel definition layer 65. An area near an inner periphery of the opening 65A of the pixel definition layer 65 overlaps the periphery of the first electrode E1. That is, the inner periphery of the opening 65A is located on an inner side of the periphery of the first electrode E1 in a plan view. The respective openings 65A are the same in a plan shape (rectangular shape) or a size, and are arranged in a matrix shape with the same pitch in each of X and Y directions. As is understood from the above description, the pixel definition layer 65 is formed in a grid shape in a plan view. Further, the plan shapes or the sizes of the openings 65A may be the same as one another when the display colors are the same as one another and may be different from one another when the display colors are different from one another. The pitches of the openings 65A are the same as one another when the display colors are the same as one another, and may be different from one another when the display colors are different from one another.

Further, although a detailed description is omitted, the light emitting function layer 46, the second electrode E2, and the sealing body 47 are stacked on the layer over the first electrode E1, and a sealing substrate (not illustrated) is bonded to a surface of the substrate 10 in which the respective elements have been formed, for example, using an adhesive. The sealing substrate is a light transmissive plate-shaped member (for example, a glass substrate) for protecting each element on the substrate 10. Further, a color filter can be formed for each display pixel Pe on the surface of the sealing substrate or the surface of the sealing body 47.

As described above, in the first embodiment, the capacitive element and at least a portion of the driving transistor Tdr are arranged side by side in a stacking direction of the respective layers which is a third direction (a Z direction illustrated in FIG. 3), and the power supply portion (power supply potential portion), at least a portion of the capacitive element, and the selection transistor Tsl are arranged side by side in the first direction (the X direction illustrated in FIG. 6) and a surface direction (a Y direction illustrated in FIG. 6) of each layer which is a second direction. As is understood from FIGS. 3, 6 and 7, the upper capacitive electrode layer CA2 is electrically connected to the power supply line layer 41 that is the first power supply conductor, and functions as the second electrode C2 of the capacitive element C illustrated in FIG. 2. The gate layer Gdr that is at least a portion of the driving transistor Tdr as the first transistor is arranged via the insulating layer LA under the upper capacitive electrode layer CA2 in the stacking direction. Therefore, considering the gate layer Gdr as the first electrode C1 of the capacitive element C connected to the gate of the driving transistor Tdr illustrated in FIG. 2, the upper capacitive electrode layer CA2, the insulating layer LA, and the gate layer Gdr constitute the capacitive element C, and the capacitive element C and the gate layer Gdr that is at least a portion of the driving transistor Tdr are arranged side by side in the stacking direction.

The upper capacitive electrode layer CA3 is electrically connected to the gate layer Gdr that is at least a portion of the driving transistor Tdr. Therefore, the upper capacitive electrode layer CA3 functions as a first electrode C1 of the capacitive element C. In the stacking direction, the power supply line layer 41 as a first power supply conductor is arranged via the insulating layer LB above the upper capacitive electrode layer CA3. Thus, when the power supply line layer 41 is considered as a second electrode C2 of the capacitive element C, the upper capacitive electrode layer CA3, the insulating layer LB, and the power supply line layer 41 constitute the capacitive element C, and the capacitive element C, and the gate layer Gdr that is at least a portion of the driving transistor Tdr are arranged side by side in the stacking direction.

The upper capacitive electrode layer CA4 is electrically connected to the power supply line layer 41 serving as the first power supply conductor. Therefore, the upper capacitive electrode layer CA4 functions as the second electrode C2 of the capacitive element C. In the stacking direction, the lower capacitive electrode layer CA1 is arranged under the upper capacitive electrode layer CA4 via the insulating layer LA. The lower capacitive electrode layer CA1 is an electrode integrally formed with the gate layer Gdr which is at least a portion of the driving transistor Tdr, and the lower capacitive electrode layer CA1 functions as the first electrode C1 of the capacitive element C electrically connected to the gate layer Gdr that is at least a portion of the driving transistor Tdr. Therefore, the upper capacitive electrode layer CA4, the insulating layer LA, and the lower capacitive electrode layer CA1 constitute the capacitive element C, and the capacitive element C and the gate layer Gdr which is at least a portion of the driving transistor Tdr are arranged side by side in the stacking direction. Further, the active area 10A implanted with impurities is arranged under the lower capacitive electrode layer CA1 via the insulating film L0. Since the active area 10A is electrically connected to the power supply line layer 41, the active area 10A functions as the second electrode C2. The active area 10A, the insulating film L0, and the lower capacitive electrode layer CA1 constitute a so-called MOS capacitor in the stacking direction.

As described above, in the first embodiment, the capacitive element and at least a portion of the driving transistor Tdr are arranged side by side in the stacking direction (the Z direction illustrated in FIG. 3) of the respective layers that is the first direction.

Then, for the Y direction which is a direction of the channel length of the selection transistor Tsl, the upper capacitive electrode layer CA2 is electrically connected to the power supply line layer 41 via the conduction holes HA3 and HA4 penetrating the insulating film L0 and the insulating layer LA, and the conduction holes HC5 and HA6 penetrating the insulating layer LB, as is understood from FIGS. 3, 6 and 7. Therefore, the upper capacitive electrode layer CA2 functions as a power supply portion (power supply potential portion), and functions as the second electrode C2 of the capacitive element C. Also, the upper capacitive electrode layer CA3 is formed on the same layer as the upper capacitive electrode layer CA2 and arranged in positions away from each other with the insulating layer LB interposed therebetween in the Y direction. The upper capacitive electrode layer CA3 is electrically connected to the gate layer Gdr of the driving transistor Tdr, and functions as the first electrode C1 of the capacitive element C. Therefore, the upper capacitive electrode layer CA2, the insulating layer LB, and the upper capacitive electrode layer CA3 constitute the capacitive element C in the Y direction. Similarly, the upper capacitive electrode layer CA4 arranged to be separate from the upper capacitive electrode layer CA3 functioning as the first electrode C1 in the Y direction via the insulating layer LB is electrically connected to the power supply line layer 41, and functions as the second electrode C2. Therefore, the upper capacitive electrode layer CA3, the insulating layer LB, and the upper capacitive electrode layer CA4 also constitute the capacitive element C in the Y direction.

Thus, in the Y direction from positions of the conduction holes HA3 and HA4 penetrating the insulating film L0 and the insulating layer LA through which the upper capacitive electrode layer CA2 is electrically connected to the power supply line layer 41 and the conduction holes HC5 and HA6 penetrating the insulating layer LB to a position in which the selection transistor Tsl is arranged, the capacitive element C including the upper capacitive electrode layer CA2 and the upper capacitive electrode layer CA3, the capacitive element C including the upper capacitive electrode layer CA3 and the upper capacitive electrode layer CA4, the capacitive element C including the upper capacitive electrode layer CA4 and the upper capacitive electrode layer CA3, the capacitive element C including the upper capacitive electrode layer CA3 and the upper capacitive electrode layer CA2, and the selection transistor Tsl are arranged. Therefore, considering that the upper capacitive electrode layer CA2 and the upper capacitive electrode layer CA4 also function as the power supply portion (power supply potential portion), the power supply portion (power supply potential portion), at least a portion of the capacitive element, and the selection transistor Tsl are arranged side by side in the surface direction (Y direction in FIG. 6) of each layer which is the second direction in the present embodiment.

As is understood from FIGS. 3, 6 and 7, the upper capacitive electrode layer CA2, the upper capacitive electrode layer CA3, and the upper capacitive electrode layer CA4 constitute the capacitive element C through the insulating layer LB not only in the Y direction, but also in the X direction and an oblique direction on an XY plane. This is because the upper capacitive electrode layer CA3 electrically connected to the gate layer Gdr of the driving transistor Tdr and functioning as the first electrode C1 and the upper capacitive electrode layer CA2 electrically connected to the power supply line layer 41 and functioning as the second electrode C2 are formed on the same layer and arranged in positions away from each other with the insulating layer LB interposed therebetween, and the upper capacitive electrode layer CA3 is arranged to be surrounded by the upper capacitive electrode layer CA2 in a plan view. Further, if the upper capacitive electrode layer CA4 electrically connected to the power supply line layer 41 is considered as the third electrode, the upper capacitive electrode layer CA4 that is the third electrode is arranged to be surrounded by the upper capacitive electrode layer CA3 that is the first electrode, and thus, the upper capacitive electrode layer CA2, the upper capacitive electrode layer CA3, and the upper capacitive electrode layer CA4 constitute the capacitive element C through the insulating layer LB not only in the Y direction, but also in the X direction and the oblique direction on the XY plane.

As described above, in this embodiment, at least a portion of the driving transistor Tdr, and the capacitive element C configured between the active area 10A and the lower capacitive electrode layer CA1 are arranged side by side in the first direction (X direction), and a power supply portion in which, for example, the conduction holes HA5, HA4, and HA3 are arranged, at least a portion of the capacitive elements C configured between the active area 10A and the lower capacitive electrode layer CA1, and the selection transistor Tsl are arranged side by side in a second direction (the Y direction). By adopting such an arrangement configuration, the driving transistor Tdr and the capacitive element C can be arranged close to the power supply portion, and away from the scanning line or the like. Therefore, it is possible to achieve stabilization of the gate potential portion of the driving transistor Tdr without being affected by the scanning line or the like.

The capacitive element C of the present embodiment is summarized as follows. In this embodiment, the capacitive element C includes five types below.

Stacking Direction i. Between the Active Area 10A and the Lower Capacitive Electrode Layer CA1

The capacitive element C is configured using the active area 10A that is formed on the substrate 10 and to which the power supply potential Vel is supplied as one electrode, and the lower capacitive electrode layer CA1 that is formed with the insulating film L0 interposed therebetween and to which a gate potential is supplied as the other electrode.

ii. Between the Upper Capacitive Electrode Layer CA2 and the Gate Layer Gdr and Between the Upper Capacitive Electrode Layer CA4 and the Lower Capacitive Electrode Layer CA1

The capacitive element C is configured using the gate layer Gdr to which a gate potential is supplied as one electrode, and the upper capacitive electrode layer CA2 formed with the insulating layer LA interposed therebetween and to which the power supply potential Vel is supplied as the other electrode. Further, the capacitive element C is configured using the lower capacitive electrode layer CA1 formed integrally with the gate layer Gdr as one electrode, and the upper capacitive electrode layer CA4 formed with the insulating layer LA interposed therebetween and to which the power supply potential Vel is supplied as the other electrode.

iii. Between the Upper Capacitive Electrode Layer CA3 and the Power Supply Line Layer 41

The capacitive element C is configured using the upper capacitive electrode layer CA3 to which the gate potential is supplied as the one electrode, and the power supply line layer 41 formed with the insulating layer LB interposed therebetween and to which the power supply potential Vel is supplied as the other electrode.

Further, the capacitive element C of i) and the capacitive element C of ii) are configured to overlap in a plan view. Further, the capacitive element C of i) and the capacitive element C of iii) are configured to overlap in a plan view, and the capacitive element C of ii) and the capacitive element C of iii) are configured to overlap in a plan view.

Planar Direction iv. Between the Upper Capacitive Electrode Layer CA2 and the Upper Capacitive Electrode Layer CA3

The capacitive element C is configured using the upper capacitive electrode layer CA2 to which the power supply potential Vel is applied as one electrode, and the upper capacitive electrode layer CA3 formed with the insulating layer LB interposed therebetween and to which the gate potential is supplied as the other electrode.

v. Between the Upper Capacitive Electrode Layer CA4 and the Upper Capacitive Electrode Layer CA3

The capacitive element C is formed using the upper capacitive electrode layer CA4 to which the power supply potential Vel is applied as one electrode, and the upper capacitive electrode layer CA3 formed with the insulating layer LB interposed therebetween and to which the gate potential is supplied as the other electrode.

In the invention, since the capacitive element C is formed in the layer over the gate layer Gdr of the driving transistor Tdr and the capacitive element C is formed in a surface direction in the same layer as the layer over the gate layer, that is, in the layer over the gate layer as described above, it is possible to effectively utilize the layer over the gate layer Gdr and secure the capacitance of the capacitive element. Further, since the capacitive element C is formed on the same layer as the layer over the gate layer Gdr, it is possible to achieve simplification of a manufacturing process. Further, since a portion of the capacitive element C formed on the same layer is arranged side by side in the surface direction between the power supply portion and the selection transistor Tsl, there is an advantage in that it is easy to shield the gate layer Gdr of the driving transistor Tdr. Further, since the driving transistor Tdr and the capacitive element including the respective upper capacitive electrode layers CA2, CA3, and CA4 are arranged to overlap each other in the plan view, it is possible to realize a high density of pixels while securing the capacitance of the capacitive element.

Further, in the present embodiment, since an MOS capacitor in which the active area 10A implanted with impurities is one electrode, and the lower capacitive electrode layer CA1 through the insulating film L0 is the other electrode is used as the capacitive element C, it is possible to achieve a high density of pixels while securing the capacitance of the capacitive element.

In the case of the organic electroluminescent device, a high voltage of 15 V or the like is used. Accordingly, when variation occurs in the gate potential of the driving transistor, influence of the variation on an emission luminance or the like of the light emitting element is large. Accordingly, it is important to improve a holding property of the gate potential of the driving transistor. According to this embodiment, since the capacitance of the capacitive element is secured as described above, it is possible to improve the holding property of the gate potential of the driving transistor, and provide a high quality image having no variation in the emission luminance.

As described above, the upper capacitive electrode layer CA2 also functions as a source wiring or a drain wiring of the driving transistor Tdr. Therefore, it is possible to achieve simplification of the process as compared to a case in which the source wiring or the drain wiring of the driving transistor Tdr, and the capacitive electrode are separately formed. Further, the upper capacitive electrode layer CA2 also functions as a light shielding portion in relation to the reflective layer 55. As illustrated in FIG. 9, the reflective layer 55 is not a pattern that is continuous without a gap between adjacent pixels, and is formed to be separate in each pixel. Therefore, the gap of the reflective layer 55 is generated between adjacent pixels. However, as is understood from FIGS. 6 and 12, the upper capacitive electrode layer CA2 formed in the layer under the reflective layer 55 includes an opening 50 and an opening 51, is arranged to surround the gate potential portion of the driving transistor Tdr, the pixel conduction portion, the conduction portion between the selection transistor Tsl, and other conduction portions, and is formed to be continuous without a gap between the adjacent pixels. Thus, even when the gap of the reflective layer 55 is generated between the adjacent pixels, light traveling to the driving transistor Tdr and the selection transistor Tsl is shielded by the upper capacitive electrode layer CA2. Therefore, the upper capacitive electrode layer CA2 also functions as a light shielding portion. Further, since the power supply line layer 41 is a pattern formed to be continuous without a gap between the adjacent pixel, the power supply line layer 41 serves as a light shielding portion for the gate potential portion of the driving transistor Tdr and each conduction portion in the periphery thereof. That is, since an end portion of the reflective layer 55 is arranged to overlap the upper capacitive electrode layer CA2 or the power supply line layer 41, the light transmitted through the adjacent reflective layer 55 is shielded by the upper capacitive electrode layer CA2 or the power supply line layer 41. Thus, a structure for which it is difficult for light to reach the transistor T is achieved.

For conduction between the capacitive electrode and the power supply line layer, the upper capacitive electrode layer CA2 functioning as the second electrode C2 is electrically connected to the power supply line layer 41 via the conduction holes HC3, HC5, HC6, and HC7 of the first conduction portion penetrating the insulating layer LB, as is understood from FIG. 7. Further, the upper capacitive electrode layer CA4 of the third electrode is electrically connected to the power supply line layer 41 via the conduction hole HC4 and the conduction hole HC7 as a second conduction portion penetrating the insulating layer LB, as is understood from FIG. 7. Therefore, the capacitive electrode can be connected to the power supply line layer 41 with a less resistance as compared as a case in which the power supply line layer 41 extends to a lower layer to achieve conduction. Further, as is understood from FIGS. 12 and 13, the power supply line layer 41 adjacent with the scanning line 22 interposed therebetween is electrically connected via the conduction holes HC3, HC5, HC6, and HC7 as the first conduction portion, and the upper capacitive electrode layer CA2. Therefore, the power supply line layer 41 and the upper capacitive electrode layer CA2 are electrically connected in a grid shape as compared to a case of only the power supply line layer 41. Therefore, using this configuration, it is possible to stably supply the power supply potential Vel on the high level side to the display pixel Pe.

The conduction portion connecting the driving transistor Tdr to the power supply line layer 41 includes the conduction hole HA5 penetrating the insulating film L0 and the insulating layer LA, and the conduction hole HC7 penetrating the insulating layer LB, as is understood from FIGS. 3 to 7. This conduction portion functions as a source wiring or a drain wiring of the driving transistor Tdr. Using this configuration, the driving transistor Tdr can be connected to the power supply line layer 41 with less resistance as compared to a case in which the power supply line layer 41 extends to the lower layer to achieve the conduction.

The conduction portion connecting the gate layer Gdr of the driving transistor Tdr to the upper capacitive electrode layer CA3 includes the conduction hole HB2 penetrating the insulating layer LA, as is understood from FIGS. 3, 5 and 6. This conduction portion is a source wiring or a drain wiring of the selection transistor Tsl, and is provided through the layer on which the gate layer Gdr has been formed. Therefore, the driving transistor Tdr can be connected to the power supply line layer 41 with less resistance as compared to a case in which the capacitive electrode layer CA3 extends to a lower layer to achieve the conduction.

Figure 8:
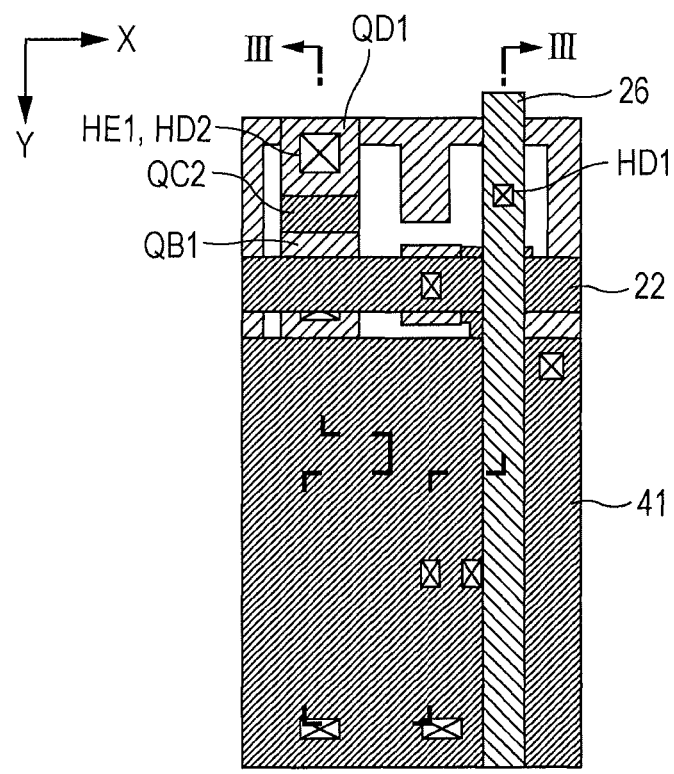
FIG. 8 is an illustrative diagram of each element that is formed on the substrate.

In the invention, as is understood from FIGS. 3, and 6 to 8, the power supply line layer 41 is arranged between the upper capacitive electrode layers CA2, CA3, and CA4 constituting the capacitive element C and the signal line 26. Since the power supply line layer 41 is a strip pattern that does not cover the upper capacitive electrode layers CA2, CA3, and CA4 in each pixel and is uniformly continuous without a gap between adjacent pixels as illustrated in FIGS. 13 and 14, a good shielding effect for the upper capacitive electrode layers CA2, CA3, and CA4 is achieved. Therefore, the coupling between the signal line 26 and the upper capacitive electrode layers CA2, CA3, and CA4 is suppressed by the power supply line layer 41. Further, in particular, the upper capacitive electrode layer CA3 electrically connected to the gate layer Gdr of the driving transistor Tdr is arranged to be covered by the power supply line layer 41 to which the power supply potential Vel on the high level side is supplied, and surrounded by the upper capacitive electrode layers CA2 and CA4 to which the power supply potential Vel on the high level side is supplied. Thus, the upper capacitive electrode layer CA3 is arranged to be surrounded in the XY plane by the power supply potential Vel that is a fixed potential and covered in a stacking direction with the power supply potential Vel that is the fixed potential, and thus, coupling between the signal line 26 and the upper capacitive electrode layer CA3 is further suppressed. Further, as illustrated in FIGS. 8 and 14, the signal line 26 and the selection transistor Tsl are arranged to extend in the Y direction. Also, since the signal line 26 is arranged to overlap the selection transistor Tsl in a plan view, it is possible to realize miniaturization of the pixels. Further, by the signal line 26 and the selection transistor Tsl overlapping in the plan view, the connection between the signal line 26 and the selection transistor Tsl is performed via the conduction holes HA1, HC2, and HD1 penetrating the respective insulating layers, the signal line 26 and the selection transistor Tsl are connected to each other with less resistance. As a result, capability of writing to the selection transistor Tsl using the signal line 26 is improved. The conductive portion connecting the signal line 26 to the selection transistor Tsl includes the conduction hole HA1 penetrating the insulating film L0 and the insulating layer LA, the relay electrode QB3, the conduction hole HC1 penetrating the insulating layer LB, the relay electrode QC1, and the conduction hole HD1 penetrating the insulating layer LC. This conduction portion is a source wiring or a drain wiring of the selection transistor Tsl, and is provided via the capacitive electrode layer on which the upper capacitive electrode layer CA2 or the like has been formed. Therefore, the selection transistor Tsl and the signal line 26 can be connected to each other with less resistance, as compared to a case in which the signal line 26 extends in a lower layer to achieve the conduction. Further, the conduction portion of the signal line 26 and the selection transistor Tsl is arranged while avoiding the pixel conduction portion. Further, as is understood from FIG. 6, a projection portion CA2a is formed in the upper capacitive electrode layer CA2 between the relay electrode QB1 and the conduction hole HC9, which are the pixel conduction portion, and the relay electrode QB3 and the conduction hole HC1, which are the conduction portion of the signal line 26 and the selection transistor Tsl, and the pixel conduction portion and the conduction portion between the signal line 26 and the selection transistor Tsl are separated. Therefore, it is possible to reduce influence of the signal line 26 on the pixel conduction portion.

The upper capacitive electrode layer CA2 is configured to be arranged between the gate potential portion of the driving transistor Tdr and the scanning line 22. Further, the power supply line layer 41 is configured to be arranged between the gate potential portion of the driving transistor Tdr and the scanning line 22. Therefore, coupling between the gate potential portion of the driving transistor Tdr and the scanning line 22 is suppressed.

The upper capacitive electrode layer CA2 is configured to be arranged between the conduction portion connecting the signal line 26 to the selection transistor Tsl and the gate potential portion of the driving transistor Tdr. Further, the power supply line layer 41 is configured to be arranged between the conduction portion connecting the signal line 26 to the selection transistor Tsl and the gate potential portion of the driving transistor Tdr. Therefore, coupling between the conduction portion connecting the signal line 26 to the selection transistor Tsl and the gate potential portion of the driving transistor Tdr is suppressed.

The conduction portion between the upper capacitive electrode layers CA1, CA2, and CA3 and the power supply line layer 41, the conduction portion connecting the driving transistor Tdr to the power supply line layer 41, and the conduction portion connecting the gate layer Gdr of the driving transistor Tdr to the upper capacitive electrode layer CA3 described above are all arranged to avoid the pixel conduction portion. Therefore, coupling between the conduction portion and the pixel conduction portion is suppressed.

In the invention, the power supply line layer 41 is arranged between the upper capacitive electrode layers CA2, CA3, and CA4 constituting the capacitive element C and the first electrode E1 which is a pixel electrode, as is understood from FIGS. 3, 6, 7, and 10. Since the power supply line layer 41 is a strip pattern that covers the upper capacitive electrode layers CA2, CA3, and CA4 in each pixel and is uniformly continuous without a gap from the adjacent pixel as illustrated in FIGS. 13 and 14, a good shielding effect is achieved for the upper capacitive electrode layers CA2, CA3, and CA4. Therefore, coupling between the first electrode E1 and the upper capacitive electrode layers CA2, CA3, and CA4 is suppressed by the power supply line layer 41. Further, as is understood from FIGS. 3 to 10, the conduction portion between the first electrode E1 and the source area or the drain area of the driving transistor Tdr includes the conduction hole HA6 penetrating the insulating film L0 and the insulating layer LA, the relay electrode QB1, the conduction holes HC9 penetrating the insulating layer LB, the relay electrode QC2, the conduction hole HD2 penetrating the insulating layer LC, the relay electrode QD1, HE1 penetrating the insulating layer LD, and the conduction hole HF1 penetrating the optical path adjustment layer 60. These function as the source wiring or the drain wiring of the driving transistor Tdr. That is, the conduction portion between the first electrode E1 and the source area or the drain area of the driving transistor Tdr includes a source wiring or a drain wiring of the driving transistor Tdr provided through a layer on which the upper capacitive electrode layer CA2 or the like has been formed and a layer on which the power supply line layer 41 or the like has been formed. Therefore, the source area or the drain area of the driving transistor Tdr can be connected to the first electrode E1 that is a pixel electrode with less resistance as compared to a case in which the pixel electrode extends to the layer of the source area or the drain area of the driving transistor Tdr to achieve the conduction.

In the invention, as is understood from FIGS. 3 and 7, the scanning line 22 that is a control line of the selection transistor Tsl is formed on the same layer as the power supply line layer 41. Therefore, it is possible to achieve simplification of the process. Further, as is understood from FIGS. 3, 6 and 7, each capacitive electrode is a layer under the signal line 26 and the scanning line 22, and the power supply line layer 41 is formed on the same layer as the scanning line 22. Thus, it is possible to reduce influence of the signal line 26 and the scanning line 22 on the capacitive electrode or the transistor without increasing the number of layers. The conduction portion between the scanning line 22 and the gate layer Gsl of the selection transistor Tsl is arranged to be shifted in a horizontal direction (a negative direction of the X direction in FIG. 6) from the gate of the selection transistor Tsl, and is arranged not to intersect with the signal line 26. It is possible to reduce the influence of the signal line 26 on the conduction portion of the gate layer Gsl of the selection transistor Tsl. The conduction portion between the scanning line 22 and the gate layer Gsl of the selection transistor Tsl may be arranged directly above the active area 10A of the selection transistor Tsl, and a position of the conduction portion between the selection transistor Tsl and the signal line 26 may be shifted.

The reflective layer 55 is connected to the first electrode E1 which is the pixel electrode. Since a potential of the first electrode E1, that is, the potential of the drain or the source of the driving transistor Tdr is set according to the potential of the driving transistor Tdr or the light emitting element 45, it is difficult for the potential of the first electrode E1 or the reflective layer 55 to be affected by the potential of the signal line 26.

Figure 15:
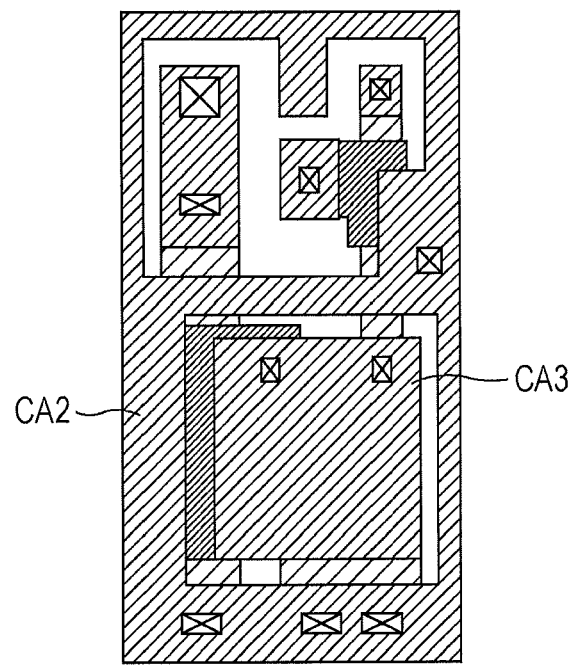
FIG. 15 is an illustrative diagram of each element that is formed on a substrate in a modification example of the first embodiment.
Figure 16:
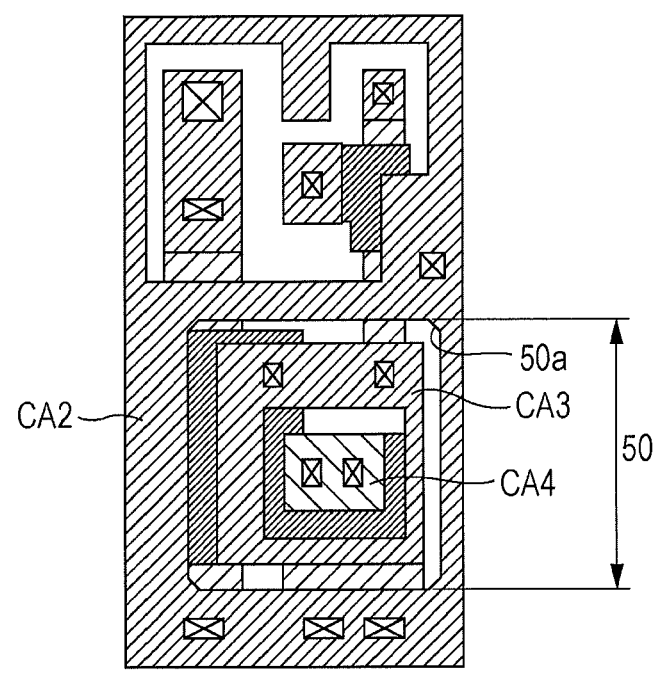
FIG. 16 is an illustrative diagram of each element that is formed on a substrate in the modification example of the first embodiment.
Figure 17:
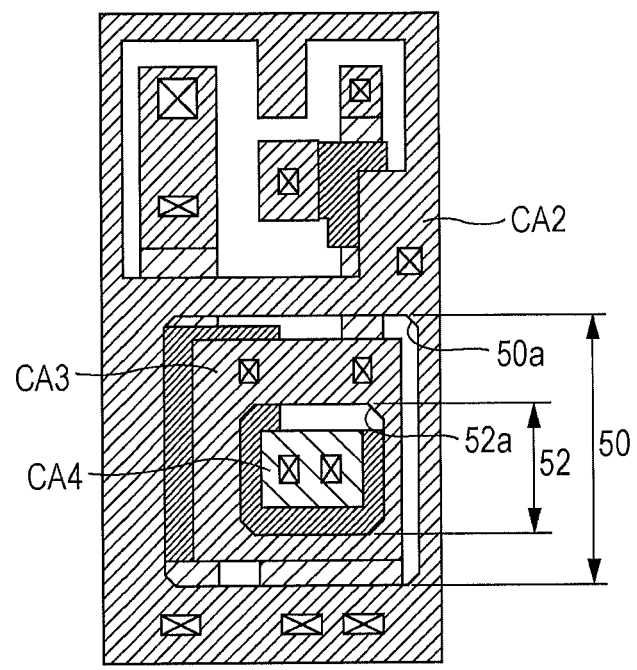
FIG. 17 is an illustrative diagram of each element that is formed on a substrate in the modification example of the first embodiment.

Further, while the electrode constituting the capacitive element is formed using the power supply line layer 41, the electrode may be provided in a different layer from the power supply line layer 41 or may be an electrode suspended from the power supply line layer 41. A dielectric film of the capacitive element can be thinned and the capacitance can be increased as compared to a case in which the source wiring or the drain wiring of the driving transistor Tdr is used as the capacitive electrode. Alternatively, it is possible to increase a degree of freedom of the arrangement of the capacitive element. Further, as illustrated in FIG. 15, the opening may not be provided in the upper capacitive electrode layer CA3 connected to the gate layer Gdr of the driving transistor Tdr and the upper capacitive electrode layer CA4 arranged in the opening may be omitted. Further, as illustrated in FIG. 16, a corner portion 50a of the opening 50 of the upper capacitive electrode layer CA2 may be chamfered. Further, as illustrated in FIG. 17, a corner portion 52a of the opening 52 of the upper capacitive electrode layer CA3 may be chamfered. In the corner portion, an interval between another portion and the upper capacitive electrode layer is great, and thus, the layer may not effectively function as the capacitive portion. On the other hand, when the surface is chamfered, it is possible to cause the layer to function as the capacitive portion.

Second Embodiment

A second embodiment of the invention will be described. Further, in each form to be illustrated below, elements having the same operation or function as in the first embodiment are denoted with signs referred to in the description of the first embodiment, and each detailed description will be appropriately omitted.

Figure 18:
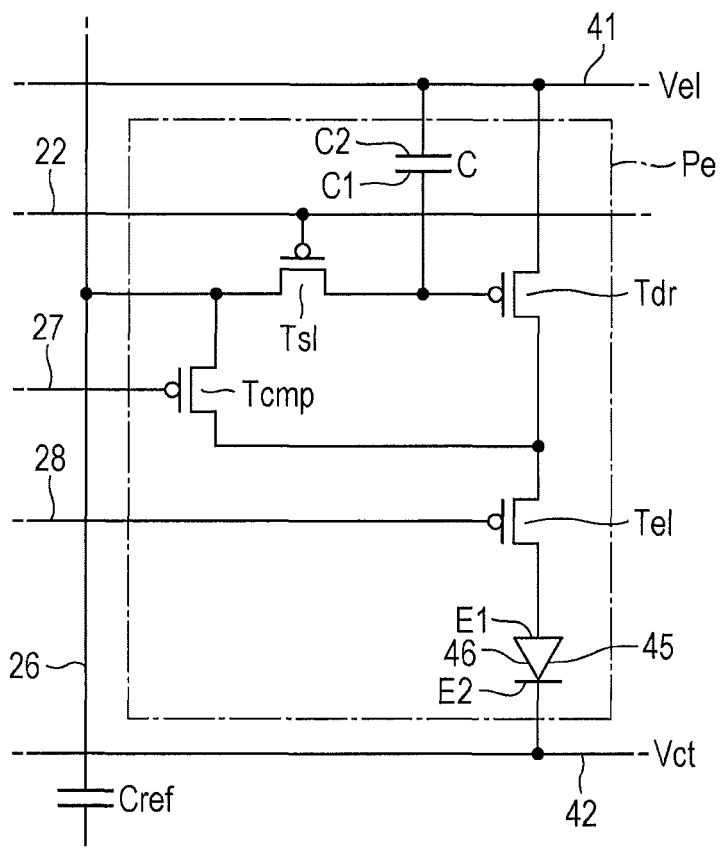
FIG. 18 is a circuit diagram of a pixel used for a light emitting device in a second embodiment of the invention.

FIG. 18 is a circuit diagram of each display pixel Pe in this embodiment. As illustrated in FIG. 18, the display pixel Pe in this embodiment includes an emission control transistor Tel and a compensation transistor Tcmp, in addition to a light emitting element 45, a driving transistor Tdr, a selection transistor Tsl, and a capacitive element C. Further, in this embodiment, although the transistors T (Tdr, Tel, Tsl, and Tcmp) of the display pixel Pe are a P-channel type, an N-channel type transistor can also be used. A circuit of the display pixel Pe in this embodiment can be driven using any one of a so-called coupling driving scheme and a so-called current programming scheme. First, driving using coupling driving scheme will be described.

The emission control transistor Tel functions as a switch that controls a conduction state (conduction/non-conduction) between the other terminal (drain or source) of a pair of current terminals of the driving transistor Tdr and a first electrode E1 of the light emitting element 45. The driving transistor Tdr generates a driving current having an amount of current corresponding to a voltage between the gate and the source. In a state in which the emission control transistor Tel is controlled to be in an ON state, the driving current is supplied from the driving transistor Tdr to the light emitting element 45 via the emission control transistor Tel, and thus, the light emitting element 45 emits light with luminance according to the amount of the driving current, and in a state in which the emission control transistor Tel is controlled to be in an OFF state, supplying of the driving current to the light emitting element 45 is blocked, and thus, the light emitting element 45 is turned off. The gate of the emission control transistor Tel is connected to a control line 28.

The compensation transistor Tcmp has a function of compensating for a variation in a threshold voltage of the driving transistor Tdr. When the emission control transistor Tel is in an OFF state, and the selection transistor Tsl and the driving transistor Tdr are controlled to be in an ON state, and if the compensation transistor Tcmp is controlled to be in an ON state, the gate potential and the drain or source potential of the driving transistor Tdr becomes equal to each other, and the driving transistor Tdr is connected as a diode. Therefore, a gate node and the signal line 26 are charged with a current flowing through the driving transistor Tdr. Specifically, the current flows along a path: power supply line layer 41→driving transistor Tdr→compensation transistor Tcmp→signal line 26. Therefore, the driving transistor Tdr is controlled to be in an ON state, and thus, a potential of the signal line 26 and the gate node connected to each other increases from a potential in an initial state. However, when a threshold voltage of the driving transistor Tdr is |Vth|, it is difficult for a current flowing through the path to flow as the gate node approaches a potential (Vel−|Vth|), and thus, the signal line 26 and the gate node are saturated with a potential (Vel−|Vth|) until termination of a compensation period in which the compensation transistor Tcmp enters an OFF state. Therefore, the capacitive element C holds the threshold voltage |Vth| of the driving transistor Tdr until termination of the compensation period in which the compensation transistor Tcmp enters an OFF state.

In the present embodiment, a compensation period and a writing period are included in the horizontal scanning period, and each scanning line driving circuit 32 supplies a scanning signal to the scanning lines 22 to sequentially select the plurality of scanning lines 22 in each horizontal scanning period. The selection transistor Tsl of each display pixel Pe corresponding to the scanning line 22 selected by the scanning line driving circuit 32 transitions to an ON state. Thus, the driving transistor Tdr of each display pixel Pe also transitions to an ON state. Further, each scanning line driving circuit 32 supplies a control signal to each control line 27 to sequentially select the plurality of control lines 27 in each compensation period. The compensation transistor Tcmp of each display pixel Pe corresponding to the control line 27 selected by the scanning line driving circuit 32 transitions to an ON state. Also, the capacitive element C holds a threshold voltage |Vth| of the driving transistor Tdr until termination of the compensation period in which the compensation transistor Tcmp enters an OFF state. When each scanning line driving circuit 32 supplies the control signal to each control line 27 to control the compensation transistor Tcmp of each display pixel Pe to enter the OFF state, a path from the signal line 26 to the gate node of the driving transistor Tdr enters a floating state, but (Vel−|Vth|) is maintained due to the capacitive element C. Then, the signal line driving circuit 34 supplies a gradation potential (data signal) corresponding to a gradation designated for each display pixel Pe by an image signal supplied from an external circuit to a capacitive elements Cref in parallel in each writing period. Also, the gradation voltage is level-shifted using the capacitive element Cref, and the potential is supplied to the gate of the driving transistor Tdr of each display pixel Pe via the signal line 26 and the selection transistor Tsl. A voltage corresponding to the gradation voltage is held in the capacitive element C while compensating for the threshold voltage |Vth| of the driving transistor Tdr. On the other hand, when the selection of the scanning line 22 in the writing period ends, each scanning line driving circuit 32 supplies the control signal to each control line 28 to control the emission control transistor Tel of each display pixel Pe corresponding to the control line 28 to enter an ON state. Therefore, a driving current corresponding to the voltage held in the capacitive element C in the immediately previous writing period is supplied from the driving transistor Tdr to the light emitting element 45 via the emission control transistor Tel. Each light emitting element 45 emits light with a luminance corresponding to the gradation voltage as described above, and thus, any image specified by the image signal is displayed in the display area 16. Also, in the driving current supplied from the driving transistor Tdr to the light emitting element 45, influence of the threshold voltage is suppressed, and thus, even when the threshold voltage of the driving transistor Tdr varies in each display pixel Pe, the variation is compensated and the current corresponding to a gradation level is supplied to the light emitting element 45. Accordingly, occurrence of display unevenness such as impaired uniformity of a display screen is suppressed, and as a result, it is possible to achieve a high quality display.

Figure 19:
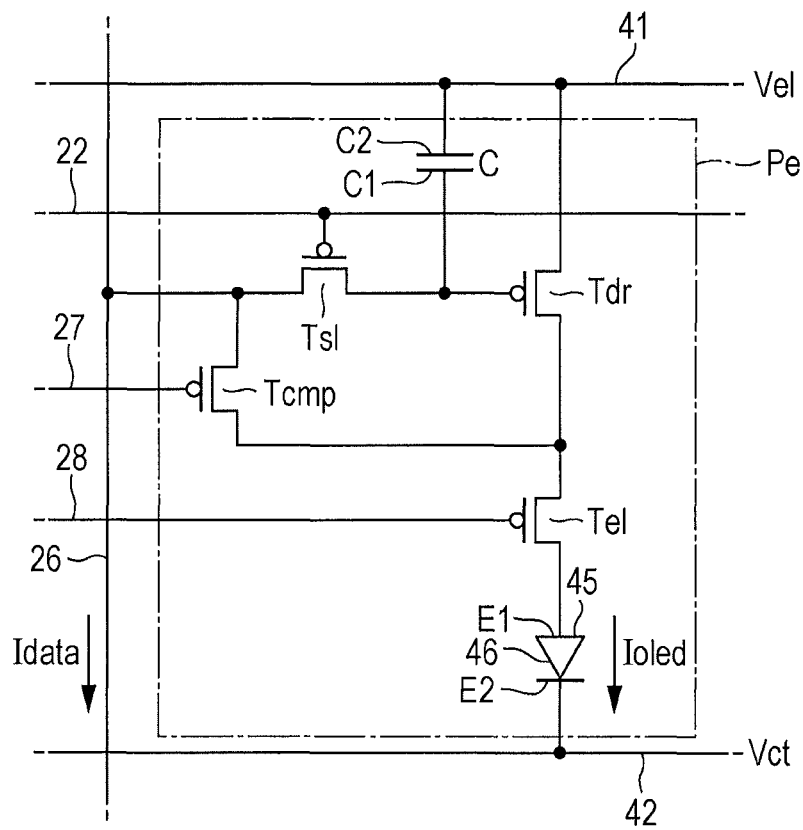
FIG. 19 is a circuit diagram of a pixel for describing driving using a current programming scheme.

Next, driving using the current programming scheme will be described with reference to FIG. 19. When the scanning signal of the scanning line 22 becomes the L level, the selection transistor Tsl is turned on. Further, when the control signal of the control line 27 becomes the L level, the compensation transistor Tcmp is turned on. Therefore, the driving transistor Tdr functions as a diode since the gate potential and the source potential or the drain potential on the side of connection to the emission control transistor Tel become equal. Also, when the data signal of the signal line 26 becomes an L level, the current Idata flows along a path: the power supply line layer 41→the driving transistor Tdr→the compensation transistor Tcmp→the signal line 26. Further, in this case, a charge corresponding to the potential of the gate node of the driving transistor Tdr is accumulated in the capacitive element C.

When the control signal of the control line 27 becomes an H level, the compensation transistor Tcmp is turned off. In this case, the voltage across the capacitive element C is held at the voltage when the current Idata flows. When the control signal of the control line 28 becomes an L level, the emission control transistor Tel is turned on, and the current Ioled corresponding to the gate voltage flows between the source and the drain of the driving transistor Tdr. Specifically, this current flows along a path: the power supply line layer 41→the driving transistor Tdr→the emission control transistor Tel→the light emitting element 45.

Here, the current Ioled flowing through the light emitting element 45 is determined by a voltage between the gate node of the driving transistor Tdr and a drain node or a source node on the side of connection to the power supply line layer 41, but the voltage is a voltage held in the capacitive element C when the current Idata flows through the signal line 26 by the scanning signal at the L level. Therefore, when the control signal of the control line 28 becomes an L level, the current Ioled flowing through the light emitting element 45 substantially matches the current Idata flowing immediately before. Thus, in the case of driving using the current programming scheme, emission luminance is defined by the current Idata. Further, while the scanning line 22 is a wiring different from the control line 27, the scanning line 22 and the control line 27 may be an integrally formed wire.

Figure 20:
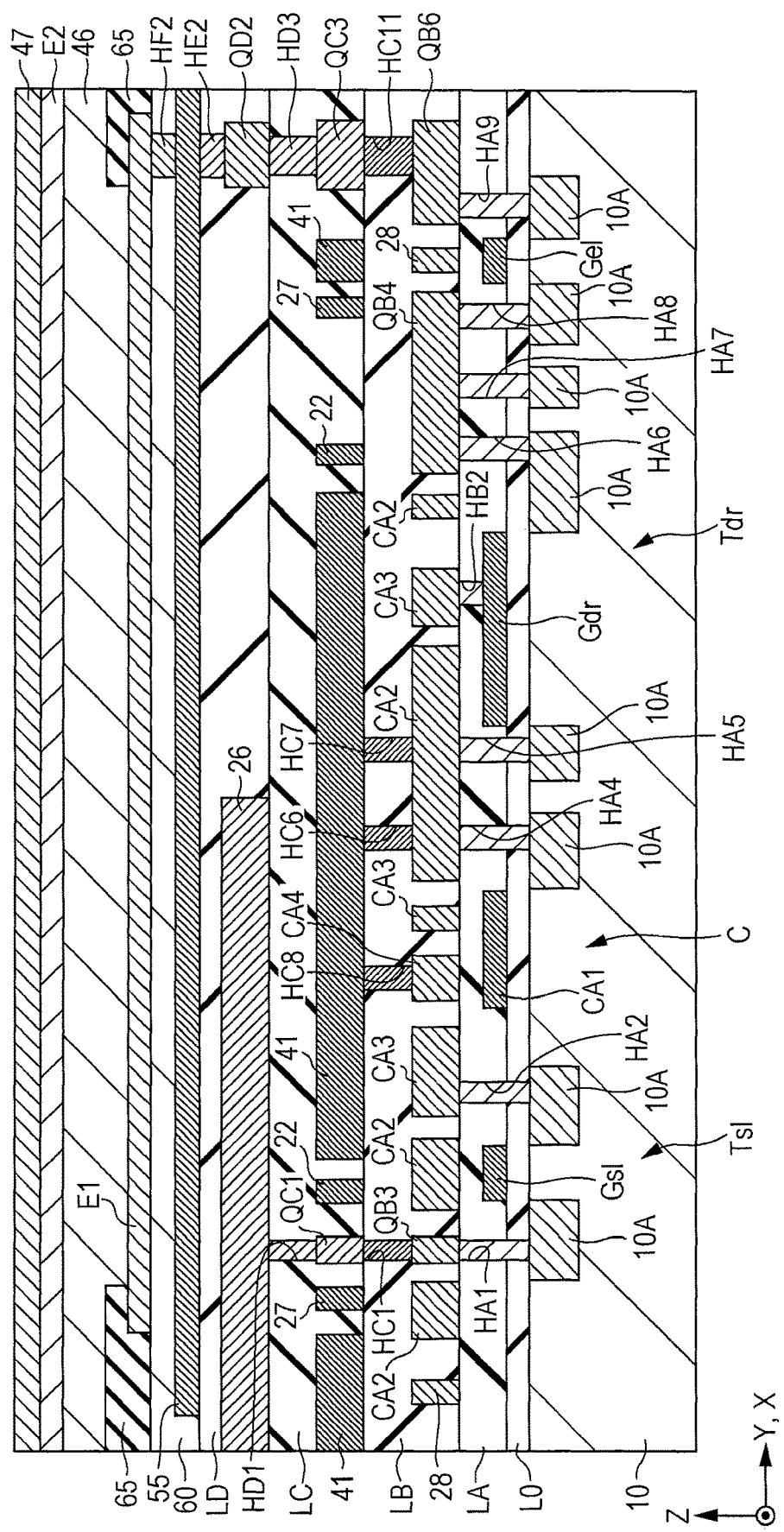
FIG. 20 is a sectional view of a light emitting device.
Figure 29:
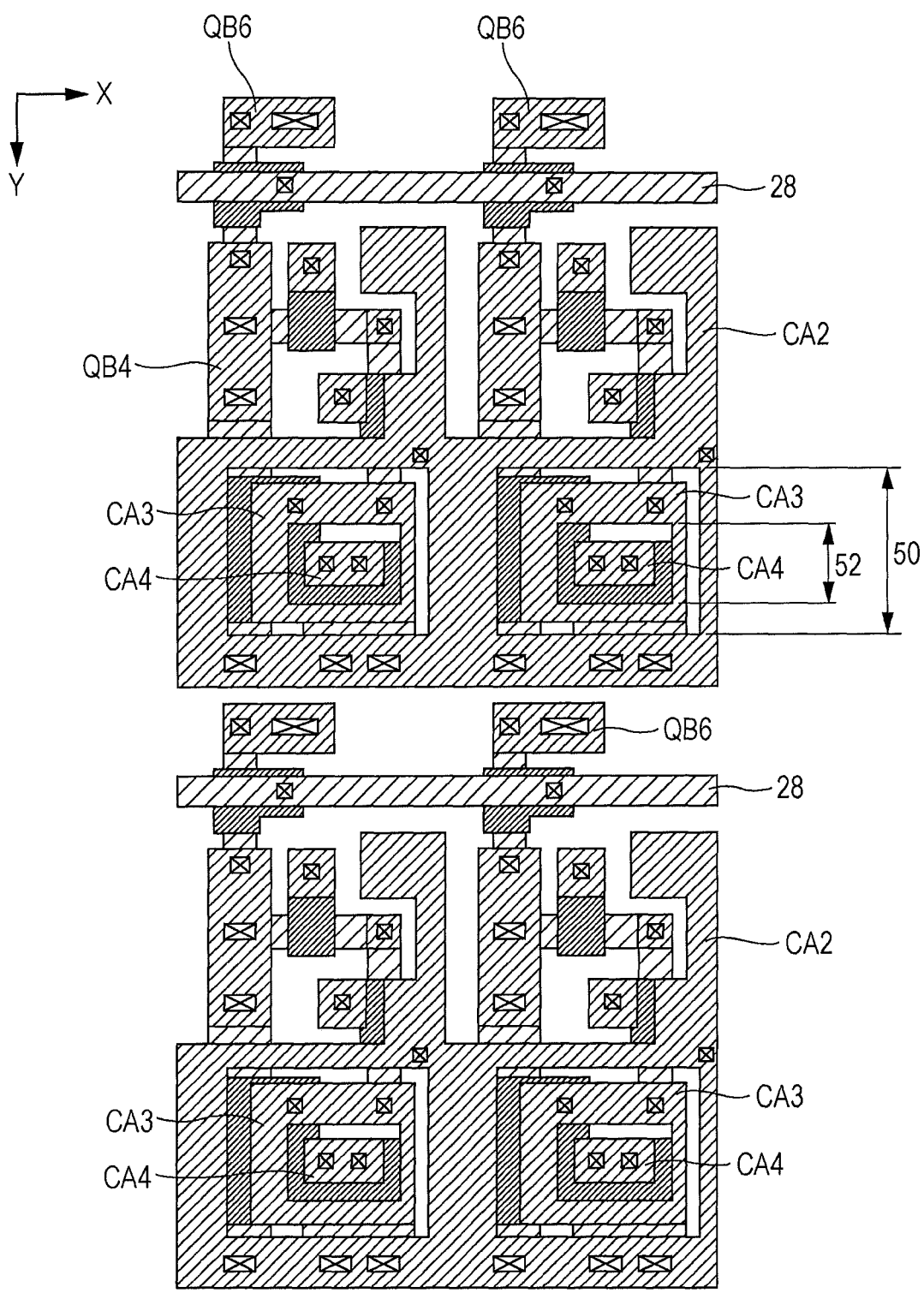
FIG. 29 is an illustrative diagram of each element that is formed on the substrate.
Figure 30:
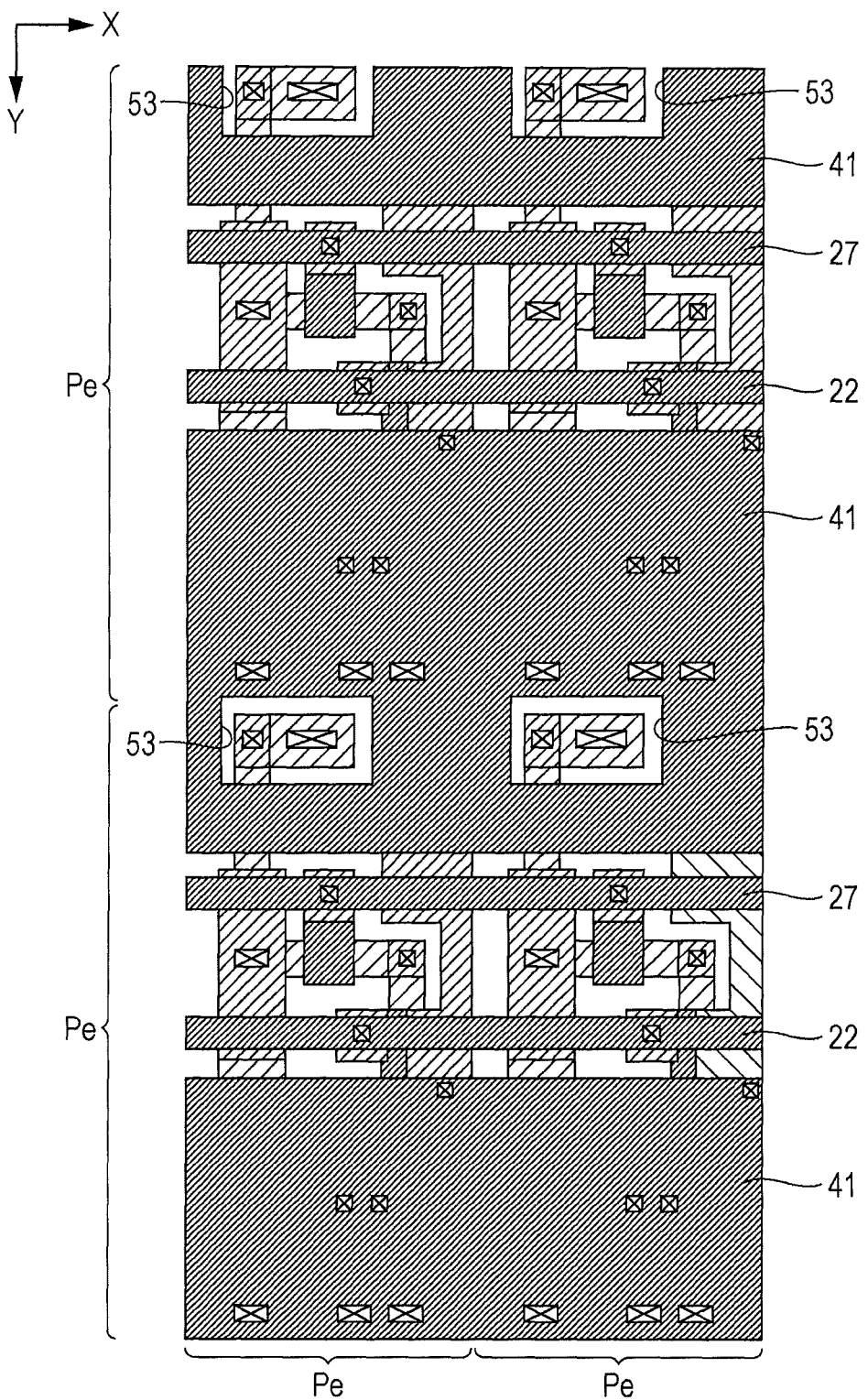
FIG. 30 is an illustrative diagram of each element that is formed on the substrate.
Figure 31:
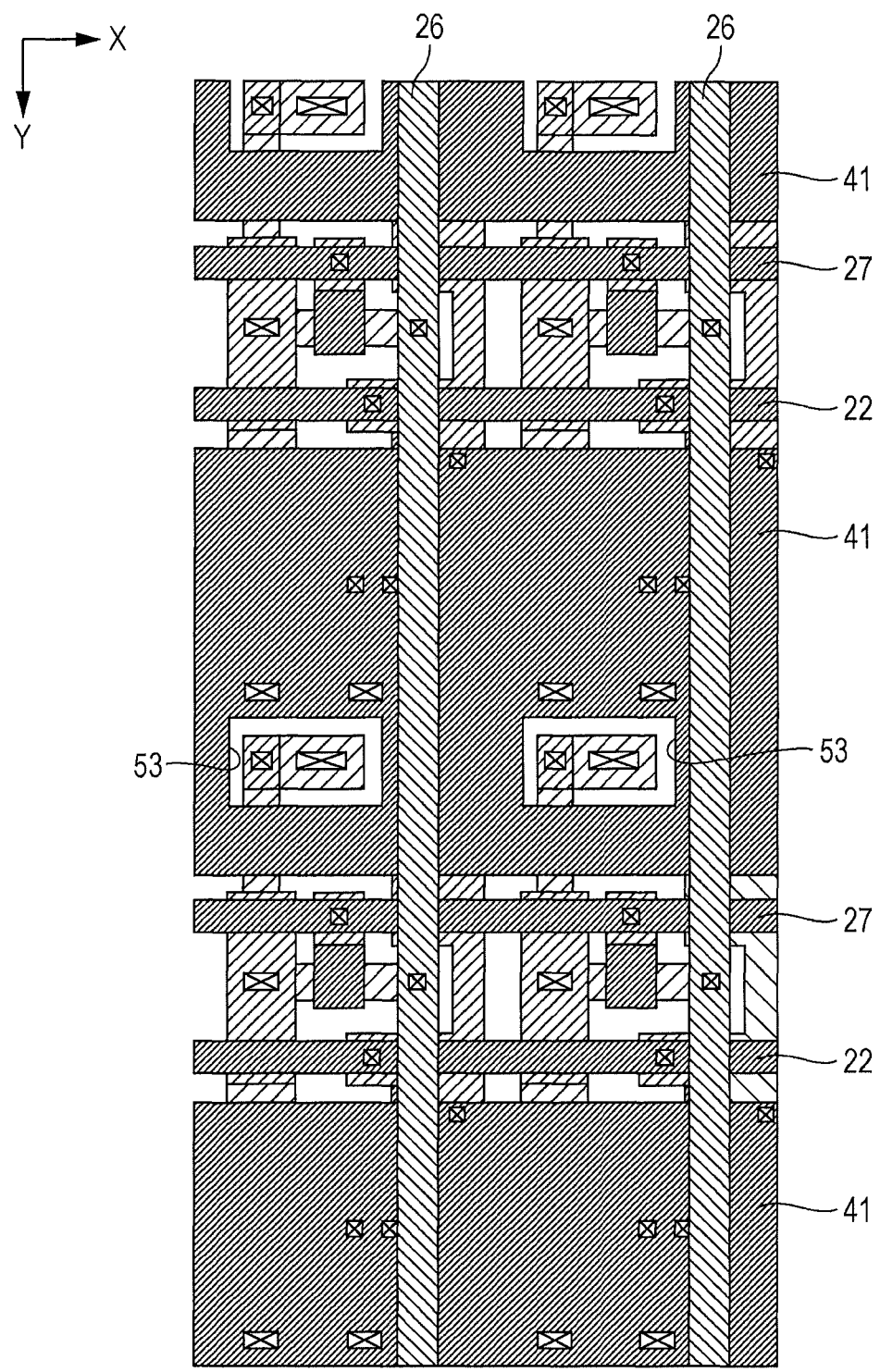
FIG. 31 is an illustrative diagram of each element that is formed on the substrate.

Hereinafter, a specific structure of the organic electroluminescent device 100 of the second embodiment will be described in detail. Further, in each drawing referred to in the following description, a dimension or a scale of each element is different from that in an actual organic electroluminescent device 100 for convenience of description. FIG. 20 is a sectional view of the organic electroluminescent device 100, and FIGS. 21 to 28 are plan views illustrating a state of the surface of the substrate 10 in respective steps of forming respective elements of the organic electroluminescent device 100 for one display pixel Pe. FIGS. 29 to 31 are plan views illustrating a state of the surface of the substrate 10 for four display pixels Pe. A sectional view corresponding to a section including line XX-XX in FIGS. 21 to 28 corresponds to FIG. 20. Further, while FIGS. 21 to 31 are plan views, each element that is the same as that in FIG. 20 is conveniently hatched in the same aspect as that in FIG. 20 from the viewpoint of facilitation of visual recognition of each element.

Figure 21:
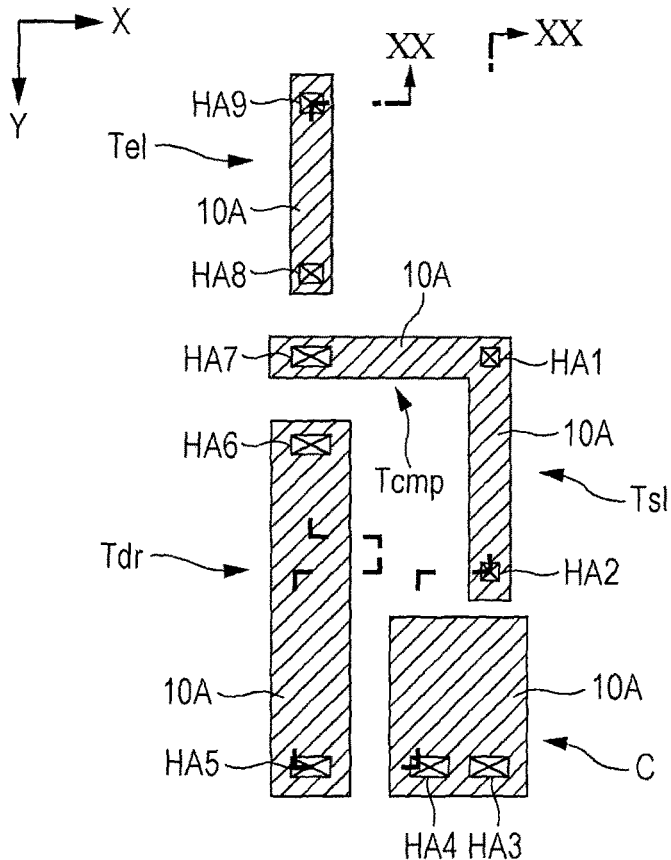
FIG. 21 is an illustrative diagram of each element that is formed on a substrate.
Figure 22:
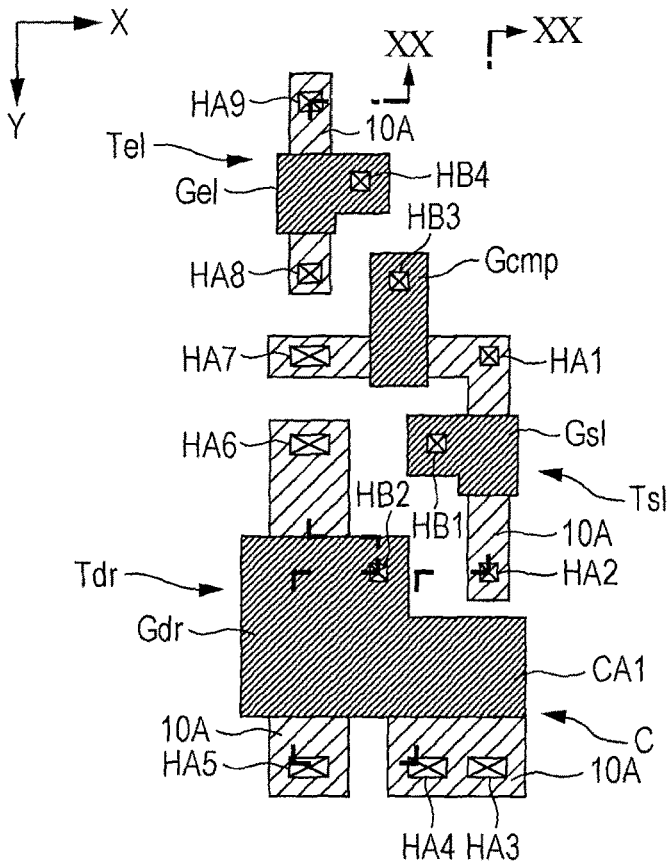
FIG. 22 is an illustrative diagram of each element that is formed on the substrate.

As is understood from FIGS. 20 and 21, an active area 10A (source/drain area) of each transistor T (Tdr, Tsl, Tel, or Tcmp) of the display pixel Pe is formed on a surface of the substrate 10 which is formed of a semiconductor material such as silicon. Ions are implanted into the active area 10A. Each active layer of each transistor T (Tdr, Tsl, Tel, or Tcmp) of the display pixel Pe exists between the source area and the drain area and implanted with different types of ions from those of the active area 10A, but is integrally described as the active area 10A, for convenience. Further, in this embodiment, the active area 10A is also formed in an area constituting the capacitive element C, implanted with impurities, and connected to a power supply. Also, a so-called MOS capacitor in which the active area 10A is used as one electrode and a capacitive electrode formed through an insulating layer used as the other electrode is configured. Further, the active area 10A in the area constituting the capacitive element C also functions as a power supply potential portion. As is understood from FIG. 21, the active area 10A of the compensation transistor Tcmp is connected to the active area 10A of the selection transistor Tsl in a portion in which the conduction hole HA1 has been provided. Therefore, a current terminal of the compensation transistor Tcmp also functions as a current terminal of the selection transistor Tsl. As is understood from FIGS. 20 and 22, the surface of the substrate 10 in which the active area 10A has been formed is covered with an insulating film L0 (gate insulating film), and a gate layer G (Gdr, Gsl, Gel, or Gcmp) of each transistor T is formed on the surface of the insulating film L0. The gate layer G of each transistor T faces the active layer with the insulating film L0 interposed therebetween. Further, as illustrated in FIG. 22, the gate layer Gdr of the driving transistor Tdr is formed to extend to the active area 10A formed in the area constituting the capacitive element C, and constitutes the lower capacitive electrode layer CA1.

As is understood from FIG. 20, a multilayer wiring layer in which a plurality of insulating layers L (LA to LD) and a plurality of conductive layers (wiring layers) are alternately stacked is formed on the surface of the insulating film L0 on which the gate layer G of each transistor T and the lower capacitive electrode layer CA1 have been formed. Each insulating layer L is formed of an insulating inorganic material such as a silicon compound (typically, silicon nitride or silicon oxide). Further, in the following description, a relationship in which a plurality of elements is collectively formed in the same process through selective removal of the conductive layer (single layer or multiple layers) is indicated as "formed from the same layer."

The insulating layer LA is formed on the surface of the insulating film L0 on which the gate G of each transistor T has been formed. As is understood from FIGS. 20 and 23, the upper capacitive electrode layers CA2, CA3, and CA4, the plurality of relay electrodes QB (QB2, QB3, QB4, QB5, and QB6), and the control line 28 of the emission control transistor Tel are formed from the same layer on the surface of the insulating layer LA. As is understood from FIGS. 20 and 23, the upper capacitive electrode layer CA2 is electrically connected to the active area 10A forming the source area or the drain area of the driving transistor Tdr via the conduction hole HA5 penetrating the insulating layer LA and the insulating film L0. The opening 50 is formed in the upper capacitive electrode layer CA2 to surround the area in which a portion of the gate layer Gdr of the driving transistor Tdr and the lower capacitive electrode layer CA1 have been formed in a plan view.

In the opening 50, the upper capacitive electrode layer CA3 and the upper capacitive electrode layer CA4 are formed on the same layer as the upper capacitive electrode layer CA2. An opening 52 is formed in the upper capacitive electrode layer CA3, and the upper capacitive electrode layer CA4 is formed in the opening 52. That is, the upper capacitive electrode layer CA2 and the upper capacitive electrode layer CA3 are formed apart and electrically insulated from each other, and the upper capacitive electrode layer CA3 and the upper capacitive electrode layer CA4 are formed apart and electrically insulated from each other. The upper capacitive electrode layer CA3 also functions as a wiring layer that connects the gate layer Gdr of the driving transistor Tdr to the drain area or the source area of the selection transistor Tsl. That is, as is understood from FIGS. 20, 22 and 23, the upper capacitive electrode layer CA3 is electrically connected to the active area 10A of the selection transistor Tsl via the conduction hole HA2 penetrating the insulating layer LA and the insulating film L0, and is electrically connected to the gate Gdr of the driving transistor Tdr via the conduction hole HB2 of the insulating layer LA.

The relay electrode QB4, the relay electrode QB3, the relay electrode QB5, the relay electrode QB2, and the relay electrode QB6 are formed on the same layer as the upper capacitive electrode layer CA2 in the conduction portion among the driving transistor Tdr, the compensation transistor Tcmp, and the emission control transistor Tel, the conduction portion between the compensation transistor Tcmp and the selection transistor Tsl, the conduction portion of the gate layer Gcmp of the compensation transistor Tcmp, the conduction portion of the gate layer Gsl of the selection transistor Tsl, and the conduction portion between the emission control transistor Tel and the first electrode E1 as the pixel electrode, respectively. Further, the control line 28 is formed on the same layer as the upper capacitive electrode layer CA2 in the conduction portion of the gate layer Gel of the emission control transistor Tel. As is understood from FIGS. 20, 22 and 23, the relay electrodes QB4 is electrically connected to the active area 10A forming the drain area or the source area of the driving transistor Tdr via a conduction hole HA6 penetrating the insulating layer LA and the insulating film L0. Further, the relay electrode QB4 is electrically connected to the active area 10A forming the drain area or the source area of the compensation transistor Tcmp via a conduction hole HA7 penetrating the insulating film L0 and the insulating layer LA. Further, the relay electrode QB4 is electrically connected to the active area 10A forming the drain area or the source area of the emission control transistor Tel via a conduction hole HA8 penetrating the insulating film L0 and the insulating layer LA. Further, the relay electrode QB2 is electrically connected to the gate layer Gsl of the selection transistor Tsl via the conduction hole HB1 penetrating the insulating layer LA. The relay electrode QB3 is electrically connected to the active area 10A forming the source area or the drain area of the selection transistor Tsl and also forming the source area or the drain area of the compensation transistor Tcmp via the conduction hole HA1 penetrating the insulating layer LA and the insulating film L0. The relay electrode QB5 is electrically connected to the gate layer Gcmp of the compensation transistor Tcmp via a conduction hole HB3 penetrating the insulating layer LA. The relay electrode QB6 is electrically connected to the active area 10A forming the drain area or the source area of the emission control transistor Tel via the conduction hole HA9 penetrating the insulating film L0 and the insulating layer LA.

The control line 28 of the emission control transistor Tel is electrically connected to the gate layer Gel of the emission control transistor Tel via a conduction hole HB4 formed in the insulating layer LA. The control line 28 extends in a straight line shape in the X direction over the plurality of the display pixels Pe and is electrically insulated from the gate layer Gcmp of the compensation transistor Tcmp by the insulating layer LA, as is understood from FIG. 29. As is understood from FIG. 23, each of the selection transistor Tsl, the driving transistor Tdr, and the emission control transistor Tel is formed so that its channel length is in the Y direction. Further, the area constituting the capacitive element C is arranged in a position shifted in the X direction (positive side in the X direction in FIG. 6) with respect to the driving transistor Tdr. Further, a conduction place between the gate layer Gsl of the selection transistor Tsl and the relay electrode QB2 is arranged in a position shifted in the X direction (negative side in the X direction in FIG. 6) with respect to the selection transistor Tsl. A conduction place between the gate layer Gcmp of the compensation transistor Tcmp and the relay electrode QB5 is arranged in a position shifted in the Y direction (positive side of the Y direction in FIG. 23) with respect to the compensation transistor Tcmp.

The insulating layer LB is formed on the surface of the insulating layer LA on which the upper capacitive electrode layer CA2, the upper capacitive electrode layer CA3, the upper capacitive electrode layer CA4, the plurality of relay electrodes QB (QB2, QB3, QB4, QB5, and QB6), and the control line 28 have been formed. As is understood from FIGS. 20 and 24, the power supply line layer 41 as a first power supply conductor, the scanning line 22, the control line 27 of the compensation transistor Tcmp, and the plurality of relay electrodes QC (QC1 and QC3) are formed from the same layer on the surface of the insulating layer LB. The power supply line layer 41 is electrically connected to the mounting terminal 36 to which the power supply potential Vel on the high level side is supplied, via a wiring (not illustrated) within the multilayer wiring layer. Further, the power supply line layer 41 is formed in the display area 16 of the first area 12 illustrated in FIG. 1. Further, although not shown, another supply line layer is also formed in the peripheral area 18 of the first area 12. This power supply line layer is electrically connected to the mounting terminal 36 to which the power supply potential Vct on a low level side is supplied, via a wiring (not illustrated) within the multilayer wiring layer. The power supply line layer 41 and the power supply line layer to which the power supply potential Vct on the low level side is supplied are formed of a conductive material containing, for example, silver or aluminum and to a thickness of, for example, about 100 nm.

Figure 24:
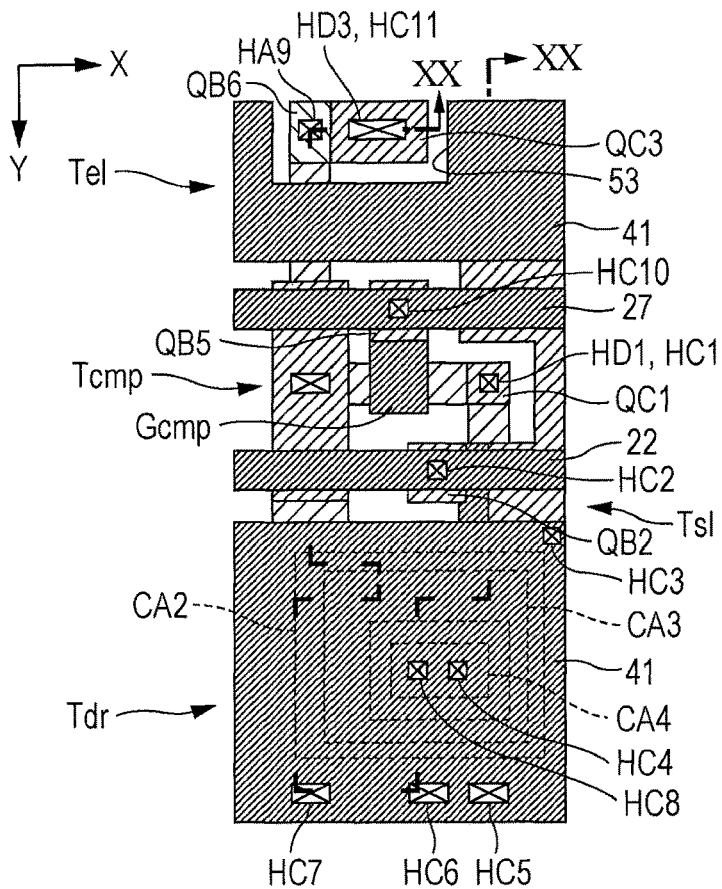
FIG. 24 is an illustrative diagram of each element that is formed on the substrate.

The power supply line layer 41 is a power supply wiring to which the power supply potential Vel on the high level side is supplied as described above, and covers the opening 50 of the upper capacitive electrode layer CA2, and the upper capacitive electrode layer CA2 around the opening 50 in each pixel, as is understood from FIGS. 24 and 30. The power supply line layer 41 is also formed to extend to a position for covering the control line 28 of the emission control transistor Tel of the display pixel Pe adjacent in the Y direction. An opening 53 is formed in a continuous portion of the adjacent display pixel Pe, and is arranged to surround the pixel electrode conduction portion (a conduction portion between the emission control transistor Tel and the relay electrode QC3). Further, the power supply line layer 41 is a pattern formed to be continuous without a gap from the display pixel Pe adjacent in the X direction.

As is understood from FIGS. 20 and 24, the power supply line layer 41 formed in the display area 16 is electrically connected to the upper capacitive electrode layer CA2 via the conduction hole HC3 formed in the insulating layer LB in each display pixel Pe. Further, the power supply line layer 41 is electrically connected to the upper capacitive electrode layer CA2 via the conduction holes HC5 and HC6 formed in the insulating layer LB in each display pixel Pe. Thus, as is understood from FIGS. 20, and 22 to 24, the power supply line layer 41 is electrically connected to the active area 10A formed in an area constituting the capacitive element C via the upper capacitive electrode layer CA2, and the conduction holes HA3 and HA4 penetrating the insulating film L0 and the insulating layer LA. Further, as is understood from FIGS. 20 and 24, the power supply line layer 41 is electrically connected to the upper capacitive electrode layer CA2 via the conduction hole HC7 formed in the insulating layer LB in each display pixel Pe. Thus, as is understood from FIGS. 20, and 22 to 24, the power supply line layer 41 is electrically connected to the active area 10A forming the source area or the drain area of the driving transistor Tdr via the upper capacitive electrode layer CA2, and the conduction hole HC7 penetrating the insulating film L0 and the insulating layer LA. That is, the upper capacitive electrode layer CA2 also functions as a wiring layer that connects the source area or the drain area of the driving transistor Tdr to the power supply line layer 41. As is understood from FIGS. 20 and 24, the power supply line layer 41 is electrically connected to the upper capacitive electrode layer CA4 via the conduction holes HC4 and HC8 formed in the insulating layer LB in each display pixel Pe.

As is understood from FIG. 24, the scanning line 22 is electrically connected to the relay electrode QB2 via the conduction hole HC2 formed in the insulating layer LB in each display pixel Pe. Accordingly, as is understood from FIGS. 22 to 24, the scanning line 22 is electrically connected to the gate layer Gsl of the selection transistor Tsl via the relay electrode QB2 and the conduction hole HB1 penetrating the insulating layer LA. The scanning line 22 extends in a straight line shape in the X direction over the plurality of the display pixels Pe, and is electrically insulated from the upper capacitive electrode layer CA2 and the relay electrode QB4 by the insulating layer LB, as is understood from FIG. 30.

As is understood from FIG. 24, the control line 27 is electrically connected to the relay electrode QB5 via the conduction hole HC10 formed in the insulating layer LB in each display pixel Pe. Accordingly, as is understood from FIGS. 22 to 24, the control line 27 is electrically connected to the gate layer Gcmp of the compensation transistor Tcmp via the relay electrode QB5 and the conduction hole HB3 penetrating the insulating layer LA. The control line 27 extends in a straight line shape in the X direction over the plurality of the display pixels Pe, and is electrically insulated from the upper capacitive electrode layer CA2 and the relay electrode QB4 by the insulating layer LB, as is understood from FIG. 30.

Figure 23:
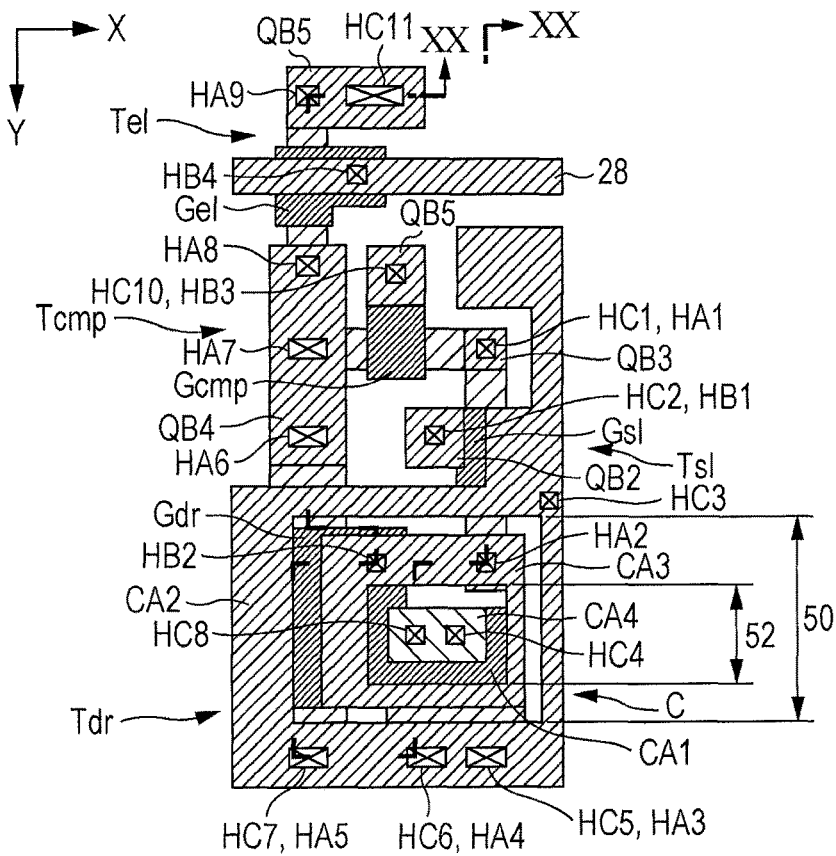
FIG. 23 is an illustrative diagram of each element that is formed on the substrate.

As is understood from FIG. 23, the relay electrode QC3 is electrically connected to the relay electrode QB6 via the conduction hole HC11 formed in the insulating layer LB in each display pixel Pe. Thus, as is understood from FIGS. 21 to 23, the relay electrode QC3 is electrically connected to the active area 10A of the emission control transistor Tel via the relay electrode QB6 and the conduction hole HA9 penetrating the insulating film L0 and the insulating layer LA.

As is understood from FIG. 24, the relay electrode QC1 is electrically connected to the relay electrode QB3 via the conduction hole HC1 formed in the insulating layer LB in each display pixel Pe. Thus, as is understood from FIGS. 22 to 24, the relay electrode QC1 is electrically connected to the active area 10A forming the drain area or the source area of the selection transistor Tsl and the compensation transistor Tcmp via the relay electrode QB3, and the conduction hole HA1 penetrating the insulating film L0 and the insulating layer LA.

The insulating layer LC is formed on the surface of the insulating layer LB on which the power supply line layer 41, the scanning line 22, the control line 27, and the relay electrode QC1 and QC3 have been formed. As is understood from FIGS. 20 and 25, the signal line 26 and the relay electrode QD2 are formed from the same layer on the surface of the insulating layer LC. The signal line 26 extends in a straight line shape in the Y direction over the plurality of pixels P, and is electrically insulated from the scanning line 22, the control line 27, and the power supply line layer 41 by the insulating layer LC. Specifically, the signal line 26 is electrically connected to the relay electrode QC1 via the conduction hole HD1 formed in the insulating layer LC in each display pixel Pe, as is understood from FIGS. 24 and 25. Thus, as is understood from FIGS. 22 to 25, the signal line 26 is electrically connected to the active area 10A to which the selection transistor Tsl and the compensation transistor Tcmp are connected via the relay electrode QC1, the conduction hole HC1 penetrating the insulating layer LB, the relay electrode QB3, and the conduction hole HA1 penetrating the insulating film L0 and the insulating layer LA. Further, the signal line 26 is formed to pass through positions in a layer over the relay electrode QC1, the scanning line 22, the control line 27, and the power supply line layer 41, extends in a direction (Y direction) of the channel length of the selection transistor Tsl, and overlaps the selection transistor Tsl via the scanning line 22, the control line 27, and the power supply line layer 41 in a plan view.

Figure 25:
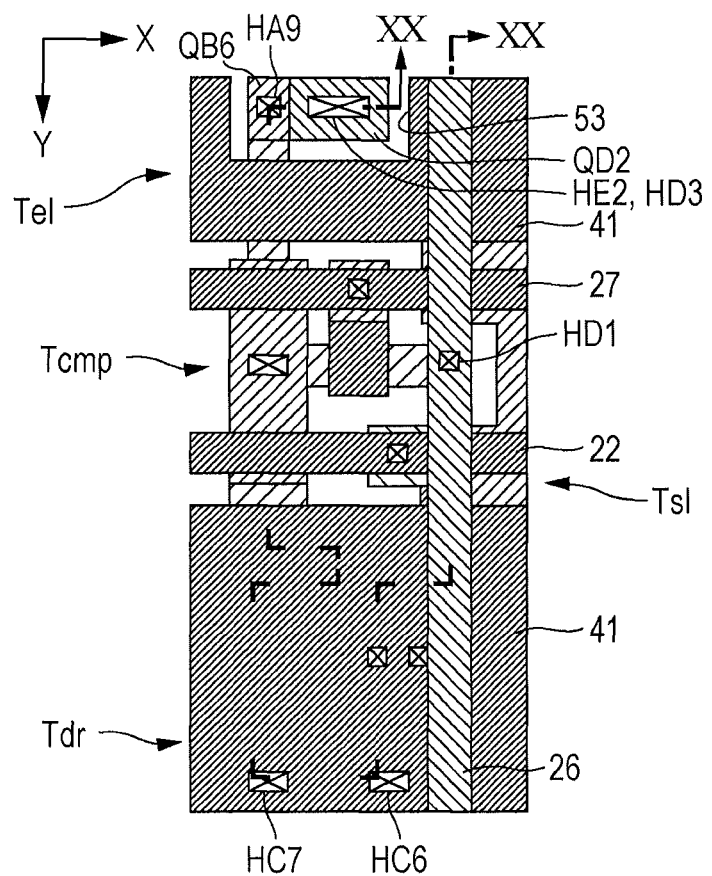
FIG. 25 is an illustrative diagram of each element that is formed on the substrate.

As is understood from FIG. 25, the relay electrode QD2 is electrically connected to the relay electrode QC3 via a conduction hole HD3 formed in the insulating layer LC in each display pixel Pe. Thus, as is understood from FIGS. 22 to 25, the relay electrode QD2 is electrically connected to the active area 10A forming the drain area or the source area of the emission control transistor Tel via the conduction hole HD3 formed in the insulating layer LC, the relay electrode QC3, the conduction hole HC11 formed in the insulating layer LB, the relay electrode QB6, and the conduction hole HA9 penetrating the insulating film L0 and the insulating layer LA.

As illustrated in FIG. 20, the insulating layer LD is formed on the surface of the insulating layer LC on which the signal line 26 and the relay electrode QD2 have been formed. While the above description has been focused on the display pixel Pe, the structure of the respective elements from the surface of the substrate 10 to the insulating layer LD is also common to the dummy pixel Pd in the peripheral area 18.

Figure 26:
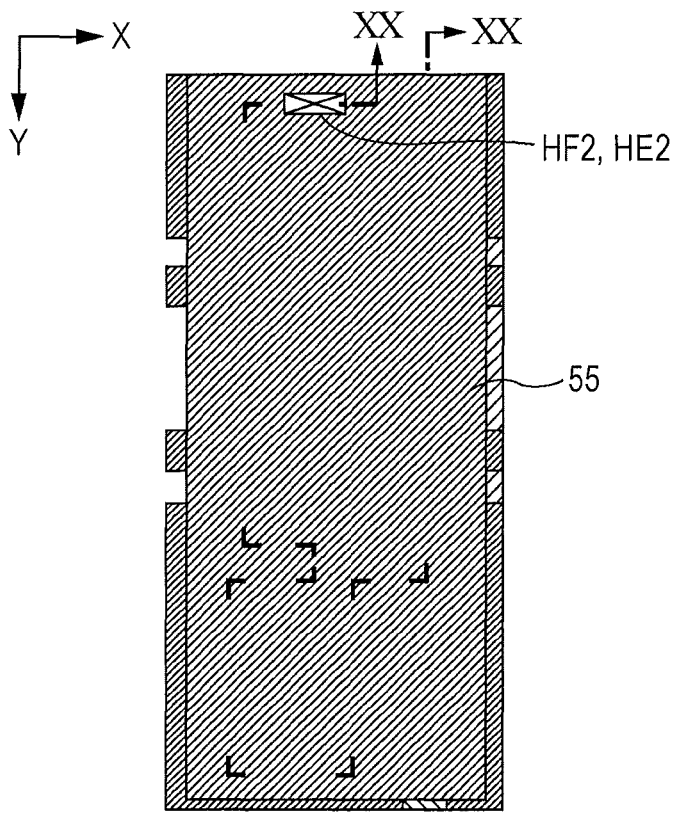
FIG. 26 is an illustrative diagram of each element that is formed on the substrate.

A planarization process is executed for the surface of the insulating layer LD. In the planarization process, a known surface processing technology such as chemical mechanical polishing (CMP) is optionally adopted. The reflective layer 55 is formed on a surface of the insulating layer LD highly planarized in the planarization process, as illustrated in FIGS. 20 and 26. The reflective layer 55 is formed of an optically reflecting conductive material containing, for example, silver or aluminum and to a film thickness of, for example, about 100 nm. The reflective layer 55 may be formed of an optically reflecting conductive material, and is arranged to cover each transistor T, each wiring, and each relay electrode, as illustrated in FIG. 26. Therefore, there is an advantage in that the intrusion of external light can be prevented by the reflective layer 55, and the leakage of a current of each transistor T caused by light irradiation can be prevented.

As is understood from FIGS. 20 and 26, the reflective layer 55 is electrically connected to the relay electrode QD2 via the conduction hole HE2 formed in the insulating layer LD in each display pixel Pe. Thus, as is understood from FIGS. 22 to 26, the reflective layer 55 is electrically connected to the active area 10A forming the drain area or the source area of the emission control transistor Tel via the conduction hole HE2 penetrating the insulating layer LD, the relay electrode QD2, the conduction hole HD3 penetrating the insulating layer LC, the relay electrode QC3, the conduction hole HC11 penetrating the insulating layer LB, the relay electrode QB6, and the conduction hole HA9 penetrating the insulating film L0 and the insulating layer LA.

As illustrated in FIG. 20, the optical path adjustment layer 60 is formed on the surface of the insulating layer LD on which the reflective layer 55 has been formed. The optical path adjustment layer 60 is a light transmissive film body that defines a resonance wavelength (that is, display color) of the resonant structure of each display pixel Pe. In the pixels having the same display colors, the resonance wavelengths of the resonant structures are substantially the same, and the resonance wavelengths of the resonant structures are set to be different from each other in the pixels having different display colors.

Figure 27:
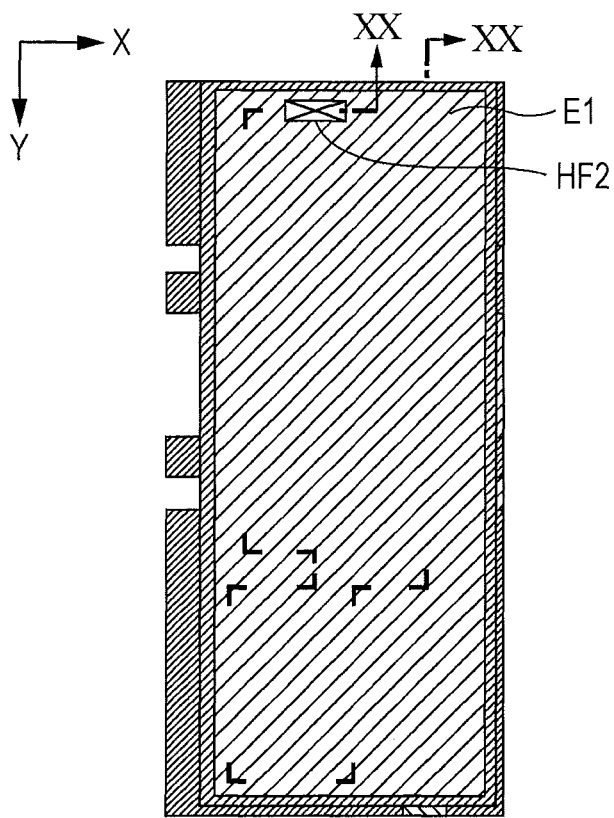
FIG. 27 is an illustrative diagram of each element that is formed on the substrate.

As illustrated in FIGS. 20 and 27, the first electrode E1 of each display pixel Pe in the display area 16 is formed on a surface of the optical path adjustment layer 60. The first electrode E1 is formed of a light transmissive conductive material such as ITO (Indium Tin Oxide). The first electrode E1 is a substantially rectangular electrode (pixel electrode) functioning as a positive electrode of the light emitting element 45, as described above with reference to FIG. 2. The first electrode E1 is electrically connected to the reflective layer 55 via the conduction hole HF2 formed in the optical path adjustment layer 60 in each display pixel Pe. Thus, as is understood from FIGS. 22 to 27, the first electrode E1 is electrically connected to the active area 10A forming the drain area or the source area of the emission control transistor Tel via the conduction hole HF2 penetrating the optical path adjustment layer 60, the reflective layer 55, the conduction hole HE2 penetrating the insulating layer LD, the relay electrode QD2, the conduction hole HD3 penetrating the insulating layer LC, the relay electrode QC3, the conduction hole HC11 penetrating the insulating layer LB, the relay electrode QB6, and the conduction hole HA9 penetrating the insulating film L0 and the insulating layer LA.

Figure 28:
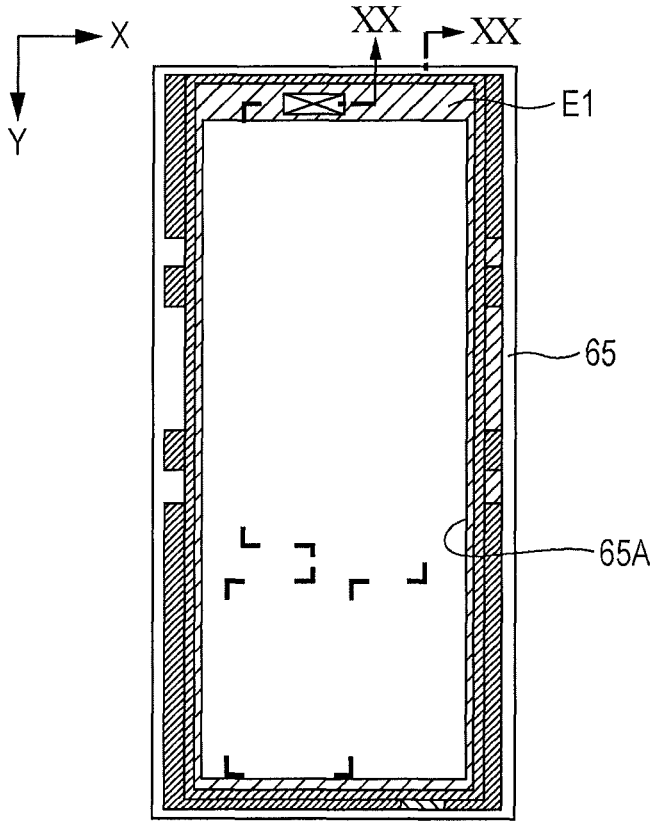
FIG. 28 is an illustrative diagram of each element that is formed on the substrate.

The pixel definition layer 65 is formed over the entire area of the substrate 10 on the surface of the optical path adjustment layer 60 on which the first electrode E1 has been formed, as illustrated in FIGS. 20 and 28. The pixel definition layer 65 is formed of an insulating inorganic material such as a silicon compound (typically, silicon nitride or silicon oxide). As is understood from FIG. 28, the opening 65A corresponding to each of the first electrodes E1 in the display area 16 is formed in the pixel definition layer 65. An area near an inner periphery of the opening 65A in the pixel definition layer 65 overlaps the periphery of the first electrode E1. That is, the inner periphery of the opening 65A is located on an inner side of the periphery of the first electrode E1 in a plan view. The respective openings 65A are the same in a plan shape (rectangular shape) or a size, and are arranged in a matrix shape with the same pitch in each of X and Y directions. As is understood from the above description, the pixel definition layer 65 is formed in a grid shape in a plan view. Further, the plan shapes or the sizes of the openings 65A may be the same as one another when the display colors are the same as one another and may be different from one another when the display colors are different from one another. Further, the pitches of the openings 65A are the same as one another when the display colors are the same as one another, and may be different from one another when the display colors are different from one another.

Further, although a detailed description is omitted, the light emitting function layer 46, the second electrode E2, and the sealing body 47 are stacked on the layer over the first electrode E1, and a sealing substrate (not illustrated) is bonded to a surface of the substrate 10 in which the respective elements have been formed, for example, using an adhesive. The sealing substrate is a light transmissive plate-shaped member (for example, a glass substrate) for protecting each element on the substrate 10. Further, a color filter can also be formed on the surface of the sealing substrate or the surface of the sealing body 47 for each display pixel Pe.

As described above, in the second embodiment, the emission control transistor Tel as the fourth transistor that controls the connection state between the driving transistor Tdr as the first transistor and the light emitting element 45, and the control line 28 of the emission control transistor Tel as the third control line are included. The control line 28 is formed between the power supply line layer 41 and the gate layer Gel. Therefore, with the shielding effect of the power supply line layer 41, it is possible to suppress the influence on the control line 28 and the gate layer Gel of the signal line 26 or the like arranged on a layer over the power supply line layer 41. With the shielding effect of the power supply line layer 41, it is also possible to suppress the influence of the control line 28 and the gate layer Gel on the signal line 26. Further, as is understood from FIGS. 29 and 30, the power supply line layer 41 covers the control line 28 and the gate layer Gel with a pattern that is continuous without a gap in the X direction, and accordingly, also functions as a light shielding portion that shields light to the emission control transistor Tel. Further, since the signal line 26 is arranged to overlap the selection transistor Tsl in the plan view as is understood from FIG. 25, there is an advantage in that the pixel can be miniaturized.

Further, in the second embodiment, the power supply line layer 41 is formed to extend to a position for covering the control line 28 of the emission control transistor Tel and the emission control transistor Tel of the display pixel Pe adjacent in the Y direction, and arranged to surround the pixel conduction portion using an opening 53, as is understood from FIG. 30. Therefore, a high shielding effect for the pixel conduction portion is exhibited, and a good shielding effect for the driving transistor Tdr and the emission control transistor Tel is exhibited.

Further, in the second embodiment, the compensation transistor Tcmp as a third transistor that controls a connection state between the active area 10A forming a source area or a drain area that is a second current terminal and the gate of the driving transistor Tdr, and a control line 27 of the compensation transistor Tcmp as a second control line are included, and the control line 27 is formed as the same layer as the power supply line layer 41. Therefore, it is possible to achieve simplification of a process.

As is understood from FIGS. 20 to 27, the conduction portion between the first electrode E1 that is a pixel electrode and the source area or the drain area of the emission control transistor Tel, that is, the pixel conduction portion includes the conduction hole HA9 penetrating the insulating film L0 and the insulating layer LA, the relay electrode QB6, the conduction hole HC11 penetrating the insulating layer LB, the relay electrode QC3, the conduction hole HD3 penetrating the insulating layer LC, the relay electrode QD2, HE2 penetrating the insulating layer LD, and the conduction hole HF2 penetrating the optical path adjustment layer 60. These function as a source wiring or a drain wiring of the emission control transistor Tel. That is, the conduction portion between the first electrode E1 and the source area or the drain area of the emission control transistor Tel includes the source wiring or the drain wiring of the emission control transistor Tel provided through the layer on which the upper capacitive electrode layer CA2 or the like has been formed, and the layer on which the power supply line layer 41 or the like has been formed. Therefore, the source area or the drain area of the emission control transistor Tel can be connected to the first electrode E1 that is the pixel electrode with less resistance as compared to a case in which the pixel electrode extends to the layer of the source area or the drain area of the emission control transistor Tel to achieve the conduction.

The conduction portion between the gate of the compensation transistor Tcmp and the control line 27 is arranged to be shifted in the Y direction with respect to the gate of the compensation transistor Tcmp, as is understood from FIGS. 23 and 24. Therefore, the signal line 26 can be arranged on a layer immediately over the layer on which the control line 27 has been formed without stacking an extra layer. Further, the conduction portion between the gate of the compensation transistor Tcmp and the control line 27 may be arranged to overlap the compensation transistor Tcmp in a plan view, and a conduction portion among the selection transistor Tsl, the compensation transistor Tcmp, and the signal line 26 may be shifted in a direction of the channel length of the compensation transistor Tcmp in a plan view.

As is understood from FIG. 25, since the signal line 26 is arranged to overlap the compensation transistor Tcmp in a plan view, there is an advantage in that the pixel can be miniaturized. Further, since a conduction portion between the signal line 26 and the compensation transistor Tcmp can be arranged immediately under the signal line 26, conduction between the signal line 26 and the compensation transistor Tcmp can be achieved with less resistance using the conduction hole penetrating the insulating layer, or the relay electrode. As a result, capability of writing to the compensation transistor Tcmp using the signal line 26 is improved.

The upper capacitive electrode layer CA2 is configured to be arranged between the scanning line 22 or the control line 27 and the gate potential portion of the driving transistor Tdr. Further, the power supply line layer 41 is configured to be arranged between the scanning line 22 or the control line 27 and the gate potential portion of the driving transistor Tdr. Therefore, coupling between the scanning line 22 or the control line 27 and the gate potential portion of the driving transistor Tdr is suppressed.

The upper capacitive electrode layer CA2 is configured to be arranged between the conduction portion connecting the signal line 26 to the selection transistor Tsl and the gate potential portion of the driving transistor Tdr. Further, the power supply line layer 41 is configured to be arranged between the conduction portion connecting the signal line 26 to the selection transistor Tsl and the gate potential portion of the driving transistor Tdr. Therefore, coupling between the conduction portion connecting the signal line 26 to the selection transistor Tsl and the gate potential portion of the driving transistor Tdr is suppressed.

Further, with the same configuration as that in the first embodiment, it is possible to achieve the same effects as in the first embodiment described above. Further, in the second embodiment, the same modification example as that described in the first embodiment is also applicable. For example, the electrode constituting the capacitive element may be an electrode formed of a layer different from the power supply line layer 41.

Third Embodiment

A third embodiment of the invention will be described. Further, in each form to be illustrated below, elements having the same operation or function as in the first embodiment and the second embodiment are denoted with the signs referred to in the description of the first and second embodiments, and each detailed description will be appropriately omitted.

A circuit of each display pixel Pe of the third embodiment is the same as the circuit of the second embodiment, and includes a compensation transistor Tcmp and an emission control transistor Tel. A specific structure of the organic electroluminescent device 100 according to the third embodiment is substantially the same structure as the specific structure of the organic electroluminescent device 100 of the second embodiment. Hereinafter, only a difference will be described for simplification.

Figure 32:
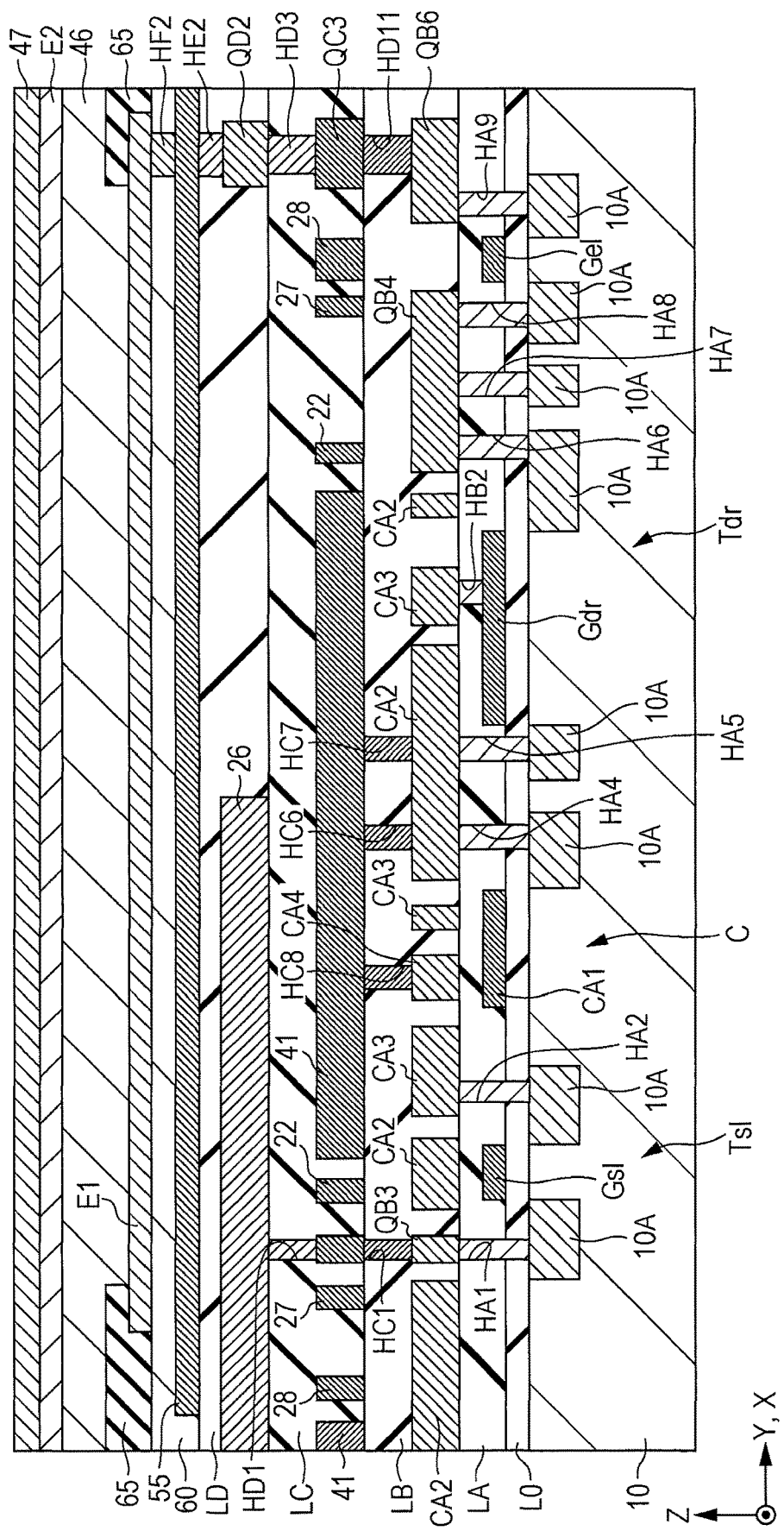
FIG. 32 is a sectional view of a light emitting device according to a third embodiment of the invention.
Figure 33:
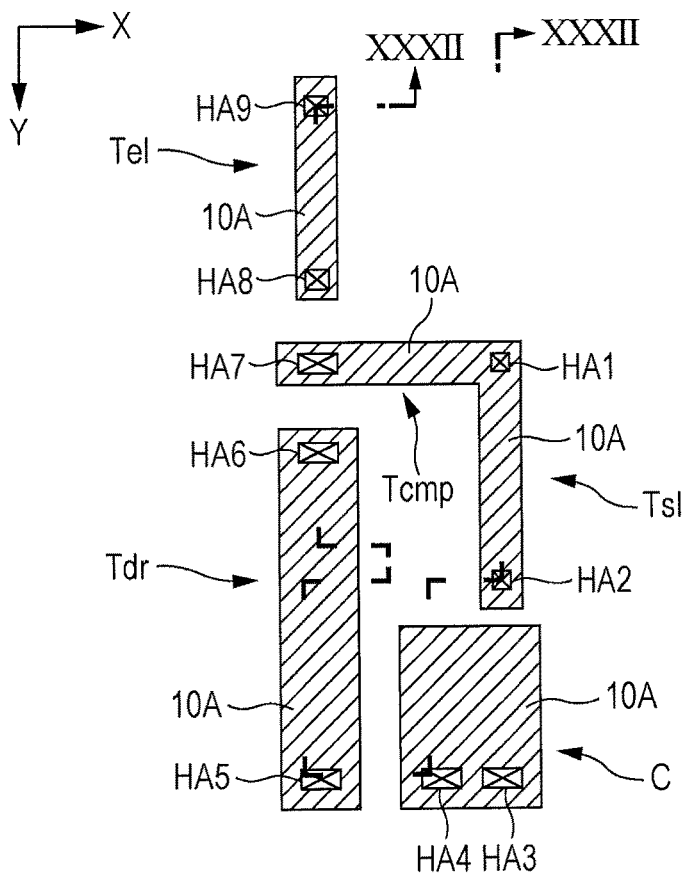
FIG. 33 is an illustrative diagram of each element that is formed on a substrate.
Figure 34:
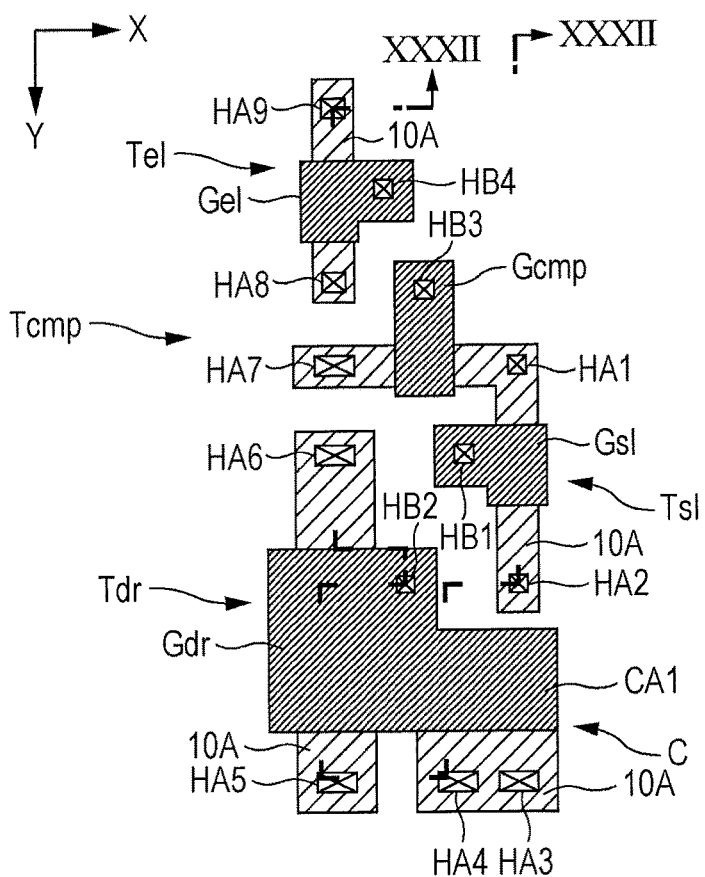
FIG. 34 is an illustrative diagram of each element that is formed on the substrate.
Figure 41:
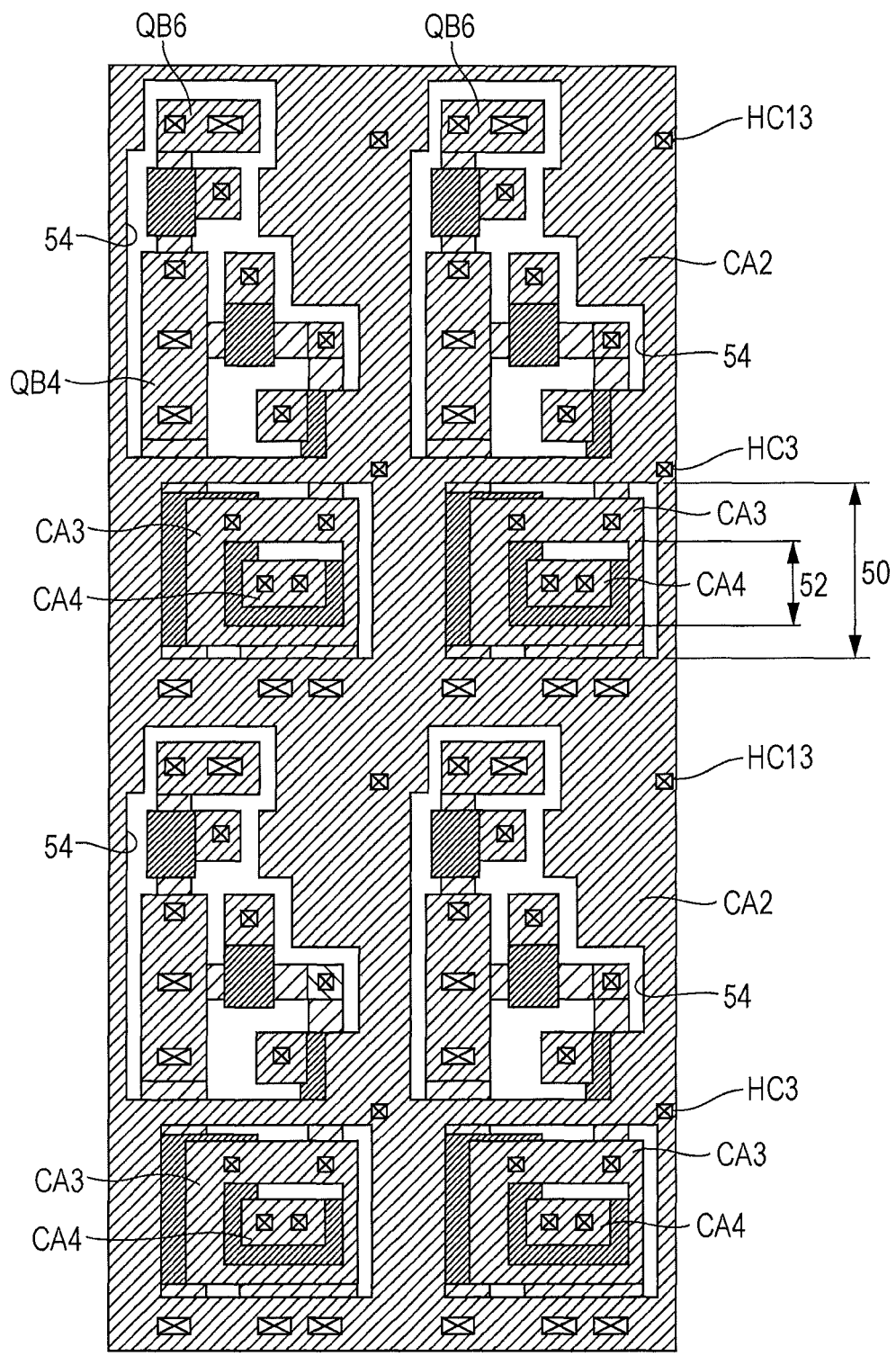
FIG. 41 is an illustrative diagram of each element that is formed on the substrate.
Figure 42:
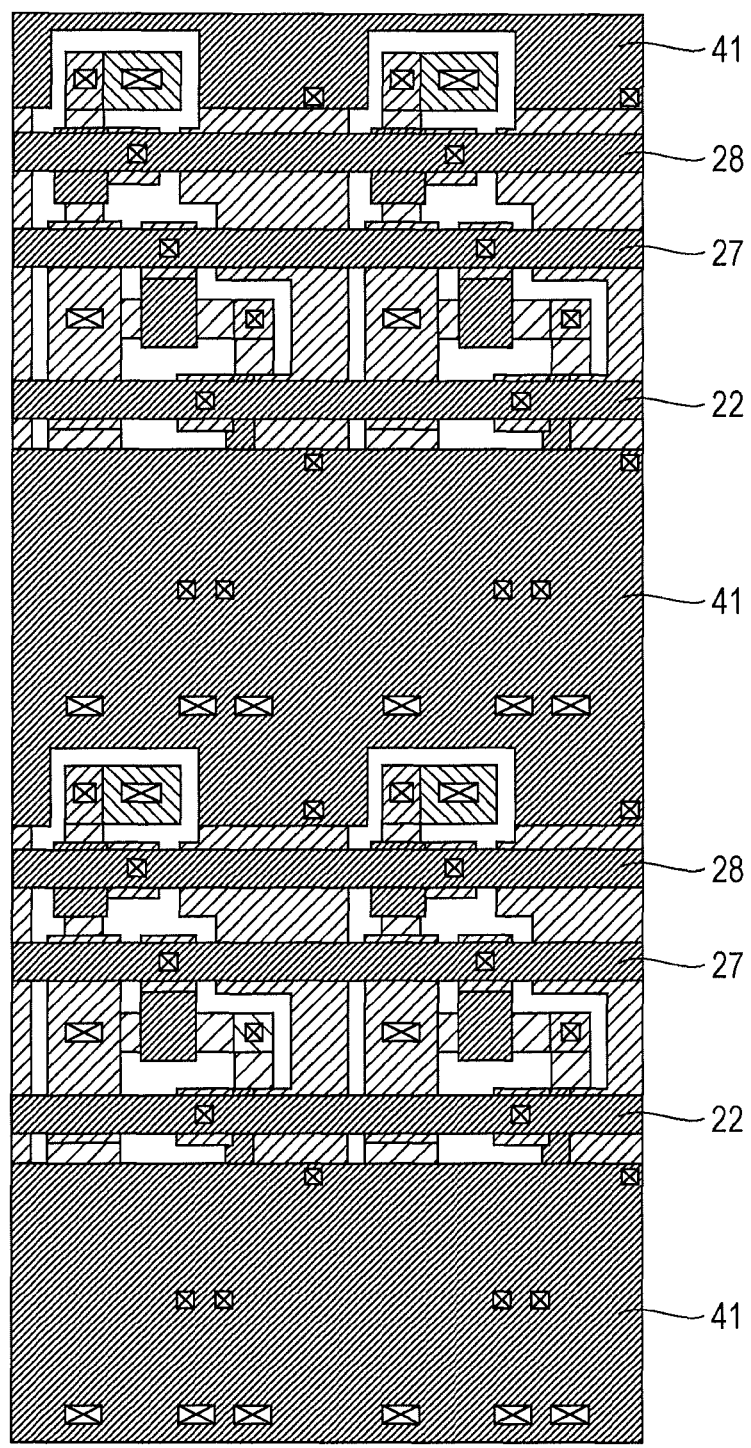
FIG. 42 is an illustrative diagram of each element that is formed on the substrate.
Figure 43:
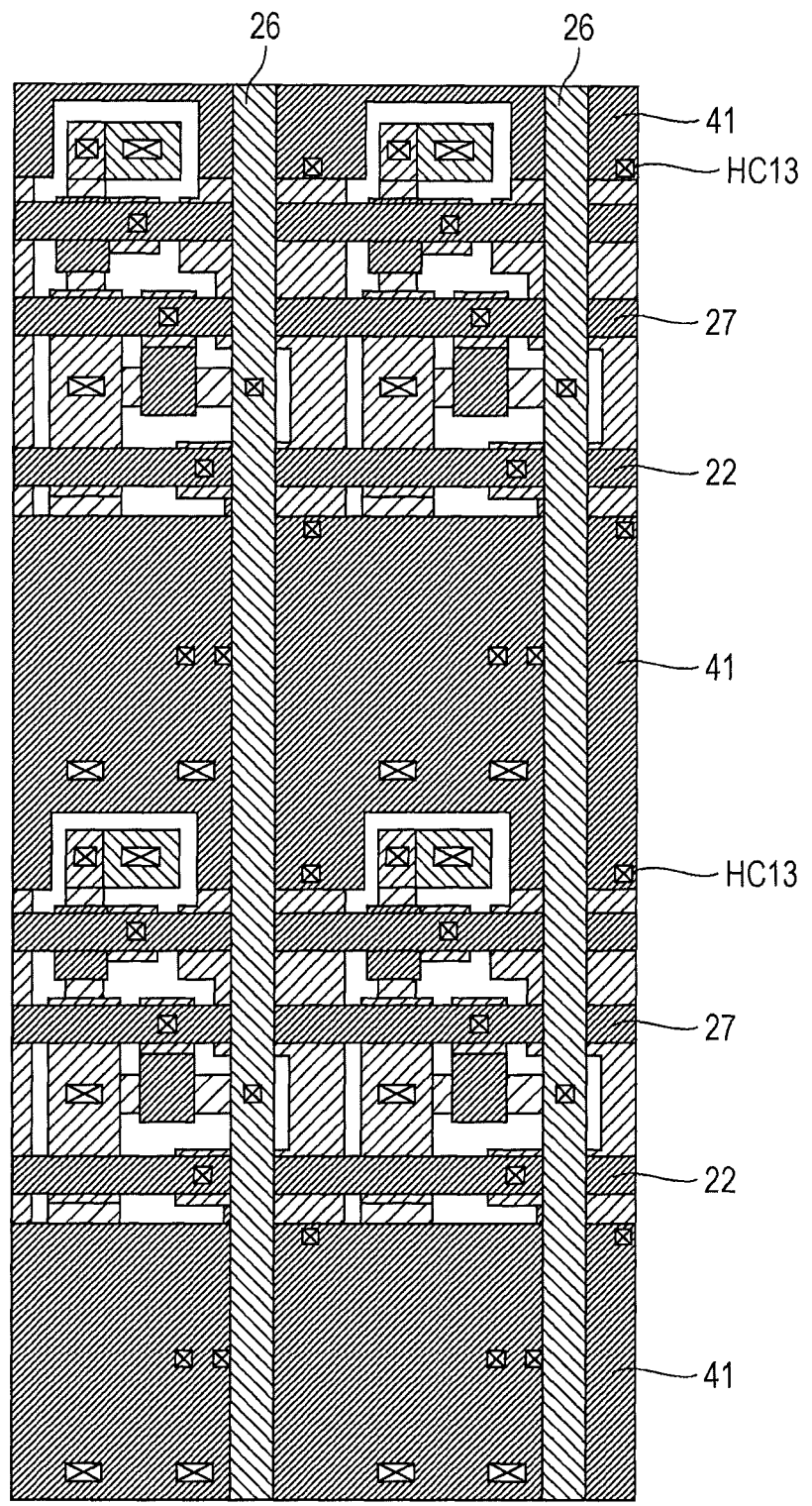
FIG. 43 is an illustrative diagram of each element that is formed on the substrate.

FIG. 32 is a sectional view of the organic electroluminescent device 100, and FIGS. 33 to 40 are plan views illustrating a state of the surface of the substrate 10 in respective steps of forming respective elements of the organic electroluminescent device 100 for one display pixel Pe. FIGS. 41 to 43 are plan views illustrating a state of the surface of the substrate 10 for four display pixels Pe. A sectional view corresponding to a section including a line XXXII-XXXII in FIGS. 33 to 40 corresponds to FIG. 32. Further, while FIGS. 33 to 43 are plan views, each element that is the same as that in FIG. 32 is conveniently hatched in the same aspect as that in FIG. 32 from the viewpoint of facilitation of visual recognition of each element.

Figure 35:
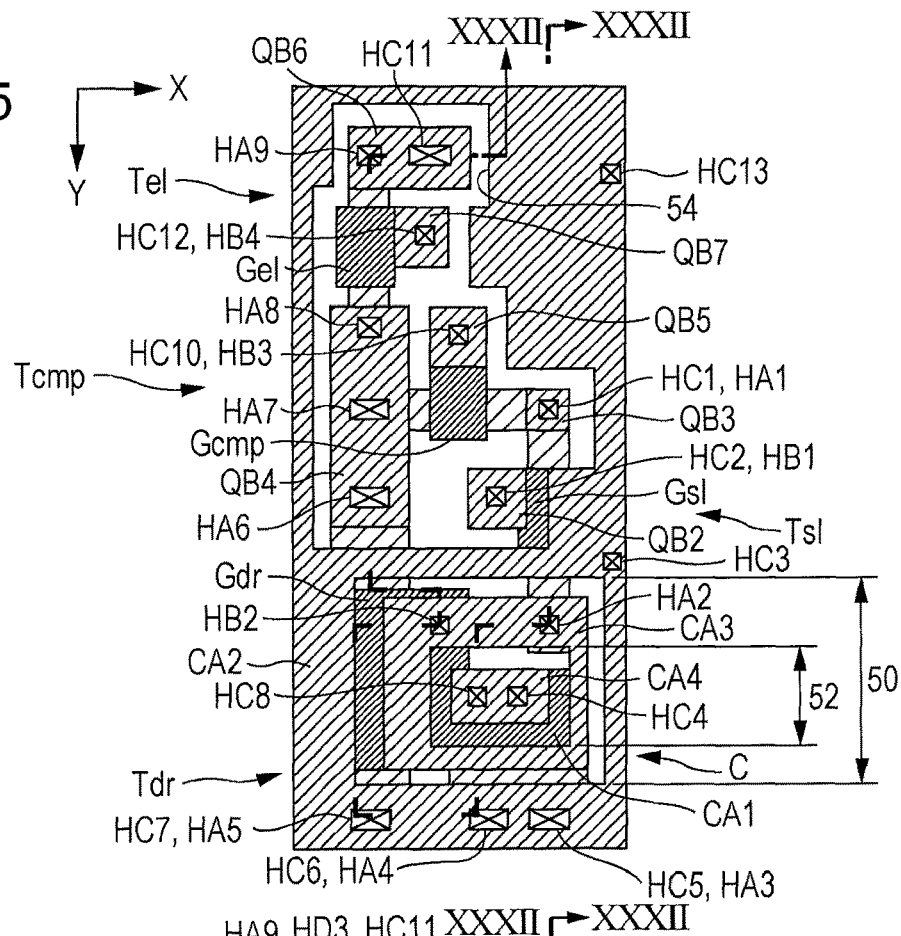
FIG. 35 is an illustrative diagram of each element that is formed on the substrate.

In the third embodiment, as is understood from FIGS. 35 and 41, the upper capacitive electrode layer CA2 is arranged to not only surround a formation portion of a portion of the gate conduction portion of the driving transistor Tdr and a portion of the capacitive element C with the opening 50, but also surround the selection transistor Tsl, the compensation transistor Tcmp, the emission control transistor Tel, the conduction portion of the driving transistor Tdr, and the compensation transistor Tcmp, and the emission control transistor Tel, and the pixel conduction portion electrically connected to the source area or the drain area of the emission control transistor Tel with the opening 54. As is understood from FIG. 41, the upper capacitive electrode layer CA2 is a pattern that is continuous without a gap from the display pixels Pe adjacent in X and Y directions. Conduction between the upper capacitive electrode layer CA2 and the power supply line layer 41 is achieved by not only the conduction hole HC3 penetrating the insulating layer LB, but also the conduction hole HC13 penetrating the same insulating layer LB, unlike the second embodiment. Therefore, the power supply line layer 41 and the upper capacitive electrode layer CA2 can be electrically connected in a grid shape as compared to a case of only the power supply line layer 41. Therefore, with this configuration, it is possible to stably supply the power supply potential Vel on the high level side to the display pixel Pe. Further, it is possible to reduce influence between the display pixels Pe adjacent in X and Y directions on each transistor and the pixel conduction portion due to a shielding effect of the upper capacitive electrode layer CA2. The upper capacitive electrode layer CA2 is arranged in a position overlapping a gap from the reflective layer 55 of the display pixels Pe adjacent in X and Y directions in a plan view. Therefore, light shielding properties for each transistor are improved. In other words, since an end portion of the reflective layer 55 is arranged to overlap the upper capacitive electrode layer CA2 or the power supply line layer 41, the light transmitted through the adjacent reflective layer 55 is shielded by the upper capacitive electrode layer CA2 or the power supply line layer 41. Thus, a structure which it is difficult for light to reach the transistor T is achieved.

Figure 36:
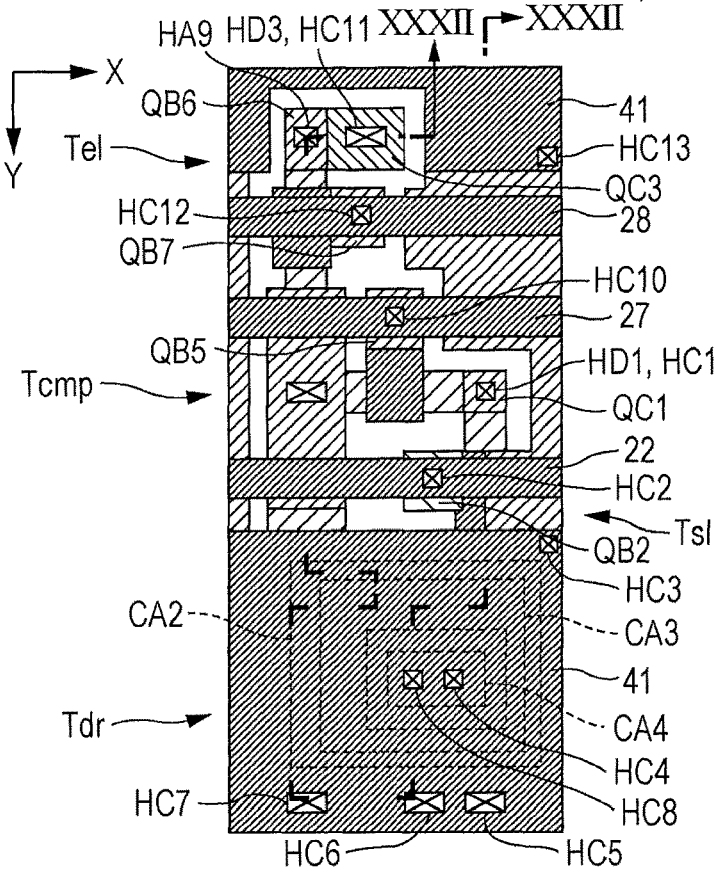
FIG. 36 is an illustrative diagram of each element that is formed on the substrate.
Figure 37:
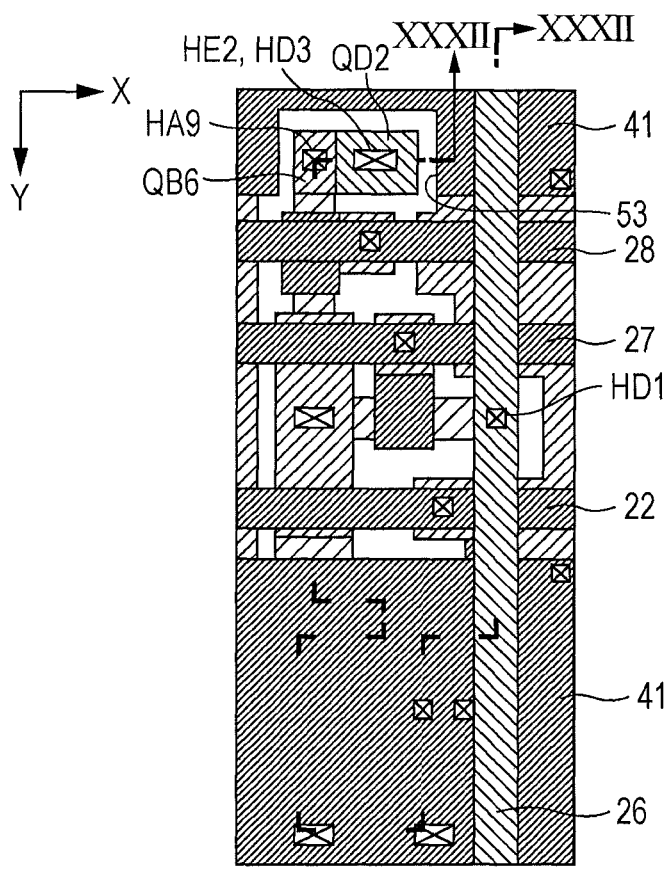
FIG. 37 is an illustrative diagram of each element that is formed on the substrate.
Figure 38:
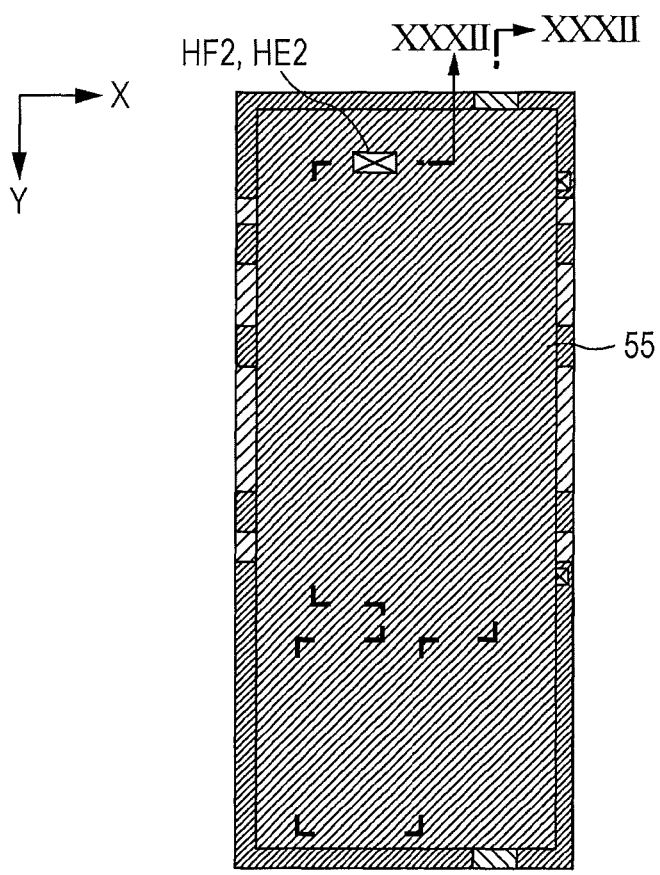
FIG. 38 is an illustrative diagram of each element that is formed on the substrate.
Figure 39:
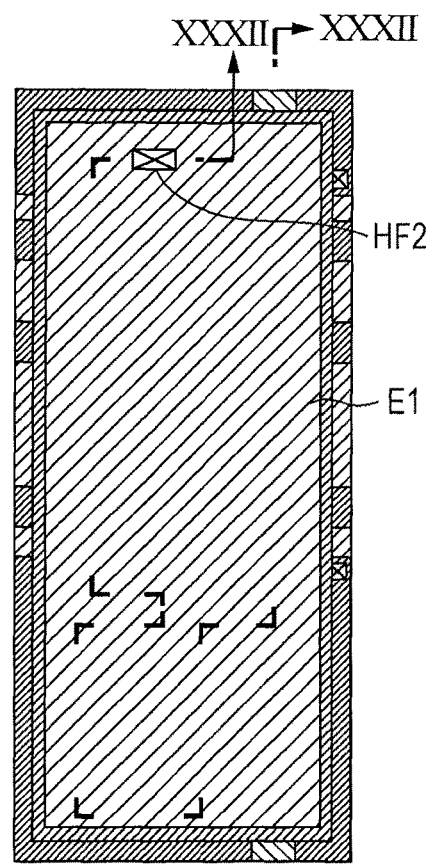
FIG. 39 is an illustrative diagram of each element that is formed on the substrate.
Figure 40:
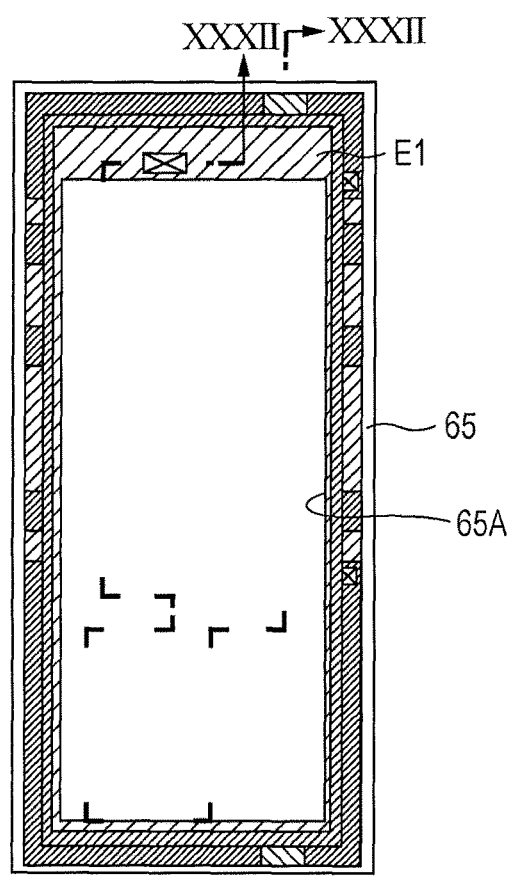
FIG. 40 is an illustrative diagram of each element that is formed on the substrate.

In the third embodiment, the control line 28 of the emission control transistor Tel is formed on the same layer as the control line 27 of the compensation transistor Tcmp, the scanning line 22, and the power supply line layer 41, as is understood from FIG. 36. Therefore, a process can be simplified as compared to the second embodiment. As is understood from FIGS. 33 to 37, the control line 28 of the emission control transistor Tel is electrically connected to the gate layer Gel of the emission control transistor Tel via the conduction hole HB4 formed in the insulating layer LA, the conduction portion QB7, and the HC12 formed in the insulating layer LB. As is understood from FIG. 41, the power supply line layer 41 is formed to be continuous without a gap from the display pixel Pe adjacent in the Y direction and to extend to a position for surrounding the pixel conduction portion in the display pixel Pe adjacent in the Y direction, as in the second embodiment. However, four sides of the pixel conduction portion are not surrounded, and the control line 28 of the emission control transistor Tel is opened, unlike the second embodiment. In the third embodiment, a high shielding effect of the power supply line layer 41 is also exhibited.

The upper capacitive electrode layer CA2 is configured to be arranged between the scanning line 22 and any one of the control lines 27 and 28, and the gate potential portion of the driving transistor Tdr. Further, the power supply line layer 41 is configured to be arranged between the scanning line 22 and any one of the control lines 27 and 28, and the gate potential portion of the driving transistor Tdr. Therefore, the coupling between the scanning line 22 and any one of the control lines 27 and 28, and the gate potential portion of the driving transistor Tdr is suppressed.

The upper capacitive electrode layer CA2 is configured to be arranged between the conduction portion connecting the signal line 26 to the selection transistor Tsl and the gate potential portion of the driving transistor Tdr. Further, the power supply line layer 41 is configured to be arranged between the conduction portion connecting the signal line 26 to the selection transistor Tsl and the gate potential portion of the driving transistor Tdr. Therefore, coupling between the conduction portion connecting the signal line 26 to the selection transistor Tsl and the gate potential portion of the driving transistor Tdr is suppressed.

Further, with the same configuration as in the second embodiment, it is possible to achieve the same effects as in the second embodiment described above. Further, in the third embodiment, the same modification example as that described in the first embodiment is also applicable. For example, the electrode constituting the capacitive element may be an electrode formed on a different layer from the power supply line layer 41.

Fourth Embodiment

A fourth embodiment of the invention will be described. Further, in each form to be illustrated below, elements having the same operation or function as in the first embodiment and the second embodiment are denoted with the signs referred to in the description of the first and second embodiments, and each detailed description will be appropriately omitted.

A circuit of each display pixel Pe of the fourth embodiment is the same as the circuit of the second embodiment, and includes a compensation transistor Tcmp and an emission control transistor Tel. A specific structure of the organic electroluminescent device 100 of the fourth embodiment is substantially the same structure as the specific structure of the organic electroluminescent device 100 of the second embodiment. Hereinafter, only a difference will be described for simplification.

Figure 44:
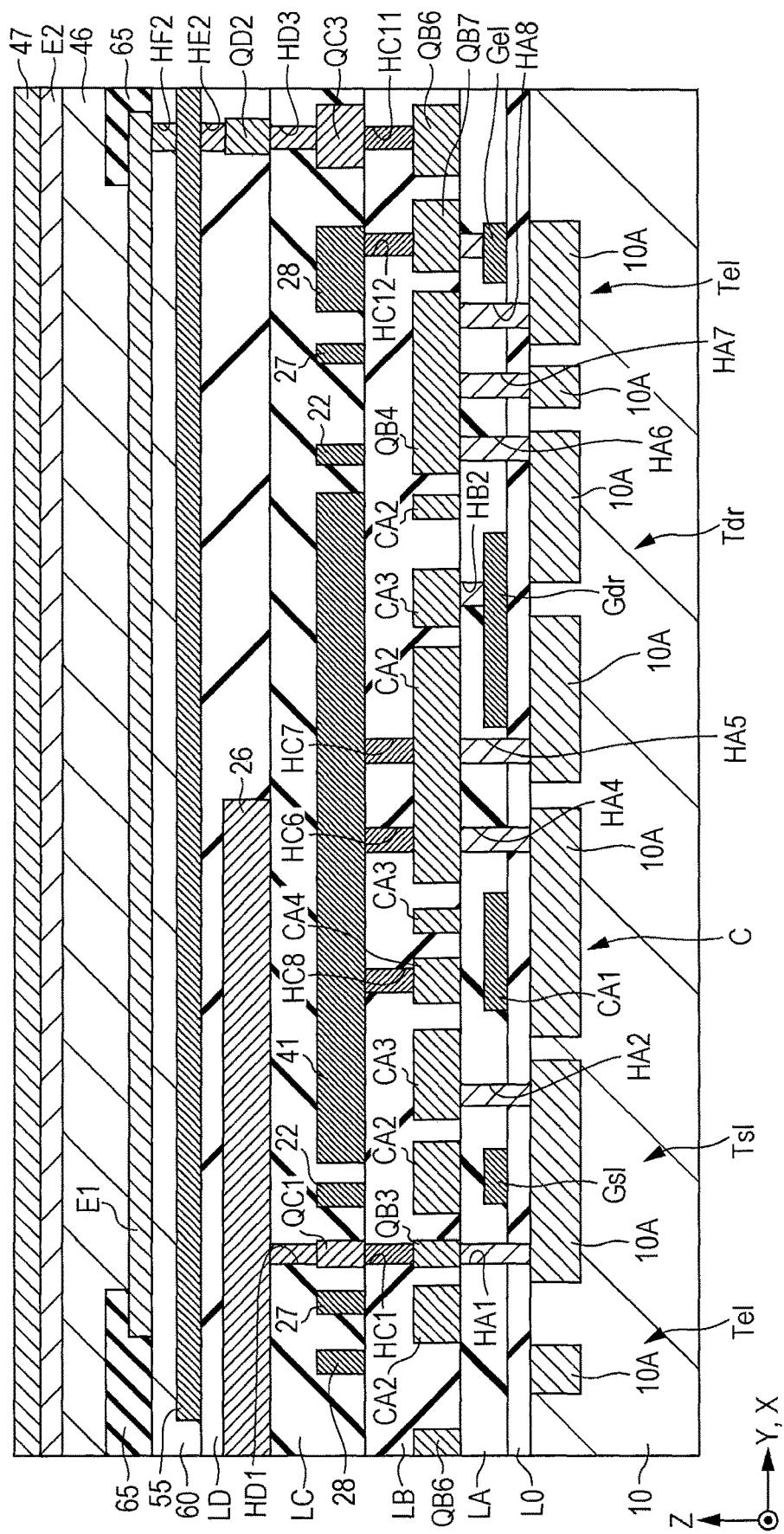
FIG. 44 is a sectional view of a light emitting device according to a third embodiment of the invention.
Figure 45:
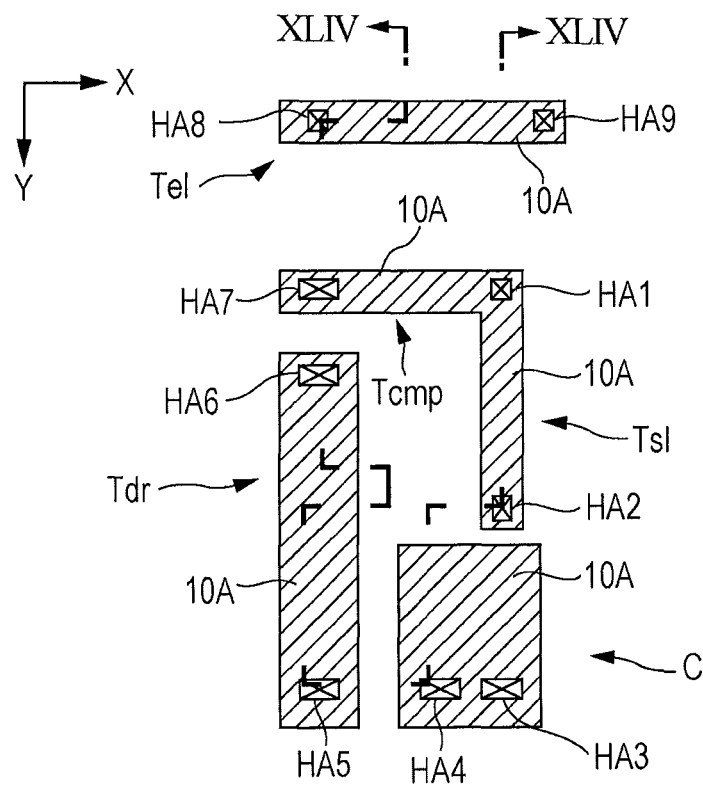
FIG. 45 is an illustrative diagram of each element that is formed on a substrate.
Figure 46:
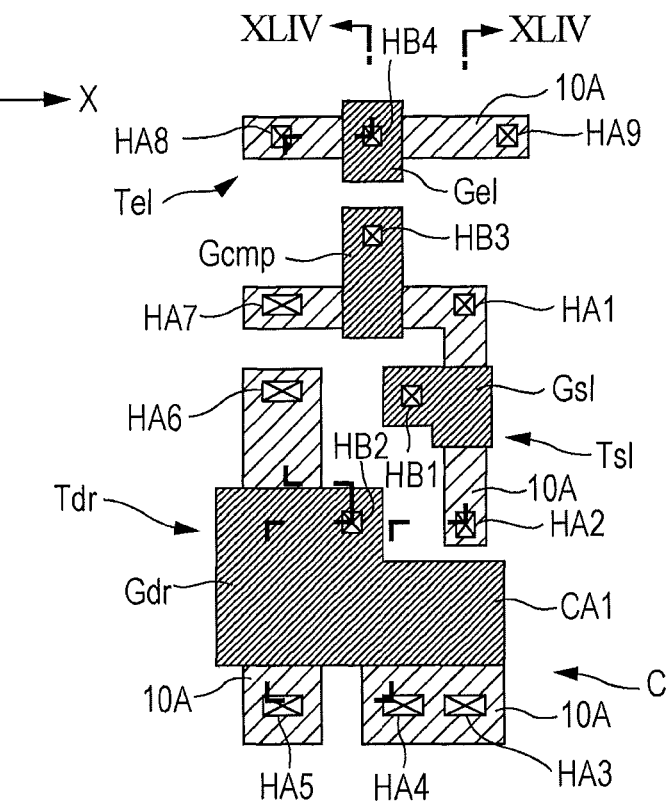
FIG. 46 is an illustrative diagram of each element that is formed on the substrate.
Figure 47:
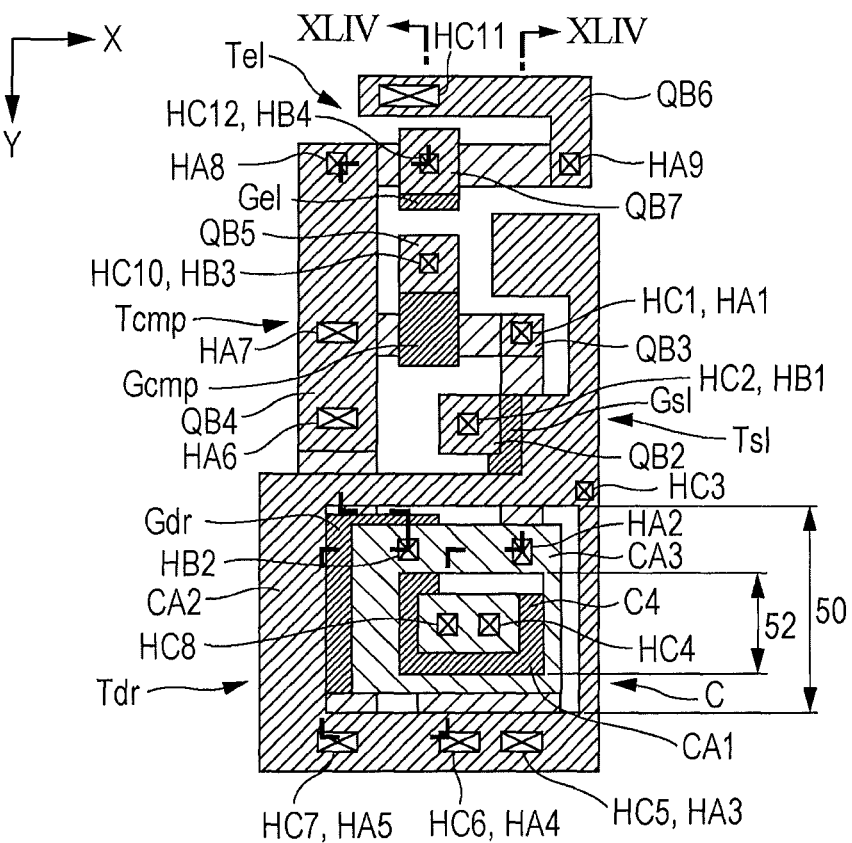
FIG. 47 is an illustrative diagram of each element that is formed on the substrate.
Figure 48:
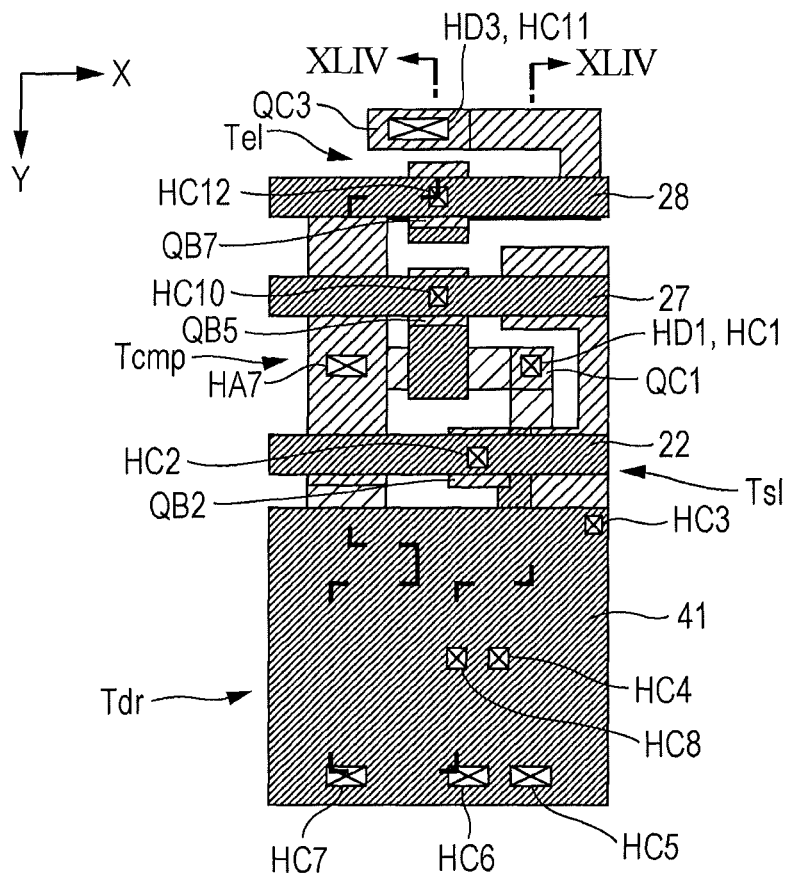
FIG. 48 is an illustrative diagram of each element that is formed on the substrate.
Figure 49:
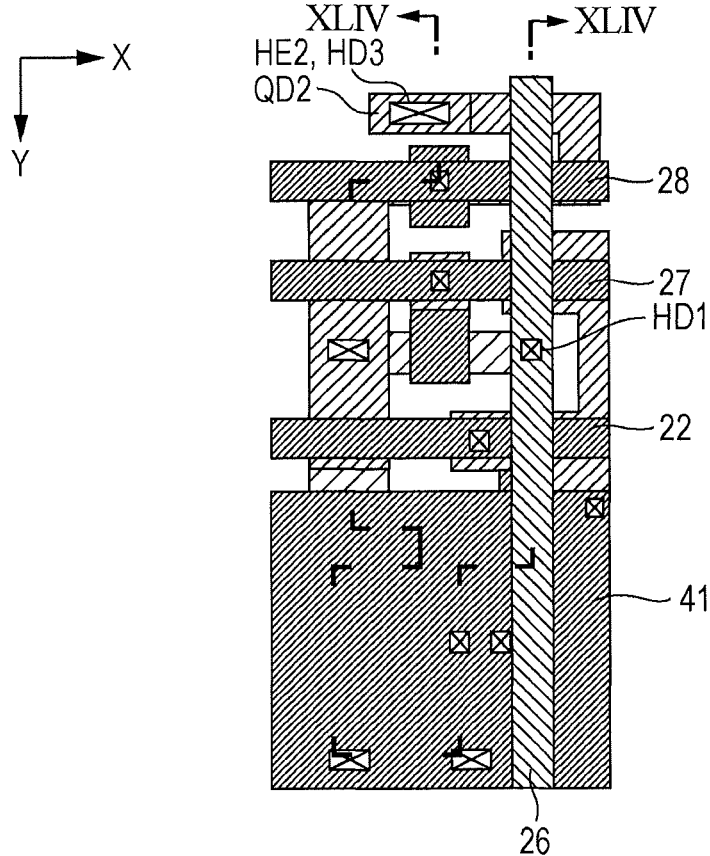
FIG. 49 is an illustrative diagram of each element that is formed on the substrate.
Figure 50:
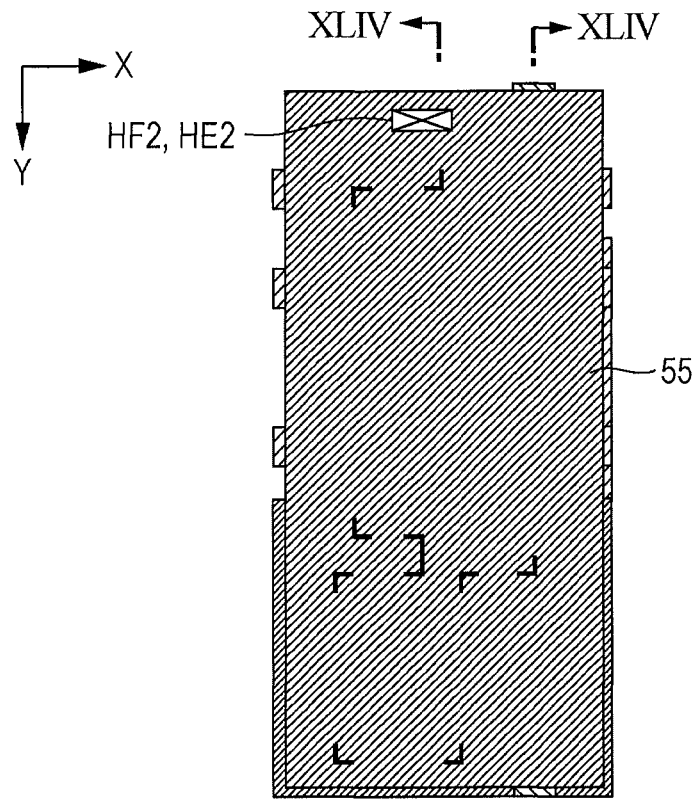
FIG. 50 is an illustrative diagram of each element that is formed on the substrate.
Figure 51:
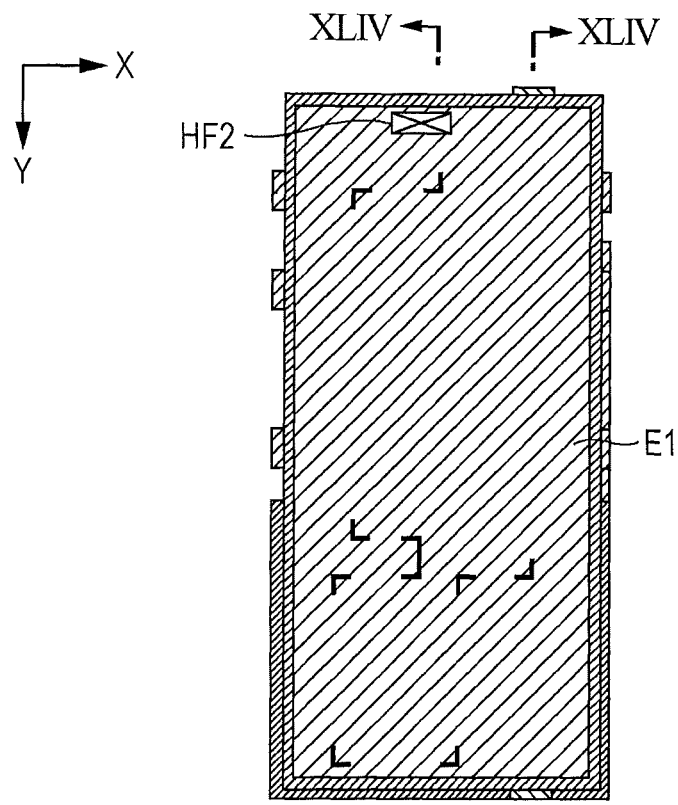
FIG. 51 is an illustrative diagram of each element that is formed on the substrate.
Figure 52:
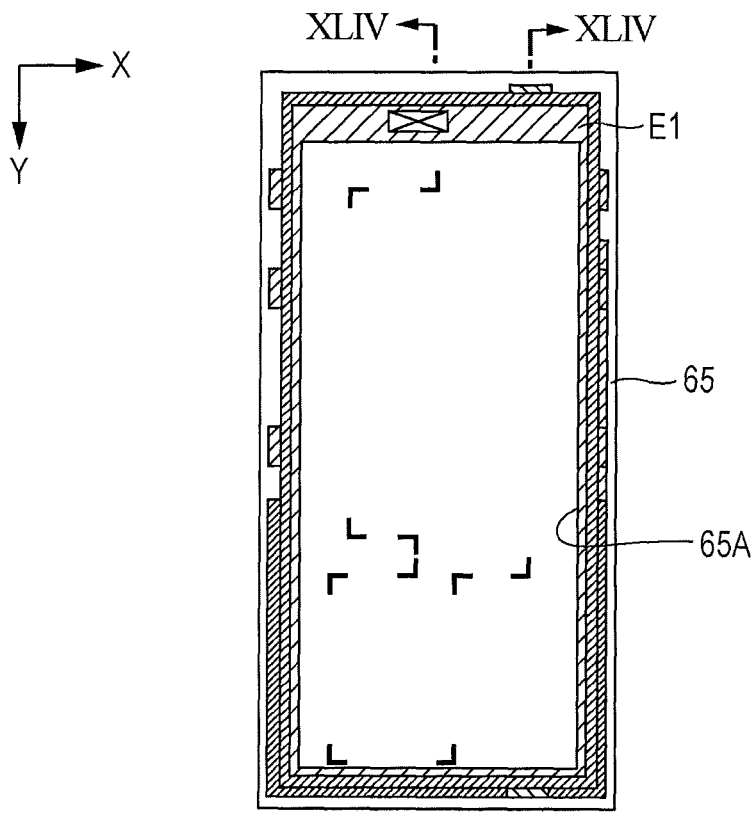
FIG. 52 is a sectional view of a light emitting device in a fourth embodiment of the invention.

FIG. 44 is a sectional view of the organic electroluminescent device 100, and FIGS. 45 to 52 are plan views illustrating a state of the surface of the substrate 10 in respective steps of forming respective elements of the organic electroluminescent device 100 for one display pixel Pe. A sectional view corresponding to a section including a line XLIV-XLIV in FIGS. 45 to 52 corresponds to FIG. 44. Further, while FIGS. 45 to 52 are plan views, each element that is the same as that in FIG. 44 is conveniently hatched in the same aspect as that in FIG. 44 from the viewpoint of facilitation of visual recognition of each element.

The fourth embodiment is different from the second embodiment in that a channel length direction of the emission control transistor Tel is an X-direction (an extending direction of the control line 28), as is understood from FIGS. 45 to 49. Further, as is understood from FIGS. 45 to 49, a shape of a relay electrode QB6 constituting the pixel conduction portion is bent from the source area or the drain area of the emission control transistor Tel, and is arranged to be parallel to the channel length direction of the emission control transistor Tel. Also, the emission control transistor Tel is arranged to overlap the signal line 26 in a plan view. Therefore, there is an advantage in that the pixel is easily miniaturized.

Further, in the fourth embodiment, as is understood from FIGS. 45 to 49, the control line 28 of the emission control transistor Tel is formed on the same layer as the power supply line layer 41. Therefore, it is possible to achieve simplification of a process as compared to the second embodiment. As is understood from FIGS. 45 to 49, the control line 28 of the emission control transistor Tel is electrically connected to the gate layer Gel of the emission control transistor Tel via the conduction hole HB4 formed in the insulating layer LA, the conduction portion QB7, and the HC12 formed in the insulating layer LB.

The upper capacitive electrode layer CA2 is configured to be arranged between the scanning line 22 and any one of the control lines 27 and 28, and the gate potential portion of the driving transistor Tdr. Further, the power supply line layer 41 is configured to be arranged between the scanning line 22 and any one of the control lines 27 and 28, and the gate potential portion of the driving transistor Tdr. Therefore, coupling between the scanning line 22 and any one of the control lines 27 and 28, and the gate potential portion of the driving transistor Tdr is suppressed.

The upper capacitive electrode layer CA2 is configured to be arranged between the conduction portion connecting the signal line 26 to the selection transistor Tsl and the gate potential portion of the driving transistor Tdr. Further, the power supply line layer 41 is configured to be arranged between the conduction portion connecting the signal line 26 to the selection transistor Tsl and the gate potential portion of the driving transistor Tdr. Therefore, coupling between the conduction portion connecting the signal line 26 to the selection transistor Tsl and the gate potential portion of the driving transistor Tdr is suppressed.

Further, with the same configuration as in the second embodiment, it is possible to achieve the same effects as in the second embodiment described above. Further, in the fourth embodiment, the same modification example as that described in the first embodiment is also applicable. For example, the electrode constituting the capacitive element may be an electrode formed on a different layer from the power supply line layer 41.

Fifth Embodiment

A fifth embodiment of the invention will be described. Further, in each form to be illustrated below, elements having the same operation or function as in the first embodiment are denoted with signs referred to in the description of the first embodiment, and each detailed description will be appropriately omitted.

A circuit of each display pixel Pe of the fifth embodiment is the same as the circuit of the first embodiment, and includes a driving transistor Tdr and a selection transistor Tsl. A specific structure of the organic electroluminescent device 100 of the fifth embodiment is substantially the same structure as the specific structure of the organic electroluminescent device 100 of the first embodiment. Hereinafter, only a difference will be described for simplification.

Figure 53:
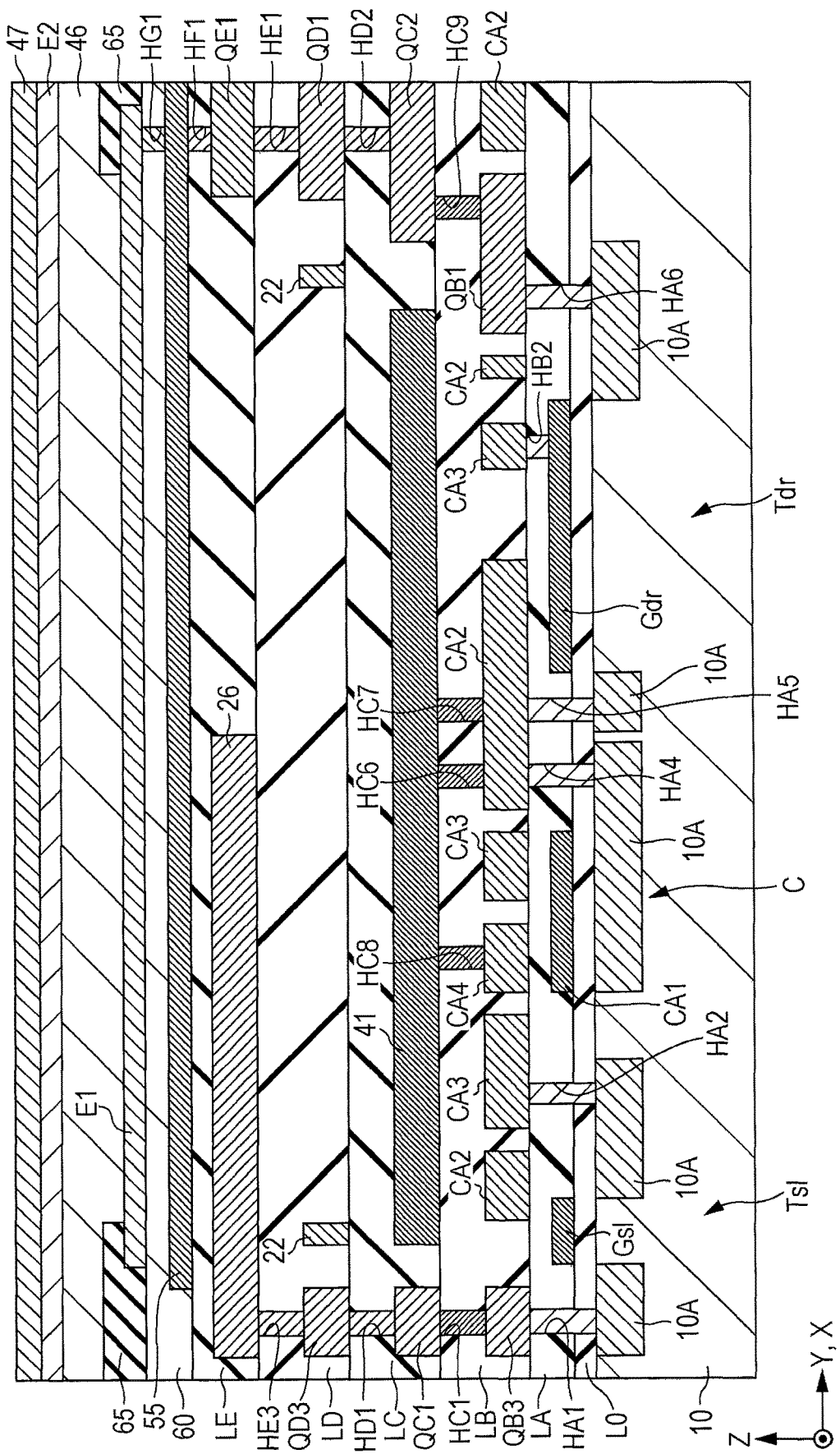
FIG. 53 is an illustrative diagram of each element that is formed on a substrate.
Figure 54:
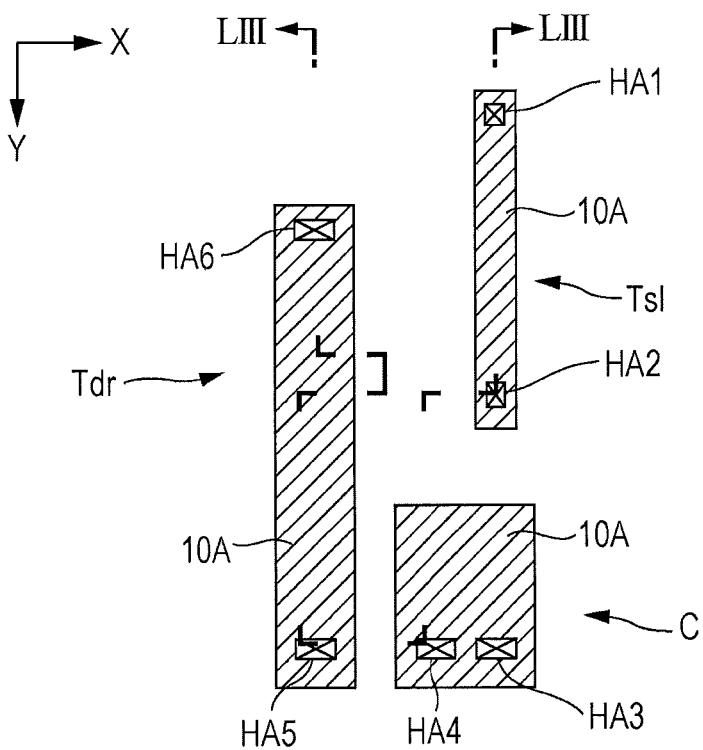
FIG. 54 is an illustrative diagram of each element that is formed on the substrate.
Figure 55:
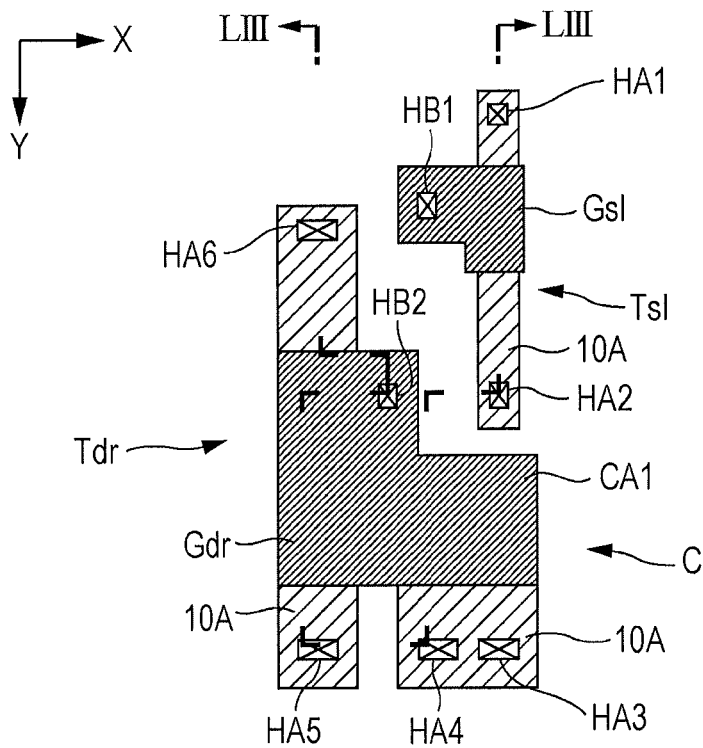
FIG. 55 is an illustrative diagram of each element that is formed on the substrate.
Figure 56:
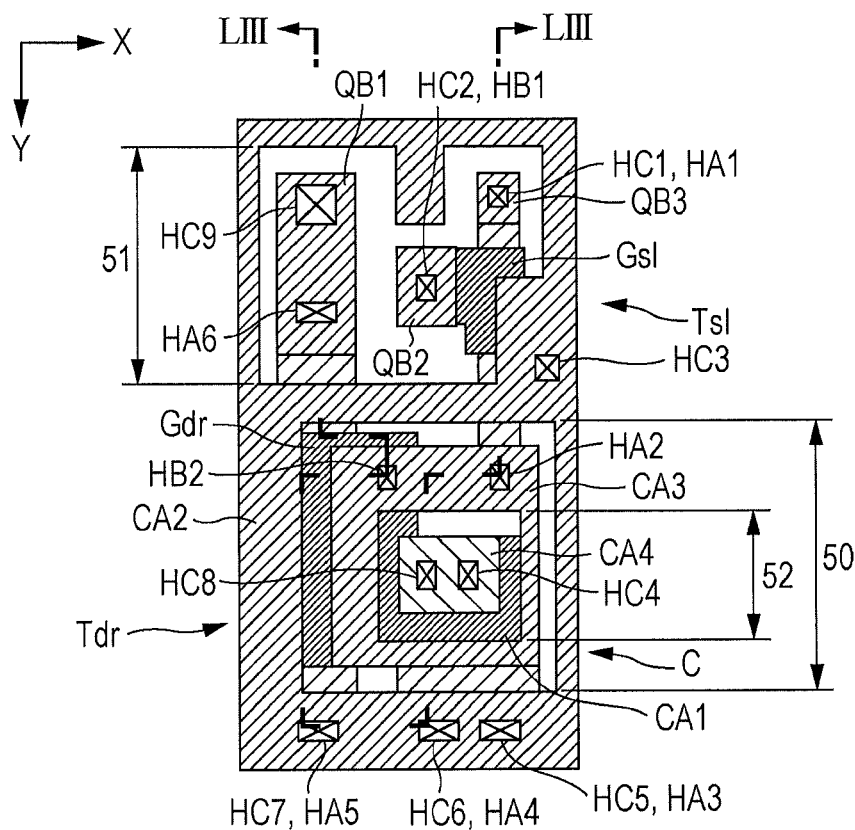
FIG. 56 is an illustrative diagram of each element that is formed on the substrate.

FIG. 53 is a sectional view of the organic electroluminescent device 100, and FIGS. 54 to 62 are plan views illustrating a state of the surface of the substrate 10 in respective steps of forming respective elements of the organic electroluminescent device 100 for one display pixel Pe. A sectional view corresponding to a section including a line LIII-LIII in FIGS. 54 to 62 corresponds to FIG. 53. Further, while FIGS. 54 to 62 are plan views, each element that is the same as that in FIG. 53 is conveniently hatched in the same aspect as that in FIG. 53 from the viewpoint of facilitation of visual recognition of each element.

Figure 57:
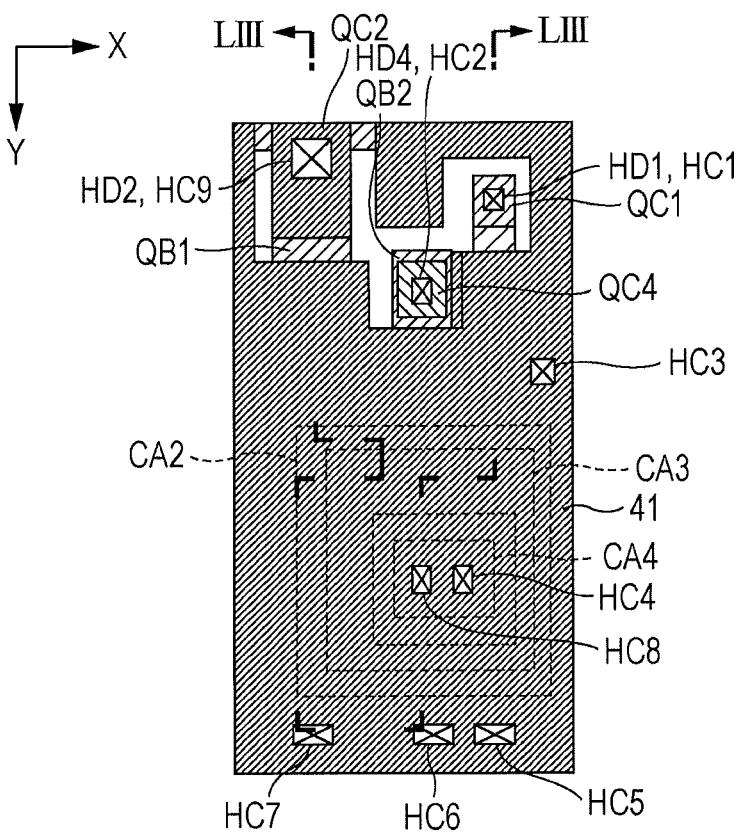
FIG. 57 is an illustrative diagram of each element that is formed on the substrate.

As is understood from a comparison between FIG. 7 illustrating the power supply line layer 41 in the first embodiment and FIG. 57 illustrating the power supply line layer 41 in the fifth embodiment, the power supply line layer 41 in the fifth embodiment is arranged to surround each of the conduction portion between the selection transistor Tsl and the scanning line 22, the conduction portion between the selection transistor Tsl and the signal line 26, and the pixel conduction portion. As is understood from FIG. 57, since the scanning line 22 is not formed on the same layer as the power supply line layer 41 in the fifth embodiment, a relay electrode QC4 is formed in the gate conduction portion of the selection transistor Tsl. The relay electrode QC4 is electrically connected to the relay electrode QB2 via the conduction hole HC2 penetrating the insulating layer LB. Therefore, the relay electrode QC4 is electrically connected to the gate layer Gsl of the selection transistor Tsl via the conduction hole HC2 penetrating the insulating layer LB, the relay electrode QB2, and the conduction hole HB1 penetrating the insulating layer LA.

In the fifth embodiment, the insulating layer LC is formed on the surface of the insulating layer LB on which the power supply line layer 41 and the plurality of relay electrodes QC (QC1, QC2, QC4) have been formed. As is understood from FIGS. 53 and 58, the scanning line 22 and the plurality of relay electrodes QD (QD1 and QD3) are formed on the surface of the insulating layer LC. The scanning line 22 is electrically connected to the relay electrode QC4 via the conduction hole HD4 penetrating the insulating layer LC in each display pixel Pe. Thus, as is understood from FIGS. 54 to 58, the scanning line 22 is electrically connected to the gate layer Gsl of the selection transistor Tsl via the conduction hole HD4 penetrating the insulating layer LC, the relay electrode QC4, the conduction hole HC2 penetrating the insulating layer LB, the relay electrode QB2, and the conduction hole HB1 penetrating the insulating layer LA. The scanning line 22 extends in a straight line shape in the X direction over the plurality of the display pixels Pe, and is electrically insulated from the power supply line layer 41 by the insulating layer LC.

Figure 58:
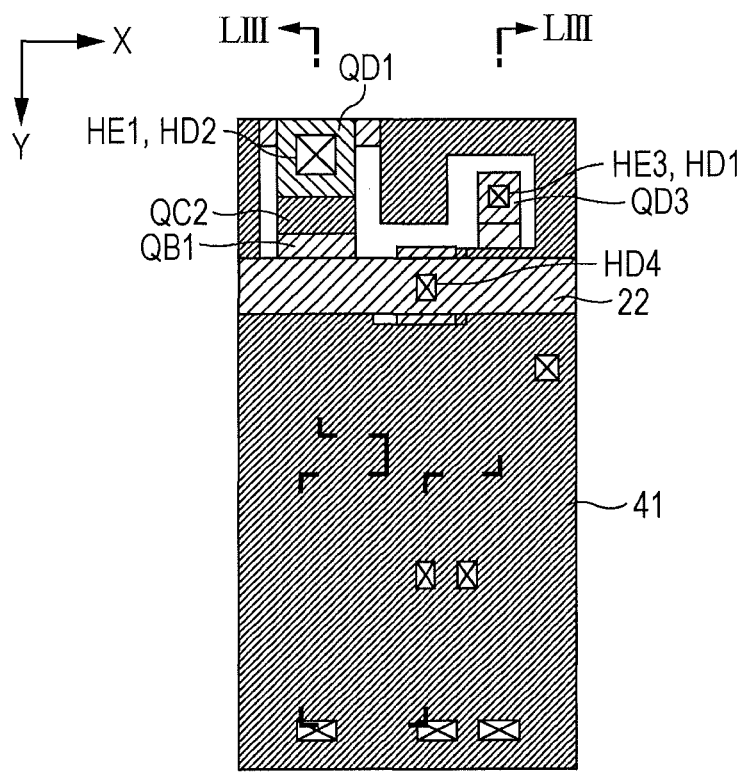
FIG. 58 is an illustrative diagram of each element that is formed on the substrate.

As is understood from FIGS. 53 and 58, the relay electrode QD3 is electrically connected to the relay electrode QC1 via the conduction hole HD1 formed in the insulating layer LC in each display pixel Pe. Thus, as is understood from FIGS. 54 to 58, the relay electrode QD3 is electrically connected to the active area 10A of the selection transistor Tsl via the conduction hole HD1 penetrating the insulating layer LC, the relay electrode QC1, the conduction hole HC1 penetrating the insulating layer LB, the relay electrode QB3, and the conduction hole HA1 penetrating the insulating film L0 and the insulating layer LA.

As is understood from FIGS. 53 and 58, the relay electrodes QD1 is electrically connected to the relay electrode QC2 via the conduction hole HD2 formed in the insulating layer LC in each display pixel Pe. Thus, as is understood from FIGS. 54 to 58, the relay electrode QD1 is electrically connected to the active area 10A of the driving transistor Tdr via the conduction hole HD2 penetrating the insulating layer LC, the relay electrode QC2, the conduction hole HC9 penetrating the insulating layer LB, the relay electrode QB1, and the conduction hole HA6 penetrating the insulating film L0 and the insulating layer LA.

In the fifth embodiment, the insulating layer LD is formed on the surface of the insulating layer LC on which the scanning line 22 and the plurality of relay electrodes QD (QD1 and QD3) have been formed. As is understood from FIGS. 53 and 59, the signal line 26 and the relay electrode QE1 are formed on the surface of the insulating layer the LD. The signal line 26 is electrically connected to the relay electrode QD3 via the conduction hole HE3 formed in the insulating layer LD for each display pixel Pe. Thus, as is understood from FIGS. 54 to 59, the signal line 26 is electrically connected to the active area 10A of the selection transistor Tsl via the conduction hole HE3 penetrating the insulating layer LD, the relay electrode QD3, the conduction hole HD1 penetrating the insulating layer LC, the relay electrode QC1, the conduction hole HC1 penetrating the insulating layer LB, the relay electrode QB3, and the conduction hole HA1 penetrating the insulating film L0 and the insulating layer LA. The signal line 26 extends in a straight line shape in the Y direction over the plurality of the display pixels Pe, and is electrically insulated from the scanning line 22 by the insulating layer LD.

Figure 59:
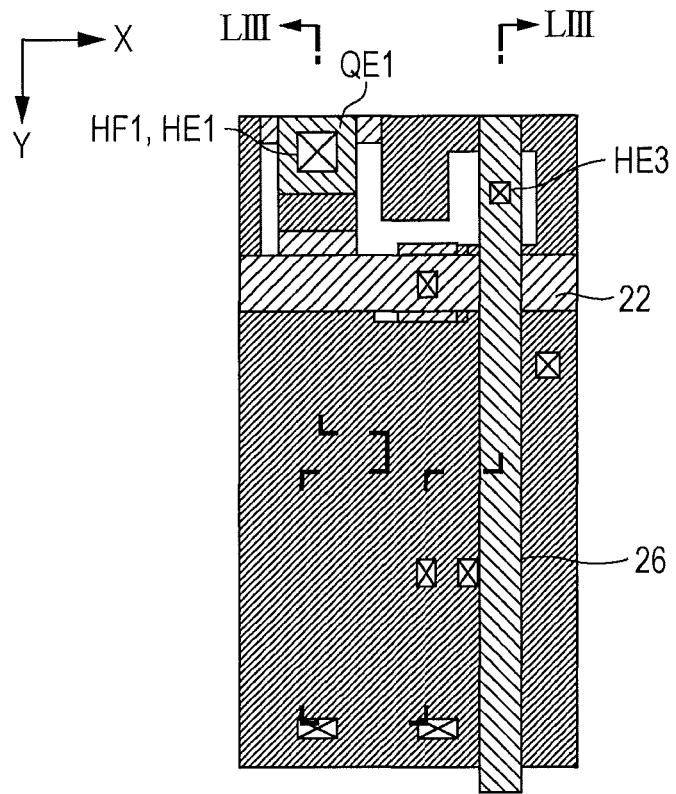
FIG. 59 is an illustrative diagram of each element that is formed on the substrate.

As is understood from FIG. 59, the relay electrode QE1 is electrically connected to the relay electrode QD1 via the conduction hole HE1 formed in the insulating layer LD for each display pixel Pe. Thus, as is understood from FIGS. 54 to 59, the relay electrode QE1 is electrically connected to the active area 10A of the driving transistor Tdr via the conduction hole HE1 penetrating the insulating layer LD, the relay electrode QD1, the conduction hole HD2 penetrating the insulating layer LC, the relay electrode QC2, the conduction hole HC9 penetrating the insulating layer LB, the relay electrode QB1, and the conduction hole HA6 penetrating the insulating film L0 and the insulating layer LA.

In the fifth embodiment, one more layer is formed and an insulating layer LE is formed, as compared to the first embodiment. The insulating layer LE is formed on the surface of the insulating layer LD on which the signal line 26 and the relay electrode QE1 have been formed. As is understood from FIGS. 53 and 60, the reflective layer 55 is formed on the surface of the insulating layer LE.

Figure 60:
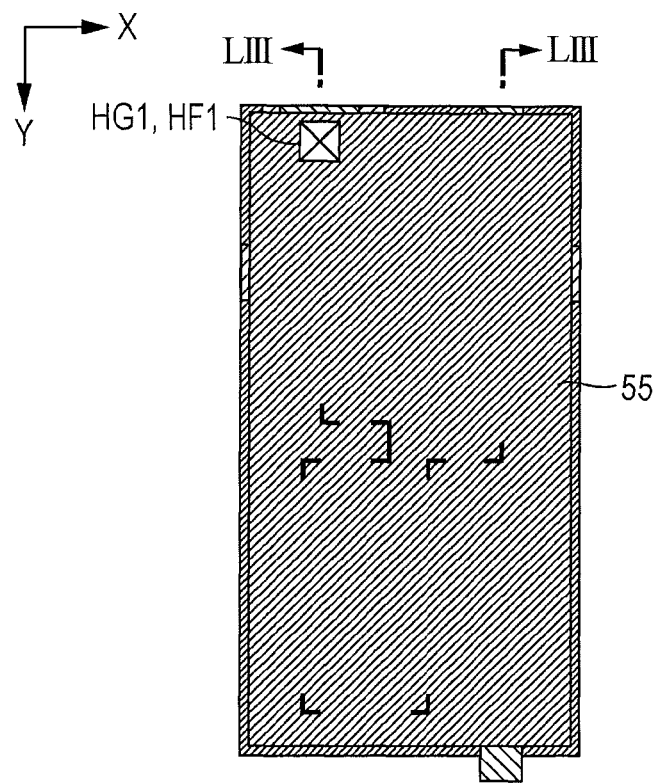
FIG. 60 is an illustrative diagram of each element that is formed on the substrate.

A planarization process is executed for the surface of the insulating layer LE. In the planarization process, a known surface processing technology such as chemical mechanical polishing (CMP) is optionally adopted. The reflective layer 55 is formed on the surface of the insulating layer LE highly planarized in the planarization process, as illustrated in FIGS. 53 and 60. The reflective layer 55 is formed of an optically reflecting conductive material containing, for example, silver or aluminum and to a film thickness of, for example, about 100 nm. The reflective layer 55 may be formed of an optically reflecting conductive material, and is arranged to cover each transistor T, each wiring, and each relay electrode, as illustrated in FIG. 60. Therefore, there is an advantage in that intrusion of external light can be prevented by the reflective layer 55, and leakage of a current of each transistor T caused by light irradiation can be prevented.

As is understood from FIGS. 53 and 60, the reflective layer 55 is electrically connected to the relay electrode QE1 via the conduction hole HF1 formed in the insulating layer LE in each display pixel Pe. Thus, as is understood from FIGS. 54 to 60, the reflective layer 55 is electrically connected to the active area 10A of the driving transistor Tdr via the conduction hole HF1 penetrating the insulating layer LE, the relay electrode QE1, the conduction hole HE1 penetrating the insulating layer LD, the relay electrode QD1, the conduction hole HD2 penetrating the insulating layer LC, the relay electrode QC2, the conduction hole HC9 penetrating the insulating layer LB, the relay electrode QB1, and the conduction hole HA6 penetrating the insulating film L0 and the insulating layer LA.

As illustrated in FIG. 53, the optical path adjustment layer 60 is formed on the surface of the insulating layer LE on which the reflective layer 55 has been formed. The optical path adjustment layer 60 is a light transmissive film body that defines a resonance wavelength (that is, display color) of the resonant structure of each display pixel Pe. The resonance wavelengths of the resonant structures are substantially the same in the pixels having the same display colors, and the resonance wavelengths of the resonant structures are set to be different from each other in the pixels having different display colors.

Figure 61:
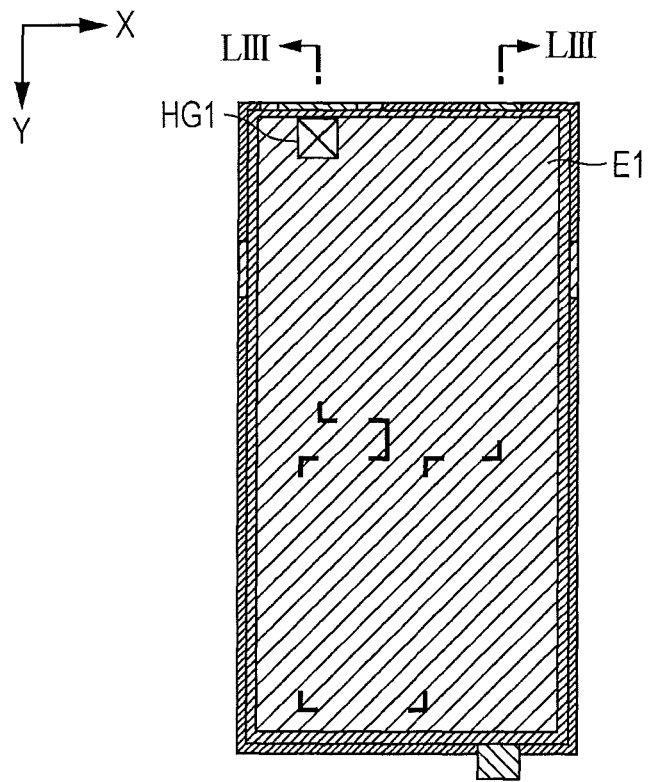
FIG. 61 is an illustrative diagram of each element that is formed on the substrate.

As illustrated in FIGS. 53 and 61, the first electrode E1 of each display pixel Pe in the display area 16 is formed on the surface of the optical path adjustment layer 60. The first electrode E1 is formed of a light transmissive conductive material such as ITO (Indium Tin Oxide). The first electrode E1 is a substantially rectangular electrode (pixel electrode) functioning as a positive electrode of the light emitting element 45, as described above with reference to FIG. 2. The first electrode E1 is electrically connected to the reflective layer 55 via the conduction hole HG1 formed in the optical path adjustment layer 60 in each display pixel Pe. Thus, as is understood from FIGS. 54 to 61, the first electrode E1 is electrically connected to the active area 10A of the driving transistor Tdr via the conduction hole HG1 formed in the optical path adjustment layer 60, the reflective layer 55, the conduction hole HF1 penetrating the insulating layer LE, the relay electrode QE1, the conduction hole HE1 penetrating the insulating layer LD, the relay electrode QD1, the conduction hole HD2 penetrating the insulating layer LC, the relay electrode QC2, the conduction hole HC9 penetrating the insulating layer LB, the relay electrode QB1, and the conduction hole HA6 penetrating the insulating film L0 and the insulating layer LA.

Figure 62:
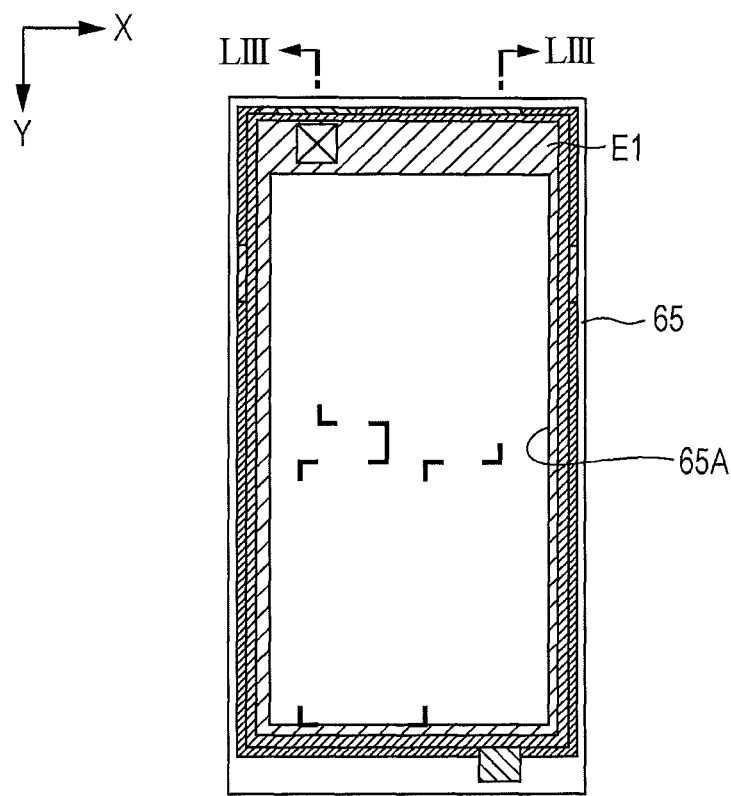
FIG. 62 is an illustrative diagram of each element that is formed on the substrate.

The pixel definition layer 65 is formed over the entire area of the substrate 10 on the surface of the optical path adjustment layer 60 on which the first electrode E1 has been formed, as illustrated in FIGS. 53 and 62. The pixel definition layer 65 is formed of an insulating inorganic material such as a silicon compound (typically, silicon nitride or silicon oxide). As is understood from FIG. 62, the opening 65A corresponding to each of the first electrodes E1 in the display area 16 is formed in the pixel definition layer 65. An area near an inner periphery of the opening 65A of the pixel definition layer 65 overlaps the periphery of the first electrode E1. That is, the inner periphery of the opening 65A is located on an inner side of the periphery of the first electrode E1 in a plan view. The respective openings 65A are the same in a plan shape (rectangular shape) or a size, and are arranged in a matrix shape with the same pitch in each of X and Y directions. As is understood from the above description, the pixel definition layer 65 is formed in a grid shape in the plan view. Further, the plan shapes or the sizes of the openings 65A may be the same as one another when display colors are the same as one another and may be different from one another when the display colors are different from one another. The pitches of the openings 65A are the same as one another when the display colors are the same as one another, and may be different from one another when the display colors are different from one another.

Further, although detailed description is not given, the light emitting function layer 46, the second electrode E2, and the sealing body 47 are stacked on the layer over the first electrode E1, and a sealing substrate (not illustrated) is bonded to the surface of the substrate 10 in which the respective elements have been formed, for example, using an adhesive. The sealing substrate is a light transmissive plate-shaped member (for example, a glass substrate) for protecting each element on the substrate 10. Further, a color filter can also be formed in each display pixel Pe on the surface of the sealing substrate or the surface of the sealing body 47.

In the fifth embodiment, the power supply line layer 41 is provided between the layer on which the signal line 26 has been formed and the layer on which the scanning line 22 has been formed, and the layer on which the upper capacitive electrode layer CA (CA2, CA3, and CA4) has been formed. The power supply line layer 41 has a shape for uniformly covering the upper capacitive electrode layer CA (CA2, CA3, and CA4) and the transistor T (Tdr and Tsl), as is understood from FIGS. 56 and 57. Therefore, coupling among the signal line 26 and the scanning line 22, the upper capacitive electrode layer CA (CA2, CA3, and CA4), and the transistor T (Tdr and Tsl) can be suppressed.

Further, with the same configuration as that in the first embodiment, it is possible to achieve the same effects as in the first embodiment described above. Further, in the fifth embodiment, the same modification example as that described in the first embodiment is also applicable. For example, the electrode constituting the capacitive element may be an electrode formed in a different layer from the power supply line layer 41.

While in the third and fourth embodiments, the scanning line 22 and the control lines 27 and 28 have been formed on the same layer as the power supply line layer 41, the scanning line 22 and the control lines 27 and 28 may be provided on a layer over the power supply line layer 41, and the signal line 26 may be formed on the layer, as in the fifth embodiment. In this case, the relay electrodes QB2, QB5, QB7, QC1, and QC3 may be surrounded by the power supply line layer 41.

Modification Examples

The above embodiment may be variously modified. Hereinafter, a specific modification aspect will be illustrated. Two or more aspects arbitrarily selected from the following example may be appropriately combined within a range in which the aspects do not conflict with each other.

(1) While in each embodiment described above, the potential of the power supply line layer 41 is the Vel potential which is connected to the driving transistor Tdr, the potential of the power supply line layer 41 may be another potential. In this case, the conduction hole for connecting the power supply line layer 41 to the driving transistor Tdr can be omitted. The power supply line layer 41 may be electrically connected to the mounting terminal 36 to which another power supply potential Va is supplied, and the driving transistor Tdr or the upper capacitive electrode layer CA2 may be electrically connected to the mounting terminal 36 to which the power supply potential Vel is supplied.

(2) While in each embodiment described above, the organic electroluminescent device 100 using the semiconductor substrate as the substrate 10 has been illustrated, the material of the substrate 10 is optional. For example, a plate-shaped member such as glass or quartz can also be used as the substrate 10. While in each embodiment described above, the driving circuit 30 has been arranged in the second area 14 outside the first area 12 in the substrate 10, the driving circuit 30 can also be arranged, for example, in the peripheral area 18. For example, the driving circuit 30 is arranged between the second power supply conductor 42 and the substrate 10.

(3) The configuration of the light emitting element 45 is not limited to the above example. For example, while in each embodiment described above, the configuration in which the light emitting function layer 46 which generates white light is continuously formed over the plurality of the display pixels Pe has been illustrated, a light emitting function layer 46 that radiates monochromatic light having a wavelength corresponding to the display color of each display pixel Pe may be separately formed in each display pixel Pe. Further, while in each embodiment described above, the resonant structure has been formed between the reflective layer 55 and the second electrode E2 (semi-transmissive reflective layer), for example, the power supply line layer 41 as the first power supply conductor can be formed of a reflective conductive material, and the resonant structure can be formed between the power supply line layer 41 (the reflective layer) and the second electrode E2 (semi-transmissive reflective layer). Further, the first electrode E1 can be formed of a reflective conductive material, and the resonant structure can be formed between the first electrode E1 (the reflective layer) and the second electrode E2 (semi-transmissive reflective layer). In the configuration utilizing the first electrode E1 as the reflective layer, the optical path adjustment layer 60 is formed between the first electrode E1 and the second electrode E2.

While in each embodiment described above, the resonance wavelength of each display pixel Pe has been adjusted by the optical path adjustment layer 60, the resonance wavelength of each display pixel Pe can also be adjusted according to a thickness of the first electrode E1 or the light emitting function layer 46.

Further, the light emitting function layer 46 may emit light in any one of a blue wavelength area, a green wavelength area, and a red wavelength area, and may emit white light. In this case, the light emitting function layer 46 may be provided over a plurality of pixels that are in the display area. Further, the light emitting function layer 46 may be configured to perform different emission in respective red, green, and blue pixels.

(4) Although the light emitting element 45 using the organic EL material has been illustrated in the above-described embodiment, the invention is also applied to a configuration in which a light emitting element including a light emitting layer formed of an inorganic EL material or a light emitting element such as an LED is used. Further, while the top emission type organic electroluminescent device 100 in which light is emitted to a side opposite to the substrate 10 has been illustrated in each embodiment described above, the invention is similarly applied to a bottom emission type light emitting device in which light is emitted to the substrate 10.

(5) While the configuration in which the dummy pixel Pd having a structure (a structure of the wire, the transistor, the capacitive element, or the like) similar to the display pixel Pe is arranged in the peripheral area 18 has been illustrated in each embodiment described above, the configuration within the peripheral area 18 is not limited to the above example. For example, the driving circuit 30 (the scanning line driving circuit 32 or the signal line driving circuit 34) or a circuit and a wiring other than the driving circuit 30 can also be arranged on a layer under the second power supply conductor 42 in the peripheral area 18.

(6) While each embodiment described above focuses on the film thickness of the optical path adjustment layer 60 for simplification of description of the resonance wavelength, in fact, the resonance wavelength of the resonant structure is set according to a refractive index of each layer located between the reflective layer of the resonant structure (for example, the first power supply conductor 41) and the semi-transmissive reflective layer (for example, the second electrode E2) or a phase shift in the surface of the reflective layer and the semi-transmissive reflective layer.

(7) While the example in which five types of capacitive elements C of i) to v) are configured have been described in each embodiment described above, the capacitive element C of any one of i) to v) may be omitted. Further, a transistor, a capacitor, a wiring, or the like other than the transistors described in each embodiment may be appropriately added. Further, in each embodiment, the scanning line 22, the signal line 26, the control lines 27 and 28, and the power supply line layer 41 are in a straight line shape and their width is uniform, but the invention is not limited to this aspect, and the width of the wiring may be greater than other portions or may be formed to be bent.

Electronic Apparatus

Figure 63:
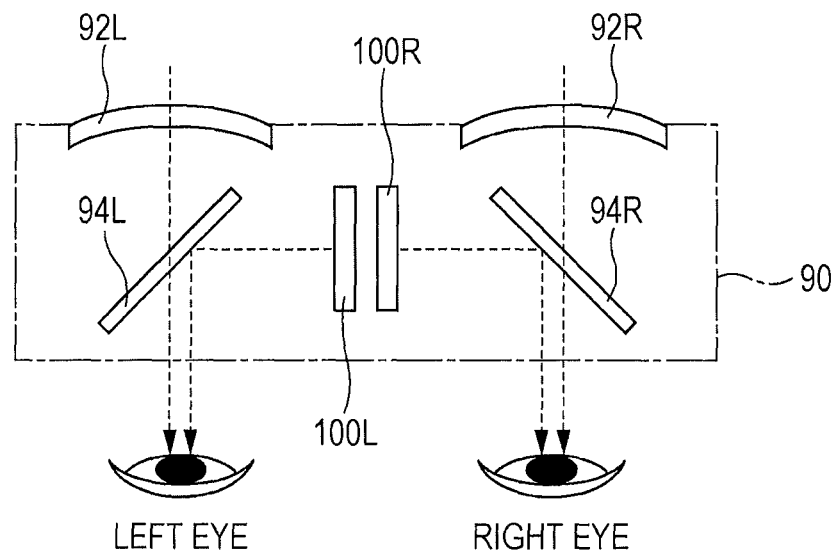
FIG. 63 is a schematic diagram which is an example of a head-mounted display device of an electronic apparatus.

The organic electroluminescent device 100 illustrated in each embodiment described above is suitably used as a display device for various electronic apparatuses. In FIG. 63, a head-mounted display device 90 (HMD: Head Mounted Display) using the organic electroluminescent device 100 illustrated in each embodiment described above is illustrated as an electronic apparatus.

A display unit 90 is an electronic apparatus that can be mounted on a head of a user, and includes a transmission portion (lens) 92L that overlaps a left eye of the user, a transmission portion 92R that overlaps a right eye of the user, an organic electroluminescent device 100L and a half mirror 94L for a left eye, and an organic electroluminescent device 100R and a half mirror 94R for a right eye. The organic electroluminescent device 100L and the organic electroluminescent device 100R are arranged so that emitted lights travel in opposite directions. The half mirror 94L for a left eye transmits transmitted light of the transmission portion 92L toward the left eye of the user, and reflects the emitted light from the organic electroluminescent device 100L toward the left eye of the user. Similarly, the half mirror 94R for a right eye transmits transmitted light of the transmission portion 92R toward the right eye of the user, and reflects the emitted light from the organic electroluminescent device 100R toward the right eye of the user. Therefore, the user perceives an image obtained by superimposing an image observed through the transmission portion 92L and the transmission portion 92R with a display image of each organic electroluminescent device 100. Further, stereoscopic images (a left-eye image and a right-eye image) to which a parallax has been applied are displayed on the organic electroluminescent device 100L and the organic electroluminescent device 100R, and thus, a stereoscopic effect of the display image can be perceived by the user.

The electronic apparatus to which the organic electroluminescent device 100 of each embodiment described above is applied is not limited to the display device 90 of FIG. 62. For example, the organic electroluminescent device 100 of the invention is also suitably used for an electronic view finder (EVF) which is used for an imaging device, such as a video camera or a still camera. Further, the light emitting device of the invention can be employed for various electronic apparatuses such as a mobile phone, a portable information terminal (smart phone), a television, a monitor of a personal computer or the like, and a car navigation system.

The entire disclosure of Japanese Patent Application No.: 2014-179304, filed Sep. 3, 2014 is expressly incorporated by reference herein.

What is claimed is:

1. An organic electroluminescent device, comprising:
    a first transistor;
    an organic electroluminescent element that emits light with luminance corresponding to magnitude of a current supplied via the first transistor; and
    a capacitive element formed by at least
        a first pair of electrodes stacked in a stacking direction with a first dielectric film disposed there-between, and
        a second pair of electrodes disposed on a same layer in a planar direction with a second dielectric film disposed there-between,
        such that the capacitive element is formed both in the stacking direction and the planar direction, wherein:
    the second pair of electrodes include a first electrode connected to a gate of the first transistor and a second electrode, and
    the first electrode is arranged in a position away from the second electrode with the second dielectric film interposed there-between in a plan view.

2. The organic electroluminescent device according to claim 1, comprising:
    a power supply line layer connected to one current terminal of the first transistor, wherein:
    the second electrode is connected to the power supply line layer connected to the first transistor, and
    the first electrode is arranged to be surrounded by the second electrode in the plan view.

3. The organic electroluminescent device according to claim 2, wherein:
    the capacitive element includes a third electrode, and
    the third electrode is connected to the power supply line layer, and is arranged to be surrounded by the first electrode in the plan view.

4. The organic electroluminescent device according to claim 3, wherein
    the power supply line layer is provided on a layer over the second electrode and the third electrode, and
    the second electrode is connected to the power supply line layer via a first conduction portion, and the third electrode is connected to the power supply line layer via a second conduction portion.

5. The organic electroluminescent device according to claim 4, comprising:
    an electrode connected to the gate of the first transistor, wherein
    the electrode is arranged on a layer under the third electrode, and is arranged in a position overlapping at least a portion of the third electrode in the plan view.

6. The organic electroluminescent device according to claim 5, wherein
    an active layer is formed on a layer under the electrode, and
    impurities are implanted into the active layer.

7. The organic electroluminescent device according to claim 1, comprising:
    an electrode connected to the gate of the first transistor, wherein the electrode is arranged on a layer under the second electrode, and is arranged in a position overlapping at least a portion of the second electrode in the plan view.

8. The organic electroluminescent device according to claim 7, wherein
    an active layer is formed on a layer under the electrode, and
    impurities are implanted into the active layer.

9. The organic electroluminescent device according to claim 1, wherein
    the power supply line layer is formed on a layer over the first electrode, and is arranged in a position overlapping the first electrode in the plan view.

10. The organic electroluminescent device according to claim 1, wherein
    the capacitive element and the first transistor are arranged to overlap each other in the plan view.

11. The organic electroluminescent device according to claim 1, wherein
    the capacitive element and the first transistor are arranged to overlap each other in the plan view.

12. An electronic apparatus comprising the organic electroluminescent device according to claim 1.

13. An organic electroluminescent device, comprising:
    a scanning line;
    a signal line; and
    a pixel circuit connected to the scanning line and the signal line, the pixel circuit including:
        a first transistor having one current terminal connected to a power supply line layer;
        an organic electroluminescent element that has a pixel electrode, and that emits light with luminance corresponding to magnitude of a current supplied via the first transistor; and
        a capacitive element formed by at least
            a first pair of electrodes stacked in a stacking direction with a first dielectric film disposed there-between, and
            a second pair of electrodes disposed on a same layer in a planar direction with a second dielectric film disposed there-between,
            such that the capacitive element is formed both in the stacking direction and the planar direction, wherein:
    the second pair of electrodes include a first electrode connected to a gate of the first transistor and a second electrode, and
    the first electrode is arranged in a position away from the second electrode with the second dielectric film interposed there-between in a plan view.

14. The organic electroluminescent device according to claim 13, wherein
    the power supply line layer is arranged between the first electrode and the signal line.

15. The organic electroluminescent device according to claim 13, wherein
the power supply line layer is arranged between the first electrode, and the scanning lines and the signal line.

16. The organic electroluminescent device according to claim 13, wherein
the power supply line layer is arranged between the first electrode and the pixel electrode.

17. The organic electroluminescent device according to claim 13, comprising:
a plurality of conduction holes penetrating respective layers from a layer in which the current terminal of the first transistor is formed to a layer in which the pixel electrode has been formed; and
a plurality of relay electrodes respectively connected to the plurality of conduction holes, wherein
the other current terminal of the first transistor and the pixel electrode are connected by the plurality of conduction holes and the plurality of relay electrodes.

18. The organic electroluminescent device according to claim 13, comprising:
a second transistor having one current terminal connected to a gate of the first transistor, and the other current terminal connected to the signal line, wherein
the signal line and the second transistor are arranged to overlap each other in the plan view.

19. The organic electroluminescent device according to claim 13, comprising:
a second transistor having one current terminal connected to the gate of the first transistor, and the other current terminal connected to the signal line; and
a third transistor having one current terminal connected to the other current terminal of the first transistor, and the other current terminal connected to the other current terminal of the second transistor, wherein
the signal line and the third transistor are arranged to overlap each other in the plan view.

20. The organic electroluminescent device according to claim 13, comprising:
a fourth transistor having one current terminal connected to the other current terminal of the first transistor and the other current terminal connected to the pixel electrode, wherein
the signal line and the fourth transistor are arranged to overlap each other in the plan view.

21. The organic electroluminescent device according to claim 13, wherein
the first electrode is surrounded by the second electrode in the plan view.

* * * * *

UNITED STATES PATENT AND TRADEMARK OFFICE
CERTIFICATE OF CORRECTION

PATENT NO. : 10,777,130 B2
APPLICATION NO. : 14/831491
DATED : September 15, 2020
INVENTOR(S) : Hitoshi Ota et al.

It is certified that error appears in the above-identified patent and that said Letters Patent is hereby corrected as shown below:

In the Claims

In Claim 9, at Line 24, in Column 44:
"the power supply line layer" should be changed to --a power supply line layer--.

Signed and Sealed this
Second Day of April, 2024

Katherine Kelly Vidal
*Director of the United States Patent and Trademark Office*